(12) United States Patent
Hurwitz

(10) Patent No.: US 10,630,259 B2
(45) Date of Patent: Apr. 21, 2020

(54) SINGLE CRYSTAL PIEZOELECTRIC RF RESONATORS AND FILTERS WITH IMPROVED CAVITY DEFINITION

(71) Applicant: Zhuhai Crystal Resonance Technologies Co., Ltd., Zhuhai (CN)

(72) Inventor: Dror Hurwitz, Zhuhai (CN)

(73) Assignee: Zhuhai Crystal Resonance Technologies Co., Ltd., Zhuhai (CN)

( * ) Notice: Subject to any disclaimer, the term of this patent is extended or adjusted under 35 U.S.C. 154(b) by 157 days.

(21) Appl. No.: 15/888,360

(22) Filed: Feb. 5, 2018

(65) Prior Publication Data

US 2019/0245515 A1 Aug. 8, 2019

(51) Int. Cl.
| | | |
|---|---|---|
| H03H 9/58 | (2006.01) | |
| H03H 9/17 | (2006.01) | |
| H03H 9/10 | (2006.01) | |
| H03H 9/205 | (2006.01) | |
| H01L 41/047 | (2006.01) | |
| H01L 41/18 | (2006.01) | |
| H03H 3/02 | (2006.01) | |

(52) U.S. Cl.
CPC ......... *H03H 9/587* (2013.01); *H01L 41/0475* (2013.01); *H01L 41/0477* (2013.01); *H01L 41/18* (2013.01); *H03H 3/02* (2013.01); *H03H 9/1014* (2013.01); *H03H 9/173* (2013.01); *H03H 9/174* (2013.01); *H03H 9/205* (2013.01); *H03H 9/582* (2013.01); *H03H 9/588* (2013.01); *H03H 2003/021* (2013.01)

(58) Field of Classification Search
CPC ........ H03H 9/587; H03H 9/588; H03H 9/568; H03H 9/564; H03H 9/525; H03H 9/485; H03H 9/205; H03H 9/1014; H03H 3/02; H03H 9/582; H03H 2003/021; H03H 9/173; H03H 9/174; H01L 41/0475; H01L 41/18; H01L 41/0477
USPC ........................................ 333/133, 187, 188
See application file for complete search history.

(56) References Cited

U.S. PATENT DOCUMENTS

| | | | |
|---|---|---|---|
| 8,487,511 B2 * | 7/2013 | Sinha | H03H 9/02086 310/320 |
| 9,444,428 B2 * | 9/2016 | Ruby | H03H 9/08 |
| 2016/0043299 A1 * | 2/2016 | Fujimori | H01L 37/02 310/330 |

* cited by examiner

*Primary Examiner* — Robert J Pascal
*Assistant Examiner* — Jorge L Salazar, Jr.
(74) *Attorney, Agent, or Firm* — Wiggin and Dana LLP; Gregory S. Rosenblatt; Rikesh P. Patel

(57) ABSTRACT

An FBAR filter device comprising an array of resonators, each resonator comprising a single crystal piezoelectric layer sandwiched between a first and a second metal electrode, wherein the first electrode is supported by a support membrane over an air cavity, the air cavity being embedded in a silicon dioxide layer over a silicon handle, with through-silicon via holes through the silicon handle and into the air cavity, the side walls of said air cavity in the silicon dioxide layer being defined by barriers of a material that is resistant to silicon oxide etchants, and wherein the interface between the support membrane and the first electrode is smooth and flat.

25 Claims, 27 Drawing Sheets

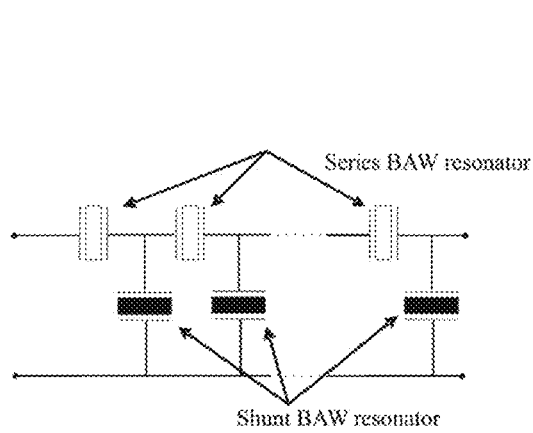
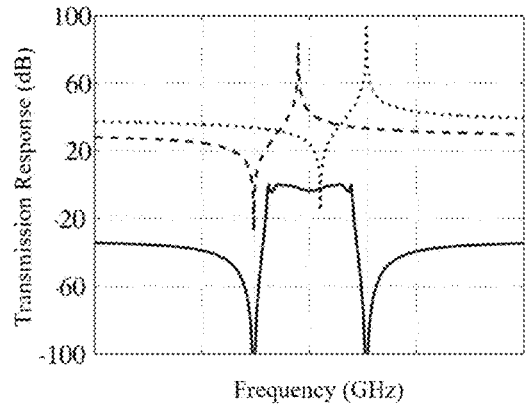
Fig. 13
Fig. 14
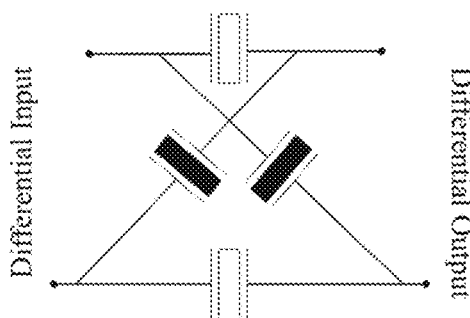
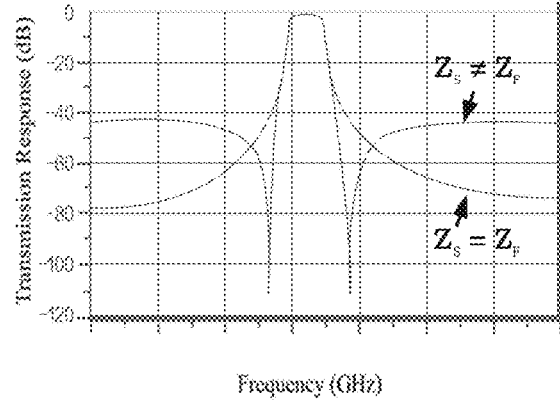
Fig. 15
Fig. 16
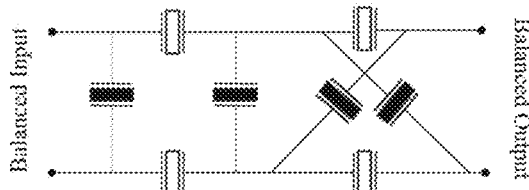
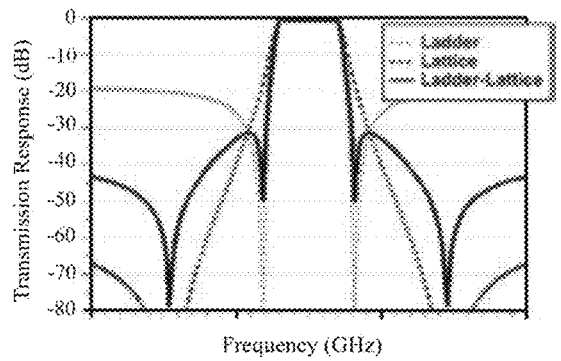
Fig. 17
Fig. 18

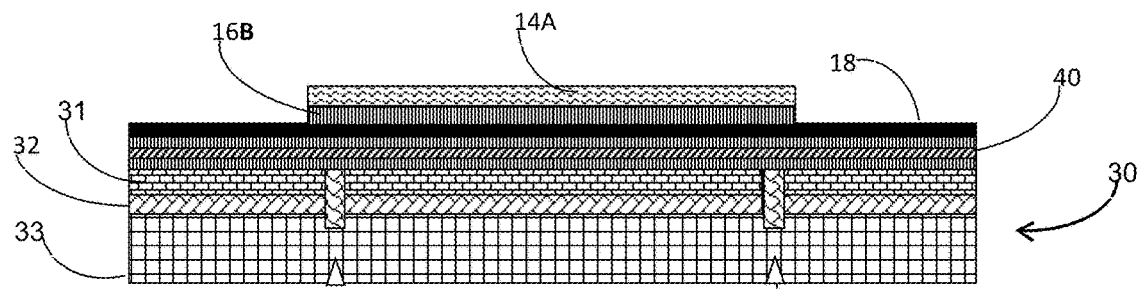
Fig. 45
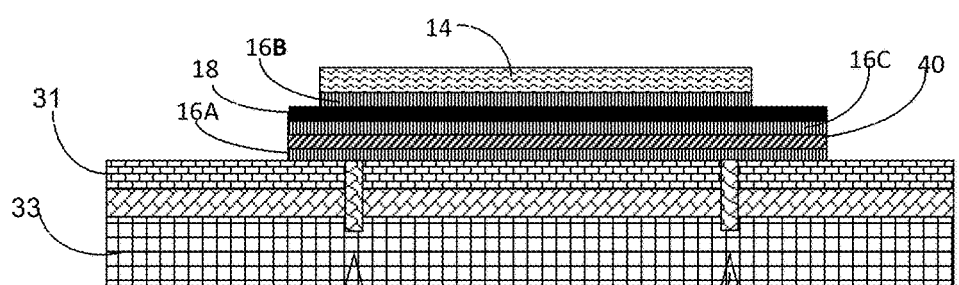
Fig. 46
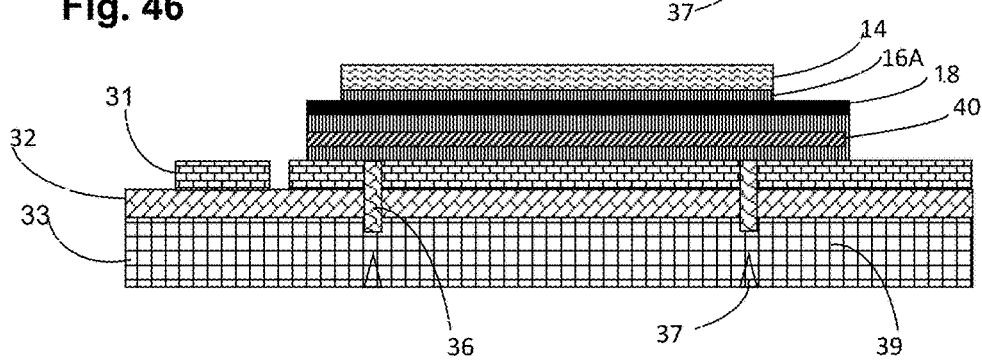
Fig. 47
```
Apply passivation layer over support membrane and lower electrode and around piezoelectric layer
                                                                                          — D(viii)
                          ↓
           Selectively deposit adhesion layer over passivation layer
                                                                                          — D(ix)
                          ↓
           Selectively deposit upper electrode layer over the adhesion layer
                                                                                          — D(x)
                          ↓
```
Fig. 48

SINGLE CRYSTAL PIEZOELECTRIC RF RESONATORS AND FILTERS WITH IMPROVED CAVITY DEFINITION

BACKGROUND

Radio frequency (RF) communication, such as that used in mobile phones, requires RF filters that each passes a desired frequency and block all other frequencies. The core of the RF filter is an acoustic resonator.

Ever greater data traffic results in a drive to higher frequencies and more filters per mobile phone. To keep such phones from becoming larger, RF filters are required to be ever smaller. To prevent battery drainage and generation of heat requiring dissipation, filters having low power consumption are required.

Each RF filters includes an array of acoustic resonators. The quality of each resonator is given by its Q factor, which is a dimensionless parameter that describes how underdamped an oscillator or resonator is, and characterizes a resonator's bandwidth relative to its center frequency, which is the ratio of the energy stored to the power dissipated. The next generation of mobile phones requires quality resonators and filters having high Q factors indicating low energy loss during operation. This translates to a lower insertion loss and a steeper skirt for "sharper" differentiation to nearby bands.

One type of resonator is the Bulk-acoustic-wave (BAW) resonator. The electrical impedance of a BAW resonator has two characteristic frequencies: the resonance frequency $f_R$ and anti-resonance frequency $f_A$. At $f_R$, the electrical impedance is very small, whereas at $f_A$ the electrical impedance is very large. Filters are made by combining several resonators. A typical arrangement includes a "half-ladder" architecture comprising resonators in series and shunt. The shunt resonator is shifted in frequency with respect to the series resonator. When the resonance frequency of the series resonator equals the anti-resonance frequency of the shunt resonator, the maximum signal is transmitted from the input to the output of the device. At the anti-resonance frequency of the series resonator, the impedance between the input and output terminals is high and the filter transmission is blocked. At the resonance frequency of the shunt resonator, any current flowing into the filter section is shorted to ground by the low impedance of the shunt resonator so that the BAW filter also blocks signal transmission at this frequency. The frequency spacing between $f_R$ and $f_A$ determines the filter bandwidth.

For frequencies other than the resonance and anti-resonance frequencies, the BAW resonator behaves like a Metal-Insulator-Metal (MIM) capacitor. Consequently, far below and far above these resonances, the magnitude of the electrical impedance is proportional to 1/f where f is the frequency. The frequency separation between $f_R$ and $f_A$ is a measure of the strength of the piezoelectric effect in the resonator that is known as the effective coupling coefficient—represented by $K^2_{eff}$. Another way to describe the effective coupling coefficient is as a measure of the efficiency of the conversion between electrical and mechanical energy by the resonator (or filter). It will be noted that the electromechanical coupling coefficient is mainly a material's related property that defines the $K^2_{eff}$ for the piezoelectric film.

The level of performance of a filter is defined by its factor of merit (FOM) which is defined as $FOM=Q*K^2_{eff}$.

For practical applications, high $K^2_{eff}$ and Q factor values are both desirable. However, there is a trade-off between these parameters. Although $K^2_{eff}$ is not a function of frequency, the Q-value is frequency dependent and therefore the FOM (Factor of Merit) is also a function of frequency. Hence the FOM is more commonly used in filter design than in the resonator design.

In many applications, a lowering in the $K^2_{eff}$ of a device can be tolerated to achieve a high Q factor since a small sacrifice in $K^2_{eff}$ may give a large boost to the Q value. However, the opposite approach of sacrificing Q-value to obtain a design having an adequate $K^2_{eff}$ is not feasible.

The $K^2_{eff}$ of a resonator can be enhanced by choosing a high acoustic impedance electrode, and it can also be enhanced by compromising other parameters such as increasing the thicknesses of the electrode and passivation layer.

The highest performance (i.e. highest FOM) type of bulk acoustic wave resonator or filter is the free-standing bulk acoustic resonator or FBAR. In the traditional FBAR resonator a free-standing bulk acoustic membrane which is supported only around its edge is used. An air cavity is provided between the bottom electrode and the carrier wafer. There is a need for improved FBAR resonators and the present invention addresses this need.

SUMMARY

A first aspect of the invention is directed to providing an FBAR filter device comprising an array of resonators, each resonator comprising a single crystal piezoelectric film sandwiched between a first and a second metal electrode, wherein the first electrode is supported by a support membrane over an air cavity, the air cavity being embedded in a silicon dioxide layer over a silicon handle, with through-silicon via holes through the silicon handle and into the air cavity, the side walls of said air cavity in the silicon dioxide layer being defined by barriers of a material that is resistant to silicon oxide etchants, and wherein the interface between the support membrane and the first electrode is smooth and flat.

Typically, the material that is resistant to silicon dioxide etchant is silicon nitride, and the barriers are filler filled trenches having a silicon nitride liner.

Typically, the filler is selected from the group comprising polysilicon and silicon nitride.

Optionally, the single crystal piezoelectric layer is selected from the group comprising:
$Ba_xSr_{(1-x)}TiO_3$ (BST); $Al_xGa_{(1-x)}N$, $Sc_xAl_{(1-x)}N$; AlN, $LiNbO_3$ and $LiTaO_3$ in desirable orientations.

Preferably, the single crystal piezoelectric membrane is selected from the group comprising:
  <111> $Ba_xSr_{(1-x)}TiO_3$ (BST);
  $Al_xGa_{(1-x)}N$ with strong C axis texture:
  $Sc_xAl_{(1-x)}N$ with strong C axis texture;
  AlN with strong C axis texture: $LiNbO_3$ at YX1/36° and $LiTaO_3$ at YX1/42° to YX1/52°.

Typically the single crystal piezoelectric layer has a thickness of less than 1.5 microns.

Optionally the support membrane is fabricated from a single crystal selected from the group comprising:
  single crystal silicon with an orientation selected from the group of <110>, <111>, and <100>;
  single crystal lithium niobite, and
  single crystal lithium tantalate.

Typically, the support membrane has a thickness of less than 1.5 µm.

Optionally, the silicon handle comprises single crystal silicon having a resistivity above 1000 ohm-cm and an orientation selected from the group comprising <100>, <111> and <110>.

Typically, the first electrode comprises at least one metal layer selected from the group of aluminum, gold, molybdenum, tungsten and titanium-tungsten.

Typically, the first electrode comprises adhesion layers selected from the group of titanium, chromium and titanium-tungsten adjacent to the support membrane and to the piezoelectric membrane; at least one metal layer selected from the group of tungsten, titanium-tungsten, molybdenum and aluminum and a bonding layer of gold.

Typically, the adhesion layers are selected from the group of titanium, chromium and titanium-tungsten and they and the bonding layer of gold have maximum thicknesses in the range of from 20 to 50 nanometers.

Optionally, the second electrode comprises an adhesion layer selected from the group of titanium, chromium and titanium-tungsten adjacent to the piezoelectric layer and a further metal layer selected from the group of aluminum, molybdenum tungsten and titanium-tungsten.

Typically, adjacent resonators are separated by a passivation material.

Optionally, the passivation material separating adjacent resonators is selected from the group consisting of $SiO_2$, silicon nitride, $Ta_2O_5$, polyimide and benzocyclobutene (BCB).

Typically, the FBAR filter further comprises first and second electrode extension pads and a base of a seal ring positioned around the perimeter of the filter device, the pads and the base of the seal ring coupled to the passivation layer.

Typically, the first and second pads, the base of the seal ring and the second electrode comprise an adhesion layer selected from the group of titanium, chromium and titanium-tungsten covered by a material selected from the group of aluminum, molybdenum, tungsten and titanium-tungsten.

Optionally, the base of the seal ring and the electrode extension pads further comprise an adhesion layer selected from the group of titanium, chromium and titanium-tungsten coupled to a gold seed layer, and the seal ring is supportingly coupled to a lid having an inner and outer surface, such that the seal ring and inner surface define a cavity over the second electrode.

Typically, the lid comprises silicon or glass and is provided with through metal vias that electrically interconnect metal capture pads on the inner surface of the cap with metal termination pads on the outer surface of the lid.

Optionally, the inner surface of the cap is provided with a top section of a metal seal ring and the top section of the seal ring and the capture pads are coupled to the base sections of the seal ring and first and second pads by a bonding layer.

Typically, the bonding layer is selected from a group of gold, gold paste with organic binder and a gold-tin mixture.

In some embodiments the lid comprises silicon and the metal vias and termination pads comprise copper and the vias and termination pads are isolated from the silicon by a silicon dioxide or silicon nitride insulating layer.

In other embodiments, the lid comprises glass and the metal vias capture and termination pads comprise copper.

Typically, the termination pads on the outer surface of the cap further comprise coatings of metal finishing layers selected from the group of gold, ENIG and ENEPIG.

A second aspect is directed to a method of fabricating an FBAR filter device comprising an array of resonators, each resonator comprising a single crystal piezoelectric film sandwiched between a first metal electrode and a second metal electrode, wherein the first electrode is supported by a support membrane over an air cavity, the air cavity embedded in a silicon dioxide layer over a silicon handle, with through-silicon via holes through the silicon handle and into the air cavity, the side walls of said air cavity in the silicon dioxide layer being defined by perimeter trenches that are resistant to a silicon oxide etchant, comprising the stages of:

A. Fabricating a support membrane over a silicon dioxide box on a silicon handle, having through support membrane filled trenches that traverse the silicon oxide layer, and wherein the support membrane is coated with at least a bonding layer of a first metal electrode coupled to the support membrane by an adhesion layer;

B. Fabricating a piezoelectric layer coupled to a detachable carrier substrate and coated with at least a bonding layer of the first metal electrode coupled to the piezoelectric film by an adhesion layer;

C. Bonding the support membrane to the piezoelectric film by bonding the two bonding layers together to sandwich the first metal electrode between the piezoelectric film and the support membrane;

D. Processing the piezoelectric layer coupled to the support membrane by the first membrane from the piezoelectric layer side by removing the carrier substrate, trimming the piezoelectric layer into piezoelectric films, first electrode layers and exposed surface of the support membrane, and by surrounding the piezoelectric films with a passivation material and coating with a second electrode;

E. Fabricating an array of lids with external terminations on an outer surface and upper sections of seal rings and contact stacks on an inner surface, such that the external terminations are coupled to the contact stacks by through lid vias, and the ends of the upper section of seal rings and contact stacks (shown in FIG. 1 block D2 or E2), and fabricating a base section of seal ring onto the passivation layer and lower sections of first and second contact stacks coupled to the first and second electrodes for coupling to the upper section of contact stacks by a bonding layer;

F. Attaching the array of filters to the array of caps by coupling the base sections of the seal ring and contact stacks to the upper sections of the seal ring and contact stacks with bonding layers;

G. Thinning the silicon handle, and etch holes through silicon handle to the silicon oxide layer, etch away silicon oxide and optionally etch away part of all the support membrane, and optionally sealing the etch holes; and H. Dicing the array into individual filters.

In some processing variants stage B is performed prior to stage A.

In some processing variants at least some of the processing steps of stage G precede Stage D.

In some processing variants at least some of the processing steps of stage G precede Stage F.

In some processing variants at least some of the processing steps of stage E precede any of stages A to D.

Typically, stage A comprises the steps of:
obtaining a support membrane attached to a silicon handle by a silicon oxide layer;
creating trenches through the support membrane, the silicon dioxide layer and into the silicon handle;

depositing a silicon nitride coating over the membrane surface and into the trenches that optionally fills said trenches;

optionally depositing polysilicon over the silicon nitride coated membrane surface and coated trenches to fill the trenches and then removing polysilicon from the surface thereby exposing the silicon nitride coating over the membrane surface;

removing the silicon nitride coating to exposing the membrane surface, and depositing a first adhesion layer followed by a first part of the first electrode over the membrane surface terminating with a bonding layer.

In some embodiments, the support membrane comprises single crystal silicon with an orientation of <110>, <111> or <100> and is a wafer sliced from a single crystal of silicon and optionally subsequently thinned.

In other embodiments, the support membrane attached to a silicon handle by a silicon oxide layer comprises: single crystal lithium niobate or single crystal lithium tantalate and is obtained by a process comprising the steps of:

a. bombarding a single crystal donor wafer with hydrogen or helium ions to a depth of less than 1.5 microns to generate a membrane that is weakly coupled to the single crystal donor wafer;

b. Attaching side of the wafer with weakly coupled membrane to the silicon handle by a silicon dioxide layer that is either thermally grown or deposited onto the silicon handle;

c. exposing the single crystal donor wafer to elevated temperature. thereby rupturing bonds holding the membrane to the donor wafer and leaving the single crystal support membrane coupled to the silicon handle by the silicon dioxide layer, and d. optionally polishing to remove damage, and annealing if necessary, to cause atomic rearrangement.

Typically, the trenches through the membrane, the silicon dioxide layer and into the silicon handle fabricating are fabricated by deep reactive ion etch (DRIE) using BOSCH process.

Optionally, the first adhesion layer of Step A is selected from the group comprising titanium, chromium and titanium-tungsten and the first part of first electrode layer comprises a material selected from the group comprising tungsten, titanium-tungsten, molybdenum, aluminum and gold and the first adhesion layer and first part of the electrode layer are deposited by physical vapor deposition (PVD), such as sputtering.

Alternatively, the first adhesion layer of Step A comprises titanium or chromium or titanium-tungsten and an outer layer of the first part of the first electrode is a thin gold layer having a thickness range of 10 to 25 nanometers deposited by physical vapor deposition.

Optionally, Step B comprises depositing a single crystal piezoelectric layer onto a release layer coupled to a carrier substrate, wherein the piezoelectric layer is deposited to a thickness of up to 1.5 microns by sputtering or Molecular Beam Epitaxy (MBE) and is selected from the group comprising:

$Ba_xSr_{(1-x)}TiO_3$ in a <111> orientation where x<0.5;
AlN in a C-Axis orientation;
$Al_xGa_{1-x}N$ in a C-Axis orientation where x>0.85;
$Sc_xAl_{1-x}N$ in a C-Axis orientation where 0.05<x<0.25

Alternatively, Step B comprises depositing a single crystal piezoelectric layer coupled by a release layer to a detachable carrier substrate, wherein the piezoelectric layer comprises a layer of single crystal lithium niobate or single crystal lithium tantalate having a thickness of up to 1.5 microns and is obtained by a process comprising:

bombarding a facet of a single crystal donor wafer of the piezoelectric with hydrogen or helium ions to a depth of less than 1.5 microns to generate a membrane that is weakly coupled to the facet of the single crystal donor wafer;

Attaching outer surface of the weakly coupled membrane to a release layer coupled to a carrier substrate by a surface activated wafer bonding process or by fusing a silicon dioxide layer previously deposited onto the weakly coupled membrane;

exposing the single crystal donor wafer to an elevated temperature thereby rupturing bonds holding the piezoelectric layer to the donor wafer and leaving the single crystal piezoelectric layer coupled by the release layer to the carrier substrate; and optionally polishing to remove damage, and annealing if necessary, to cause atomic rearrangement.

Typically, stage B is characterized by at least one of the following limitations:

the removable carrier comprises sapphire;
the release layer comprises GaN;
the removable carrier and release layer are C-axis <0001> with maximum tolerance of ±0.5 degrees.

Optionally, in Stage C, the first electrode comprises a first adhesion layer attached to the support membrane, a second adhesion layer attaching second and third coating layers and a third adhesion layer for attaching the third coating layer to the piezoelectric layer; wherein the adhesion layers are selected from the group of titanium, chromium and titanium-tungsten and one of the first and second coating layers is fabricated from a material selected from the group of tungsten, titanium-tungsten, molybdenum and aluminum and the other of the first and second coating layers is a bonding layer of gold having a thickness range of 20 to 50 nanometer, and all layers of the first electrode are deposited by physical vapor deposition.

Optionally, in stage C comprises bonding the first and second parts of the first electrode together by a surface activated bonding process with at least one of the following limitations:

the process is performed between two identical metals selected from the group of tungsten, molybdenum, aluminum and gold;

the process is performed between two metals having an average surface roughness of less than 0.5 nanometers;

the process is performed by pre-activating the to be bonded surfaces by plasma, the plasma gas selected from the group of argon and nitrogen;

the process is performed under vacuum;

the process is performed under pressure range of 5 MPa to 50 MPa;

the process is performed under temperature range from room temperature to less than 300° C.

Optionally, stage C comprises the steps of:

providing a single crystal piezoelectric layer coupled to a detachable substrate by a release layer from its first side and further comprising a second part of the first electrode layer attached to the single crystal piezoelectric layer from its second side by a second adhesion layer;

bonding the first part of the electrode to the second part of the electrode to form a first electrode that couples the support membrane to the piezoelectric layer.

Typically, stage D comprises the steps of:

processing from the detachable substrate side by removing the detachable substrate and release layer;

trimming the piezoelectric layer and selectively removing the piezoelectric layer, first electrode and support membrane to fabricate resonator stacks comprising the piezoelectric layer on the first electrode;

surrounding the resonator stacks with a passivation material;

depositing an upper electrode over the piezoelectric layer with upper and lower electrodes pad terminations over the passivation layer, and a first part of a metal seal ring around the perimeter of each FBAR filter device over the passivation layer.

Typically, the step of removing the detachable carrier substrate in stage D is performed by a laser lift off process.

Typically, the detachable substrate in stage D comprises a sapphire single crystal wafer coated with GaN and the laser lift off process comprises irradiating the GaN through the sapphire using 248 nm excimer square waveform laser.

Typically the step of removing the release layer in stage D is performed by an exposing to an induction coupled plasma.

Typically, the process of trimming the piezoelectric layer comprises applying a scanning surface ion milling process over the surface of the piezoelectric membrane.

Typically, the process of selectively removing the piezoelectric layer, first electrode and support membrane to fabricate resonator stacks comprises the process steps of applying photo-resist followed by selectably exposing through windows in the photoresist and applying an induction coupled plasma to etch the said piezoelectric, first electrode and support membrane layers through said windows.

Optionally, the passivation material surrounding the resonator stacks is selected from the group comprising $SiO_2$, silicon nitride, $Ta_2O_5$, polyimide and Benzocyclobutene (BCB).

Typically, the upper electrode over the piezoelectric layer, pad terminations over the passivation layer and a first part of an array of metal seal rings around the perimeter of each filter is fabricated from a material selected from the group of tungsten, titanium-tungsten, molybdenum, aluminum and gold and are deposited by physical vapor deposition.

Optionally, the adhesion layers are selected from the group of titanium, chromium and titanium-tungsten, and are deposited PVD Onto the piezoelectric layer prior to deposition of the upper electrode;

over the passivation layer prior to deposition of the upper and lower electrodes pad terminations over the passivation layer prior to deposition of the first part of a metal seal ring around the perimeter of the each filter unit.

Typically, Stage E comprises fabricating an array of lids having an inner and outer surface having through metal vias electrically connecting terminations pads on the outer surface to capture pads under the inner surface of the array of lids.

Preferably, Stage E further comprises fabricating an array of metal seal rings on the inner surface of the cap such that the metal seal rings have similar shape and size to the bases of the metal seal rings around the perimeter of each filter unit in the FBAR filter array.

Optionally, stage E of providing an array of lids comprises the steps of:

a. obtaining a silicon wafer with an inner and an outer surface;

b. drilling blind via holes having blind ends from the outer surface by deep reactive ion etch (DRIE) using BOSCH process;

c. depositing a silicon nitride or silicon dioxide layer into the blind vias holes and over the outer surface of the silicon cap;

d. depositing a titanium-copper seed layer over the silicon nitride or silicon dioxide surface and into the blind vias holes;

e. pattern electroplating copper to fill the blind vias holes and to generate copper termination pads over the filled blind vias;

f. etching away the titanium copper seed layer;

g. depositing a metal finish selected from the group of gold, ENIG and ENEPIG over the termination pads;

h. grinding away the inner surface of the silicon cap to within 25 microns of the blind ends of the copper filled blind vias;

i. thinning down the silicon with plasma to remove an additional 25~30 microns of silicon, thereby exposing about 5 microns of the ends of the silicon nitride or silicon dioxide lined copper filled vias without damaging the silicon nitride or silicon dioxide liner or copper filling;

j. depositing silicon nitride or silicon dioxide over the inner surface of the silicon cap and exposed silicon nitride or silicon dioxide coated copper vias;

k. Removing the silicon nitride or silicon dioxide and protruding copper by chemical mechanical polishing (CMP), thereby exposing the ends of the copper vias in the silicon nitride or silicon dioxide layer coating the inner surface of the silicon cap;

l. depositing an adhesion layer selected from the group of titanium, chromium and titanium-tungsten followed by a gold seed layer over inner surface of the silicon cap;

m. terminating the inner surface by either:

applying a photo-resist and patterning with trenches over the gold seed layer; filling the trenches with a gold or a gold-tin mix by electroplating; stripping away the resist and etching away the seed layer, thereby generating a gold or gold-tin bonding layer over the gold capture pads and seal ring defining the perimeter of each device on the inner surface of the cap, or applying a photo-resist and patterning with capture pads and a seal ring defining the perimeter of each cap device and filling the pattern by screen printing nano-sized gold particles in an organic binder in a paste form; sintering the paste at 200° C. to remove the binder and stripping away the photo-resist.

Alternatively, the stage E of providing an array of caps comprises the steps of:

obtaining a glass having an inner and an outer surface;

laser drilling through via holes through the glass wafer;

sputtering a Ti/Cu seed layer into the through via holes and over the inner and outer surfaces of the glass wafer;

Depositing a layer of photo-resist on both the inner and the outer surfaces of the glass wafer and patterning to form an array of seal rings defining the perimeter of each lid for each filter unit in the array of lids and an array of pad shapes adjacent to each through hole, and patterning an array of termination pad shapes over ends of the through vias on the outer surface of the glass wafer;

Filling the pattern with copper by electroplating;

stripping away the photo-resist, and terminating the cap by:
  etching the Ti/Cu seed layer from both cap's surfaces and
  depositing a metal finish over the termination pads on the outer surface, said metal finish being selected from the group of gold, ENIG and ENEPIG;
  processing the inner surface by applying and patterning a thicker layer of photoresist over the array of capture pads and seal rings; filling the thicker pattern by either (i) screen printing nano-sized gold particles and organic binder in a paste form; sintering the paste at 200° C. and stripping away the photo-resist, thereby fabricating a bond layer, or by (ii) electroplating gold or a gold tin mix into the pattern and stripping away the photo-resist.

Optionally the through via holes are fabricated in the glass wafer by laser drilling from both sides.

Optionally, step F of attaching the array of lids to the array of filters comprises:
  depositing a metal bonding layer on at least one of the array of second metal seal rings and capture pads coupled to the inner side of the cap, and
  the said first metal seal ring and pads coupled to the first and second electrodes of the FBAR filter device;
  Bonding the array of lids to the wafer FBAR filter by reflowing the metal bonding layer such that the seal ring and the inner surface of the caps define a cavity over each filter array.

Typically, the step of bonding the wafer cap to the wafer FBAR filter is performed by reflowing the bond layer under vacuum in the temperature range of 150° C. to 300° C. and at a pressure in the range of 50 MPa to 100 MPa.

Typically stage G of processing from the handle side comprises the steps of:
  thinning the handle;
  drilling via holes through the handle to the silicon oxide layer within areas defined by the perimeter trenches;
  Etching away the silicon oxide within the perimeter trenches Typically, etching away the silicon oxide within the perimeter trenches in the membrane silicon oxide layer forms individual cavities under each resonator stack, and the perimeter trenches serve as etch stops.

Typically stage G further comprises at least one of the following steps:
  trimming the support membrane through the via holes and the air cavity to a thickness of between zero and the thickness of the piezoelectric layer, and
  plugging the through silicon vias by depositing a layer of polysilicon under the wafer handle side.

Typically, in stage G, the step of drilling via holes through the handle to the silicon dioxide layer within the perimeter trenches comprises deep reactive ion etching (DRIE) using BOSCH process.

Typically, in stage G, the step of etching away the silicon oxide within the perimeter trenches in the membrane silicon oxide layer and handle comprises exposing to HF in liquid or vapor phase.

Typically, in stage G, the optional step of thinning the support membrane through the silicon vias and the air cavity to a thickness of between zero and the thickness of the piezoelectric layer is achieved by photoresist masking the silicon handle surface thereby only exposing the through silicon vias, and exposing the silicon handle and photoresist to inductive coupling or microwave sourced a plasma fabricated from a $XeF_2$ and Ar gas mixture.

BRIEF DESCRIPTION OF FIGURES

For a better understanding of the invention and to show how it may be carried into effect, reference will now be made, purely by way of example, to the accompanying drawings.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention; the description taken with the drawings making apparent to those skilled in the art how the several forms of the invention may be embodied in practice. In particular, it will be appreciated that the schematic illustrations are not to scale, and the thickness of some very thin layers is exaggerated. In the accompanying drawings:

FIG. 13 is a simplified circuit of a ladder type RF filter configuration;

FIG. 14 is a graph showing the transmission response of the ladder filter configuration of FIG. 13;

FIG. 15 is a is a simplified circuit of a lattice type RF filter configuration;

FIG. 16 is a graph showing the transmission response of the lattice type filter configuration of FIG. 15;

FIG. 17 is a simplified circuit of a combined ladder and lattice type RF filter configuration;

FIG. 18 is a graph showing the transmission response of the filter configuration of FIG. 17;

FIG. 41-47 are schematic illustrations showing the structures resulting from the steps of the flowchart of FIG. 40;

FIG. 48 is a flowchart of showing how the structure of FIG. 47 is processed to apply passivation material and upper electrode;

DESCRIPTION OF EMBODIMENTS

Figure 1:
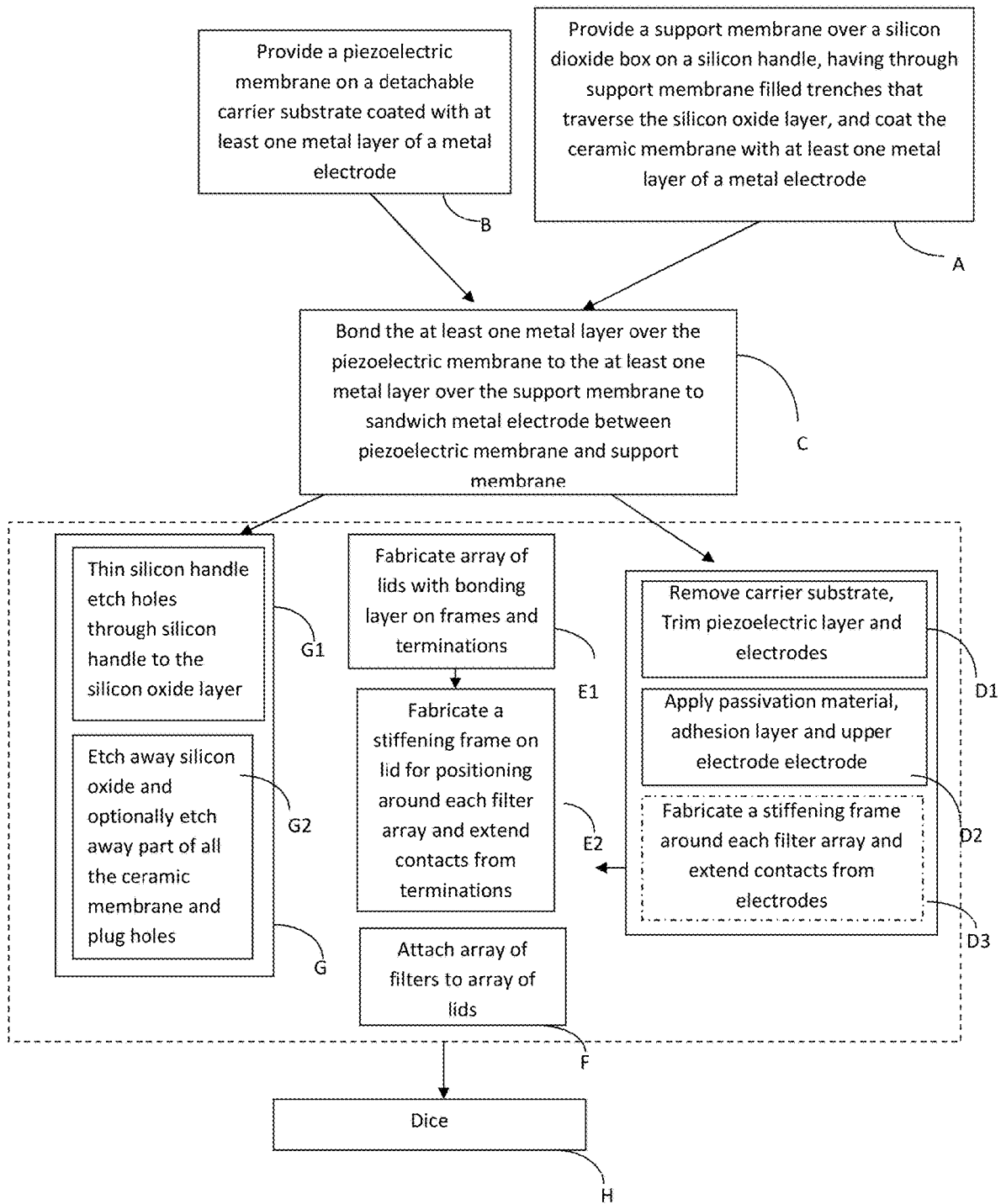
FIG. 1 is a high level flowchart showing the conceptual stages of for fabricating piezoelectric RF resonators and filters with improved cavity definition in accordance with embodiments of the invention.

The present invention is directed to novel Bulk Acoustic Wave (BAW) resonators of the Film Bulk Acoustic Resonator (FBAR) type, and to methods of fabrication of the same. FIG. 1 is a flowchart of the general manufacturing process, and FIGS. 2 to 11 show the structures formed by the blocks A to G of FIG. 1, which relates to on wafer processing of resonators, prior to dicing (FIG. 1 block H) to separate the individual filter units. As explained with reference to FIGS. 12-17 and 60-61, the resonators may be arranged in series and parallel to create FBAR filter components. These resonators are multi-layer structures that include ceramic and metal elements, and may include polymers. The various resonators of the filter component are fabricated on wafers in large arrays and then the wafer is sectioned to create individual filters which each comprise arrangements of the FBAR resonators, which are electrode coated piezoelectric membranes having cavities on each side to enable them to vibrate, thereby transferring signals at the resonating frequency, and damping out (filtering) other frequencies.

As with prior art FBAR resonators, the electrode coated single crystal piezoelectric films 14 of the resonator embodiments discussed herein are physically supported around their edges, thereby enabling them to resonate. However, it is an important feature of many embodiments described below, that the electroded single crystal piezoelectric film 14 is coupled to and thus stiffened by a low acoustic-loss support membrane 31 that has a maximum thickness of that of the piezoelectric membrane itself, so practically the support membrane 31 is required to be less than 1.5 μm thick. The support membrane 31—electrode 16,18,40,16—piezoelectric film 14—electrode 60 stack is supported around its edge to enable it to resonate.

As explained in the background section, where the terms Q and $K^2_{eff}$ are defined, the level of performance of a filter is given by its factor of merit (FOM) which is defined by the equation FOM=$Q*K^2_{eff}$.

Attaching a support membrane 31 to the piezoelectric film 14 makes the resultant FBAR non-symmetric and generates extra overtones. It further reduces its $K^2_{eff}$. However, choosing high $K^2t$ piezo materials and adding a support membrane 31 consisting of a high Q material to the piezoelectric film 14 still increases the FBAR's overall FOM and provides important mechanical support to the piezo layer, especially in cases where it's thickness is reduced for high frequency applications. Additionally, the support membrane reduces the resonator's sensitivity to temperature related frequency drifts so the resulting filters are more reliable.

For ease of reading, the following description of various embodiments is divided into subsections. First, with reference to FIG. 1, a brief overview of the generalized structure and method of construction is presented.

The core of the resonator, i.e. the stack of support membrane 31, lower electrode materials 16, 18, 40 and piezoelectric film 14 are fabricated in two stacks A, B of continuous layers which are then conjoined.

Figure 2:
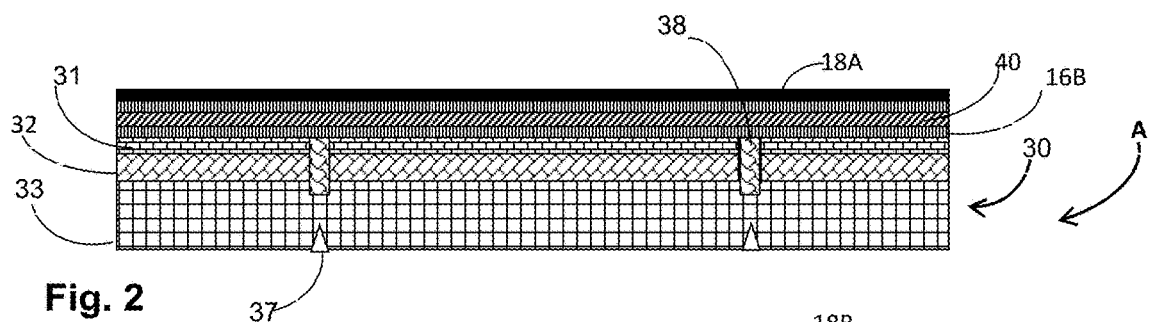
FIG. 2 is a not to scale schematic representation of a first section (FIG. 1 block A) for a resonator array. Consisting of a single crystal support membrane coupled to a silicon handle by a layer of silicon oxide, and patterned with filled and coated barriers that define the extent of resonator stacks, the support membrane being coated with an adhesion layer, additional layer, further adhesion layer and bonding layer.

FIG. 2 and the corresponding description show how a first part A consisting of the support membrane 31 is fabricated over a silicon dioxide box 32 on a silicon handle 30 having through support membrane filled trenches 38 that traverse the silicon dioxide box 32 layer, and are coated with at least one metal layer 18B of the metal electrode. This corresponds to and expands the description of FIG. 1 Box A.

Figure 3:
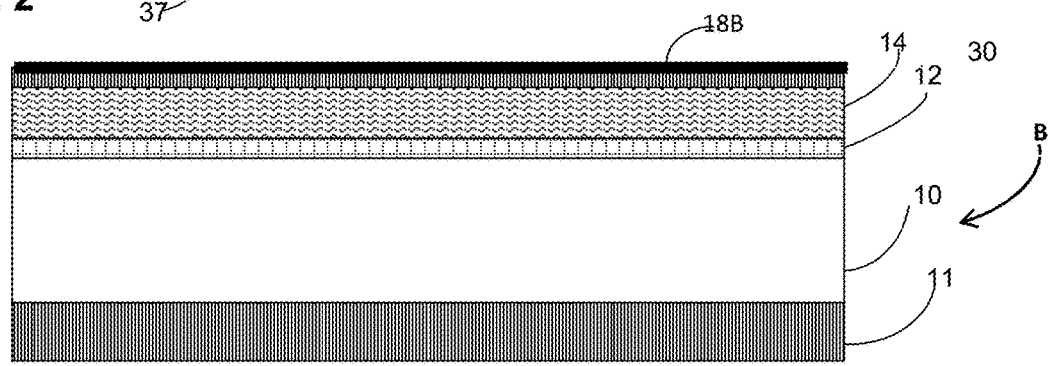
FIG. 3 is a not to scale schematic representation of a second section (FIG. 1 block B) of a resonator array comprising a single crystal piezoelectric layer coupled to a sapphire carrier, an adhesion layer, the single crystal piezoelectric layer being coated with an adhesion layer and a bonding layer.

FIG. 3 and the accompanying description show how a second part B may be fabricated. With reference to FIG. 3, the second part B consists of a piezoelectric film 14 on a detachable carrier substrate 10 where the piezoelectric film 14 is coated with at least one metal layer 18B of a metal electrode of FIG. 1 Box B.

Figure 4:
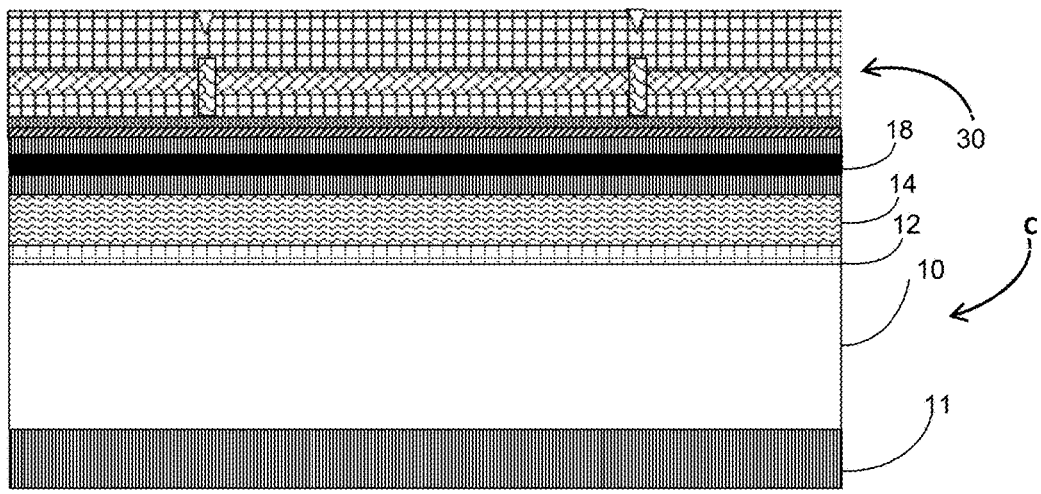
FIG. 4 is a not to scale schematic representation of a piezoelectric layer coupled by a bottom electrode to the single crystal support membrane (FIG. 1 block C), essentially consisting of FIGS. 2 and 3 (FIG. 1 blocks A and B) bonded together, but still coupled to support layer.
Figure 5:
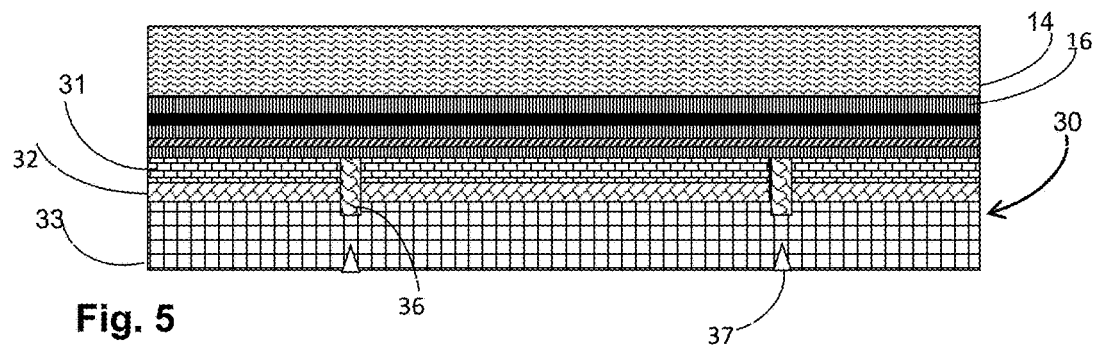
FIG. 5 is a not to scale schematic representation of the structure of FIG. 4 with the sapphire carrier removed.
Figure 6:
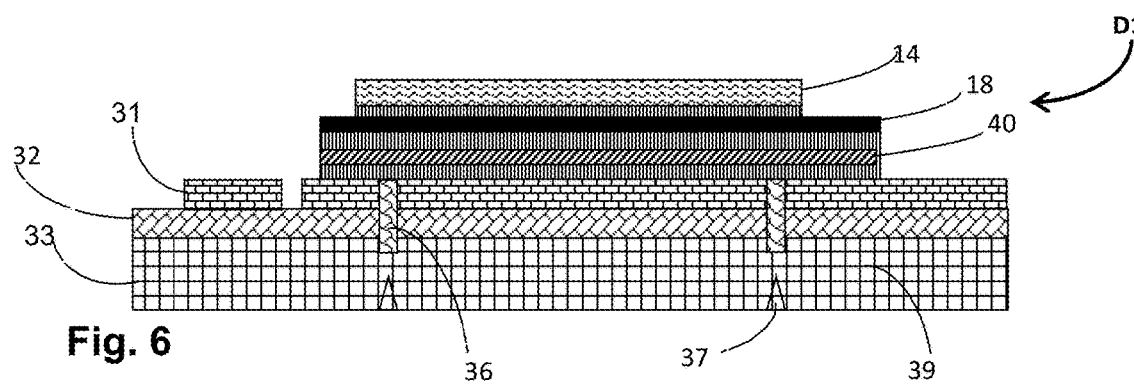
FIG. 6 is a not to scale schematic representation of the structure of FIG. 5 processed from the piezoelectric membrane side to selectively thin and trim the various layers.

FIGS. 4 and 5 show how the structure of block C of FIG. 1 is created by bringing the structures of FIG. 2 (block A) and FIG. 3 (block B) into contact (FIG. 4) and then the sacrificial support 10 of the piezoelectric film 14 is removed to provide the structure shown schematically in FIG. 5 which corresponds to Block C.

The structure of FIG. 5 is processed from each side. Processing from the piezoelectric film 14 side (Block D), the piezoelectric film 14 may be trimmed and the coatings 18, 40 and support membrane 31 of the wafer which are continuous layers, may be patterned by selectively removing material to define the individual resonators, this corresponds to Block D1.

Figure 7:
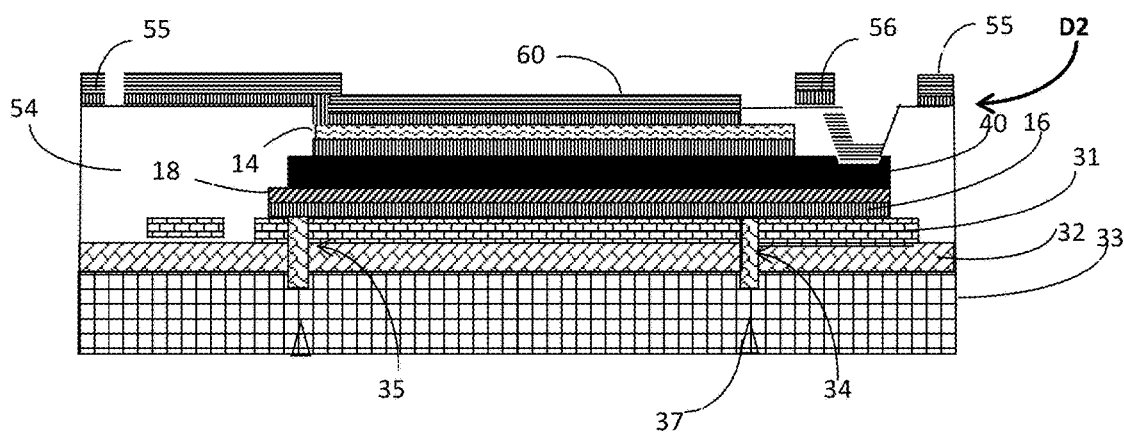
FIG. 7 is a not to scale schematic representation of the structure of FIG. 5 processed from the piezoelectric layer side to selectively thin and trim the various layers up to and including the support membrane.

Each individual resonator is now surrounded by a passivation material 54 to separate it from adjacent individual resonators, and an adhesion layer and a second electrode 60 is applied over the piezoelectric film 14, and a contact seal ring 55 is created around each filter, and a contact pad 56 is fabricated for attachment the lower electrode of each resonator stack, giving the structure schematically shown in FIG. 7—Block D2 of FIG. 1.

It is noted that at this stage of the manufacturing, the individual electrode resonator stacks are arranged into filter units and an array of filter units is fabricated simultaneously on wafers, prior to eventually singulating into individual filter units in Step H.

The resonators may be packaged in various ways. One way, with variations is described with reference to FIGS. 1 blocks D3, E1 and 2, and F. and to FIGS. 8, 10-12.

Figure 8:
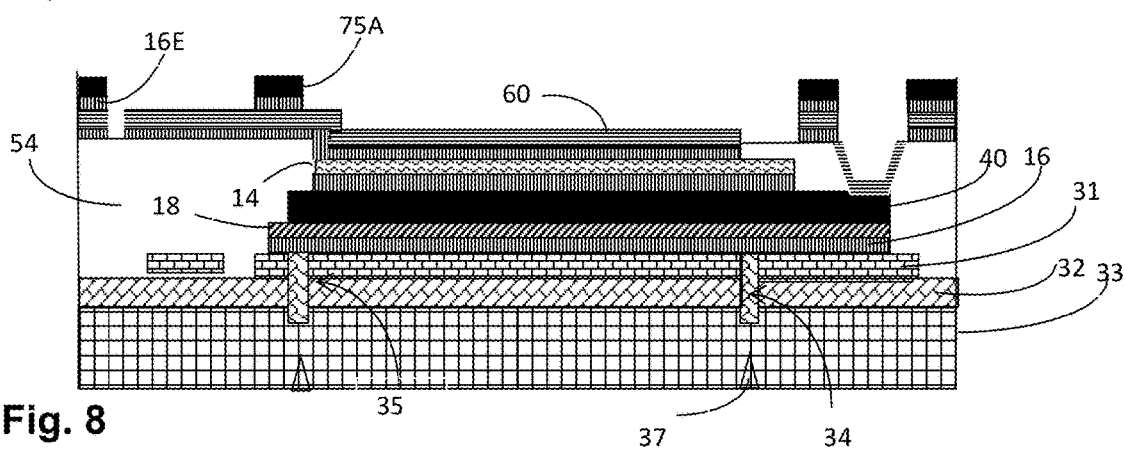
FIG. 8 is a not to scale schematic representation showing the structure of FIG. 7 with passivation layer, and an upper electrode.

With reference to FIG. 8, a bonding surface for attachment of a contract extension to the upper electrode 60 is now discussed. An adhesion layer 16E is selectively deposited to facilitate attachment of contacts and a seal ring consisting of a different material from that of the upper electrode 60. The adhesion layer 16E is typically titanium, chromium or titanium-tungsten. A bonding seed layer 75A is selectively deposited onto the adhesion layer 16E.

Figure 9:
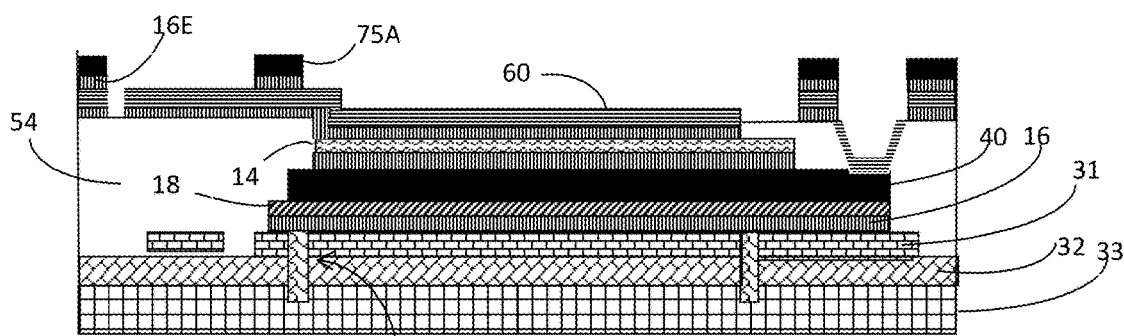
FIG. 9 is a not to scale schematic representation showing the structure of FIG. 8 with a bonding layer attached for coupling to a seal ring around each filter array and bonding layers for attaching connection stacks to top and bottom electrodes.

Referring to FIG. 9 and to FIG. 1 Step G1, the handle 33 is thinned to final dimensions. Typically this is achieved by grinding or by Chemical Mechanical Polishing (CMP). It will be appreciated that this is, however, but one processing order. The handle 33 could be thinned to its desired final dimensions, which are typically about 200 microns from the original thickness (which is typically in the range of 400 to 700 microns, depending on the original wafer diameter), prior to processing from above, in steps D1 and D2, giving the structures shown in FIGS. 6-8.

Figure 10:
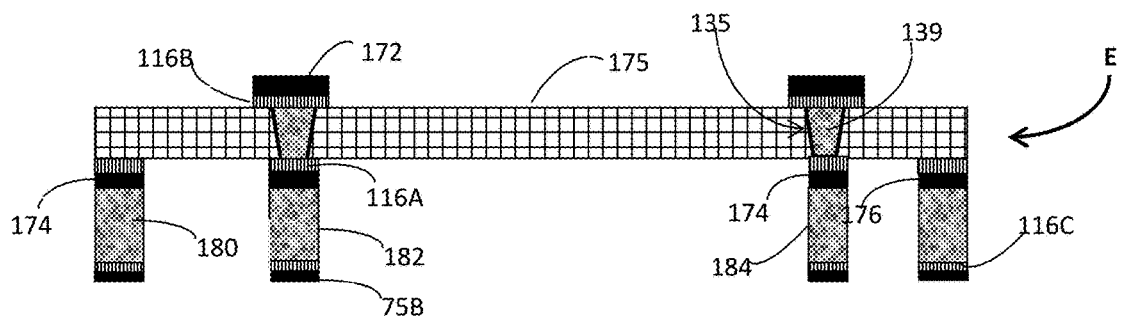
FIG. 10 is a not to scale schematic representation showing a lid with contact pads on outer surface and a seal ring and connection stacks on inner surface for attaching to the structure of FIG. 9.

Referring now to FIG. 10 and to block E1 and E2 of FIG. 1, an array of lids 175 may be fabricated with upper parts of seal rings 180 for attachment to the bonding seed layer 75A selectively deposited around what will become each independent filter array and with upper parts of inner contact stacks 182, 184 extending from the inner surface of the lid 175. The upper parts of inner contact stacks 182, 184 are coupled with filled vias 139 that traverse the lid 175, to terminations 172 of the outer side of the lid 175.

It will however be appreciated that instead of building the seal rings 180 and contact stacks 182, 184 from the lid 175, these could be built up from around the array of filters and from the electrodes of the arrays of resonators. To minimize wastage and the possibility of damaging the piezoelectric layer and electrodes when creating the seal ring, it is considered preferable to substantively build the seal ring and contact stacks on the lids 175.

Figure 11:
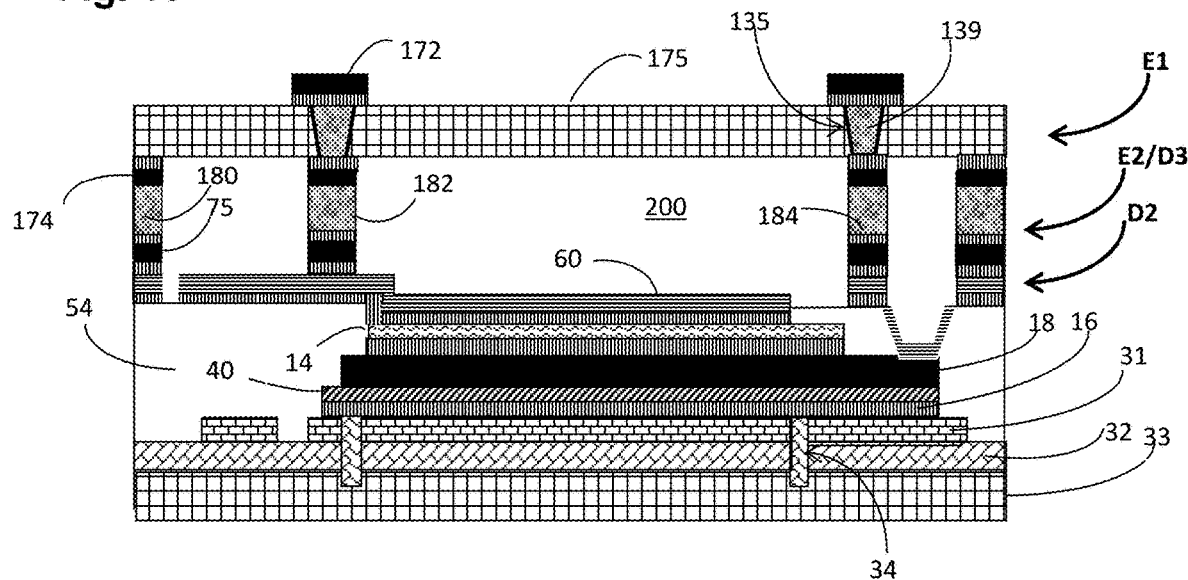
FIG. 11 is a not to scale schematic representation showing the lid of FIG. 10 attached to the filter array of FIG. 9 creating an upper cavity over the filter array.

Referring to FIG. 1 block G2, and to FIG. 11, the structure of FIG. 9 (the array of filters with lower parts of seal ring 75 and lower parts of contact stacks 182, 184) may then connected to the structure of FIG. 10 (the lid 175 with seal ring 180 and contacts 182, 184) to couple the electrodes 40, 60 with the external contacts 172 on the lid 175, and the two parts of the seal ring are coupled together by identical bonding layers 75A, 75B together thereby create an upper cavity defined by the lid 75 and seal ring, that is typically common to all the resonators of an individual filter unit.

Figure 12:
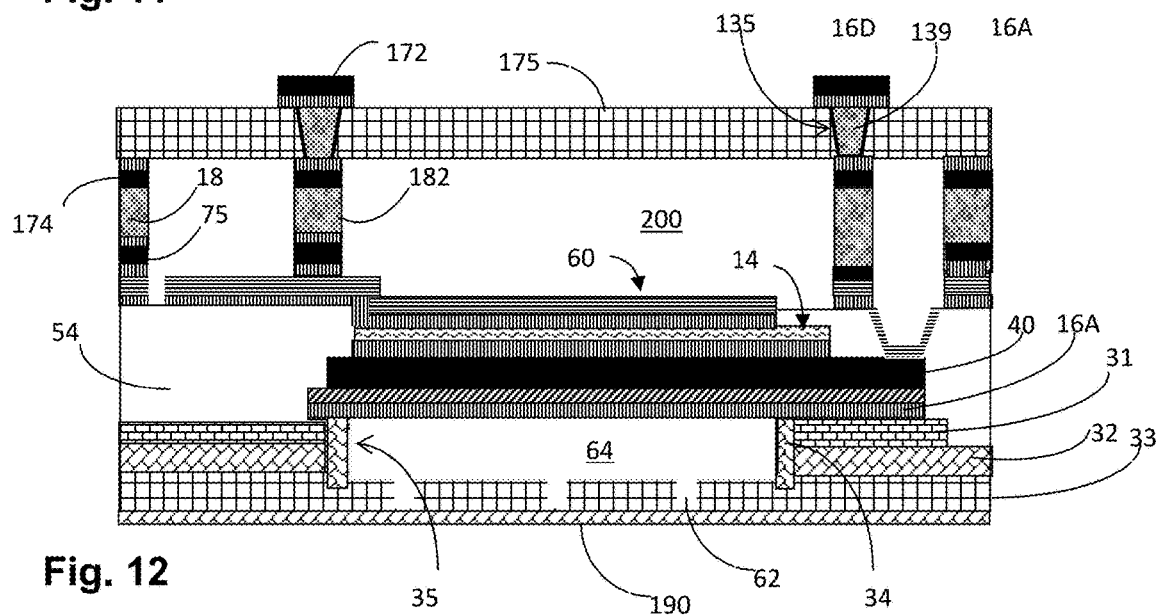
FIG. 12 shows the lidded filter array of FIG. 11 with a lower cavity under each resonator stack; contact pads on outer surface and a seal ring and connection stacks on inner surface for attaching to the structure of FIG. 9.

Referring to FIG. 12 and to FIG. 1 Step G2, lower cavities 64 are then created. Typically an individual cavity 64 is created under each individual resonator stack. This is generally achieved by etching or laser drilling through vias 62 through the handle 33 into the silicon oxide box 32 within the area surrounded by the filled trenches 34. Since the filled trenches 34 are coated with an etch resistant coating 35 that is typically silicon nitride, the silicon oxide within the area surrounded by the filled trenches 34 can thus be etched away with an appropriate etchant such as hydrogen fluoride vapor, with the silicon nitride coating 35 of the filled trenches 34 serving as an etch stop. The support membrane 31 within the area surrounded by the filled trenches 34 may be thinned to a final desired thickness, or indeed removed completely if desired by an appropriate (support membrane material specific) etchant. Then, the through vias 62 may be blocked by deposition of a layer 190 of polysilicon or other appropriate material.

Finally, with reference to FIG. 1 step. H, the array of filters may be diced into individual packaged filter units.

Now it will be appreciated that the order of the sub processes described in blocks D, E, F and G may be changed. The array of lids 75 fabricated in blocks E1 and E2 are entirely separate from the piezoelectric membrane and its support structure prior to being attached thereto in Step F, and so block E can be fabricated before or after blocks D and G.

Similarly, although the process of block G1 is described after blocks D and G2 is described after the processing of block F, one can perform some or all of block G before attaching the array of filters to the array of lids or thereafter. For example, although it may be sensible to thin the handle 33 (block G1) prior to attaching the array of lids F, it may be performed thereafter. Similarly, the seal ring 180 could be fabricated from the array of filters in block D3 instead of in block E2. Indeed, one could process the structure shown in FIG. 5, from the handle 33 side by thinning and then etching the cavities 64 under the support membrane 31, i.e. blocks G1 and G2, and only then process from the piezoelectric film 14 side (blocks D, followed by E and F, with either variant D3 or E2).

With reference to FIG. 13, a simplified circuit of a half ladder type filter configuration created by BAW resonators in series with shunt BAW resonators is shown. In a filter, resonators are combined in a 'ladder', wherein each 'rung' or 'stage' comprises two resonators: one in series and the other connected in shunt. With reference to FIG. 14, adding rungs to the ladder, improves the rejection of undesired frequencies, creating a signal with less out-of-band rejection (a steeper skirt) but this is at the expense of insertion loss and greater power consumption. With reference to FIG. 15, another resonator configuration may be a "lattice", which, as shown in FIG. 16 has poorer cutoff but better out-of-band attenuation.

With reference to FIG. 17, the ladder and lattice type circuits may be combined to provide the transmission response shown in FIG. 18.

Figure 62:
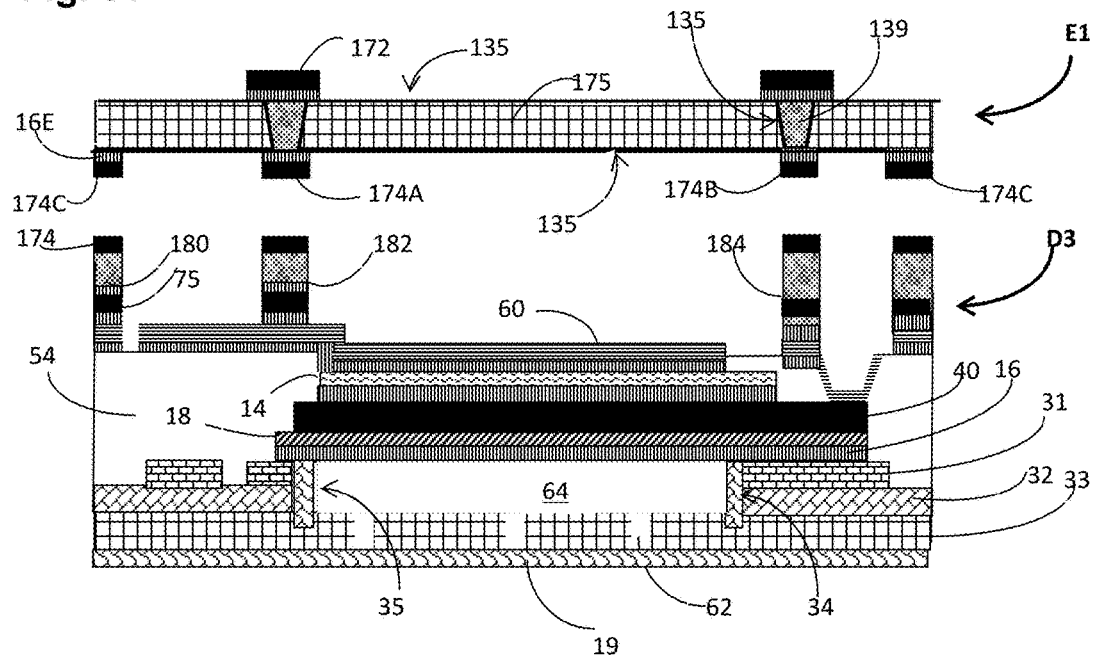
FIG. 62 is a schematic illustration showing a lid with terminations on its outer surface (part of an array aligned over a filter (part of an array) with a seal ring built up around the filter, and contact stacks extending from the upper and lower electrode towards capture pads on the inner surface of the lid.
Figure 63:
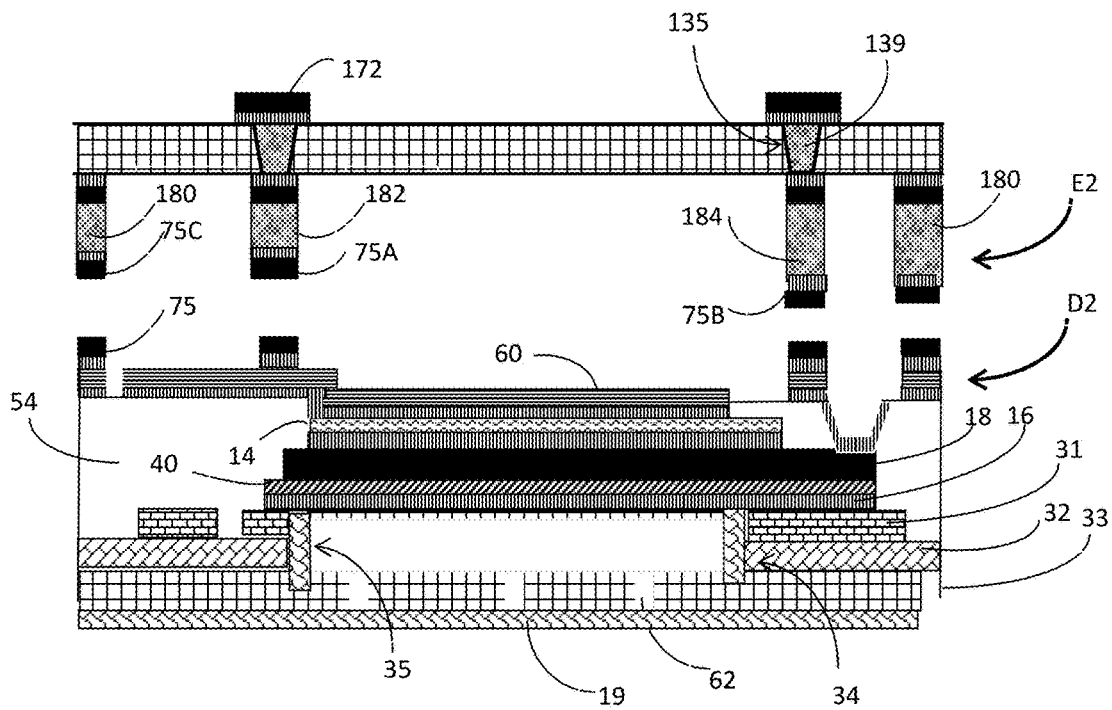
FIG. 63 is a schematic illustration showing a lid with terminations on its outer surface and a seal ring and contact stacks on inner surface of the lid (part of an array aligned over a filter (part of an array)

The possible arrangements of resonators to create filters is beyond the scope of this application, but methods for fabricating resonators that are coupled in series and parallel are discussed hereunder with reference to FIGS. 62 and 63 and this enables arranging the resonators in the various ladder, lattice and combination arrangements.

General Overview

There are different candidate materials for the various components of the filter modules disclosed herein, each requiring an appropriate manufacturing route. Appropriate materials and routes for securely adhering a functional element from a specific material to an adjacent element whilst providing mechanical stability and appropriate conductivity/resistivity are described. Various alternative materials and fabrication methods for each element are provided. Thus a single product and manufacturing route with variant embodiments is described herein.

The subcomponents and elements are now discussed in depth together with flowcharts showing the stages for their construction and schematic images of intermediate structures, detailing processing conditions and alternative materials to provide full enablement to various embodiments.

Because the fabrication method described herein allows single crystal piezoelectric films to be fabricated and the depth of the cavities thereabound to be carefully tailored, with a minimal support membrane thickness between the cavity and electrode (if the support membrane is not removed completely from opposite the piezoelectric film) improved factors of merit (FOM) are expected, particularly when compared to the polycrystalline non-epitaxially grown films currently in use.

It will be appreciated that exact dimensions will vary with both the material and component specification, and typically optimization requires finding a balance between functionality, reliability and cost. Nevertheless, by way of illustrative non-limiting example, typical dimensions for the various subcomponents are also provided.

Having presented a general overview of the construction and method for the FBAR resonator arrays, a generalized overview of how they can be arranged into filters and an overview of the packaging route in FIGS. 1 to 18, each component, process and manufacturing step is now described in more depth, giving different materials options, typical dimensions and so on.

It will be appreciated that parts A and B shown schematically in FIGS. 2 and 3, are independently fabricated, and the first precursors may be commercially available. The subsequent processing leading to the structures shown schematically in FIGS. 2 and 3 may be performed to first fabricate the structure of FIG. 2 and then that of FIG. 3, or FIG. 3 and then FIG. 2. Indeed, some processes such as applying various metal layers 16, 18 may be performed on both the piezoelectric film 14 and the support membrane 31 at the same time within the same processing apparatus, such as a PVD or CVD process.

The membrane on handle 30 (FIG. 1 box A)

Figure 19:
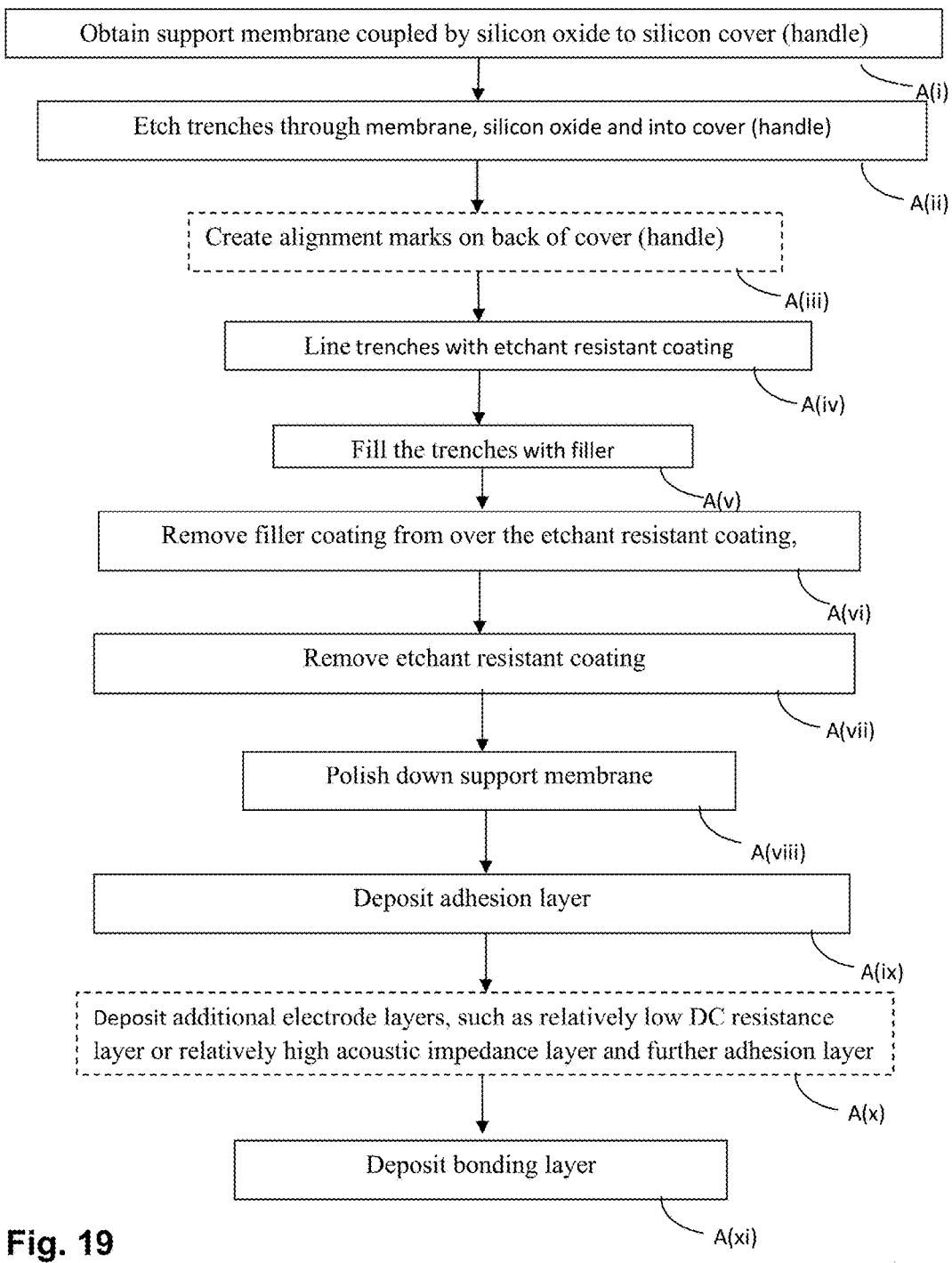
FIG. 19 is a flowchart illustrating a method of fabricating a support membrane with at least one metal layer of a first electrode as described in Block A of FIG. 1.

FIG. 19 is a generalized flowchart of the process for fabricating the First part A described in Block A of FIG. 1 and shown schematically in FIG. 2. FIGS. 20 to 28 are schematic illustrations of the substructures fabricated by the steps of the flowchart of FIG. 19.

Figure 20:
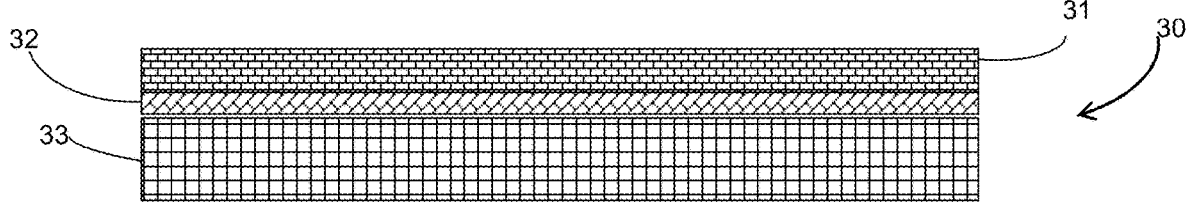
FIGS. 20-28 are schematic illustrations of the various intermediate structures produced by the steps of FIG. 19, in fabricating the structure described in FIG. 1 block A.

With reference to FIG. 1 box A, and to FIG. 20, a membrane on handle 30 consisting of a support membrane 31 over a silicon oxide layer 32 deposited onto a silicon handle 33 is fabricated or commercially obtained—FIG. 19 step A(i).

The support membrane on handle 30, which may be a commercially available product, consists of a single crystal support membrane having a maximum thickness of 1.5 microns that is coupled by a layer of silicon dioxide 32, that is typically about three to six microns (±5%) thick, to a silicon wafer handle 33 that is typically in the range of from 450 microns thick (±5 μm) to 750 μm thick (±15 μm) thick. The support membrane 31 may be a low resistivity silicon, for example, being N type doped with As or P. It is typically <100> or <110> or <111> oriented layer of single crystal and the choice may be influenced by the selected piezoelectric membrane. Due to the doping, the resistivity is typically below 10 Ω-cm. The handle 33 may be P type doped, typically with Boron. The resistivity of the handle 33 is typically much higher, and is typically ≥1000 Ω-cm. Such SOI (support membrane 31 on handle 33) wafers are available in various diameters including of 100 mm, 150 mm and 200 mm.

There are commercially available SOI wafers that that are fabricated by ion slicing using the ion slicing (SMART CUT™ technology) to obtain tight tolerance device layers. Typical tolerances for SMART CUT SOI wafers with a device layer of 500 nm are available with tolerances of better than +/−2.5%, i.e. +/−12.5 nm. Such SOI wafers are available from vendors such as SOITEC (www.soitec.com) or Waferpro™ (www.waferpro.com) and the Si membrane obtained in this way can have variety of resistivities values.

It will be appreciated that starting with a submicron support membrane minimizes subsequent final trimming processes (if required).

Other candidate support membranes 31 include lithium niobate and lithium tantalite, for example. These can be "smart cut" from appropriate single crystals of lithium niobate and lithium tantalate wafers in a process described hereinbelow for fabricating piezoelectric layers.

A spalling method described below with reference to FIGS. 34 and 35 for fabricating piezoelectric films 14 of $LiNbO_3$ and $LiTaO_3$ can similarly be used to fabricate support membranes 31 from $LiNbO_3$ and $LiTaO_3$ that are bonded by a silicon oxide layer 32 to a silicon handle 33.

Figure 21:
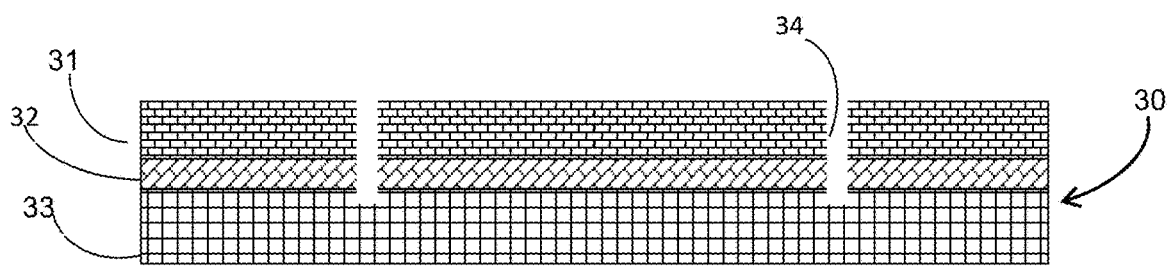

Referring to FIG. 19 Step A(ii), a pattern of trenches 34 is fabricated through the support membrane 31, through the $SiO_2$ BOX 32 and into the silicon handle 33, providing the structure schematically shown in FIG. 21. The trenches 34 are typically 3-6 μm wide but could be as much as 10 μm wide and may be fabricated using an inductive coupled plasma ICP, of, for example, $Cl_2+BCl_3+Ar$, $CF_4+O_2$ or $Cl_2+O_2+Ar$ and $SF_6+O_2$ depending on the membrane material used.

Other fabrication processes are possible. For example, alternatively, the support membrane may be etched by ICP followed by a wet etch of the $SiO_2$ and a further dry etch of Si handle. The trenches 34 may be provided as a closed loop, or anchor points may be left, such as at the vertices between adjacent trenches 34.

Figure 22:
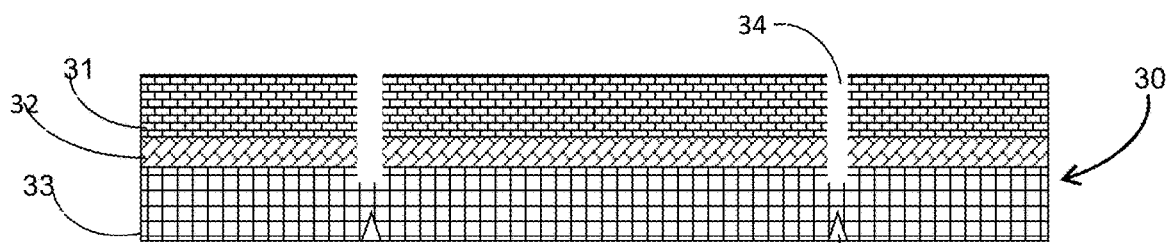

Alignment marks 37 may then be made on the polished back of the handle 33—step A(iii), using either ICP or laser for example, providing the structure of FIG. 22. This step is optional.

Figure 23:
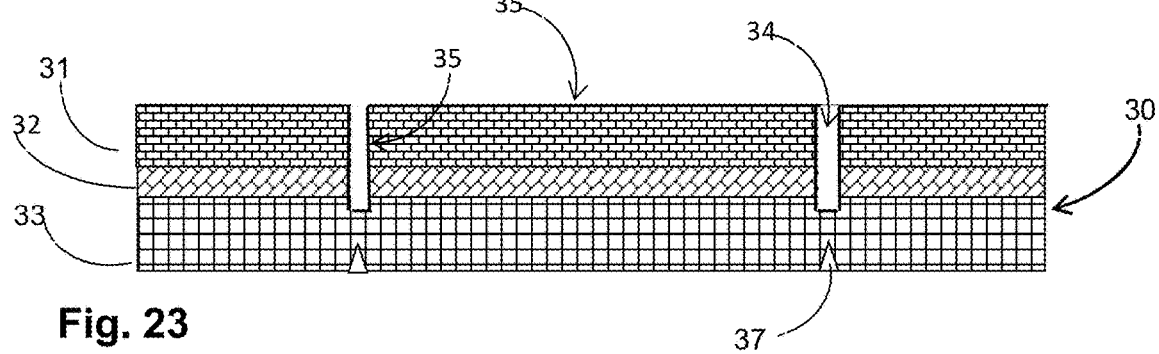

An etch resistant coating 35, such as silicon nitride is then deposited over the support membrane 31 and into the pattern of trenches 34—step A(iv), providing the structure schematically shown in FIG. 23. This may be achieved by Low Pressure Chemical Vapor deposition (LPCVD) for example. The thickness of the etch resistant coating 35 depends on the deposition time and pressure. In general, the desired thickness of the etch resistant coating 35 depends on the etching selectivity of the thermal $SiO_2$ BOX layer 33. Since the selectivity of silicon nitride with a HF vapor etch is typically between 1:20 and 1:30 for a 3 μm thick BOX, if the etch resistant coating 25 is silicon nitride, the thickness will typically be in the range of 1000 A-1500 A, but could be as much as 5000 A for example.

Figure 24:
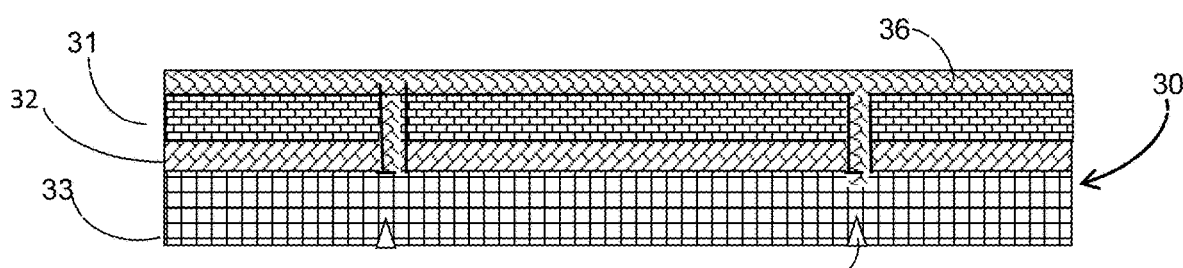

Referring to FIG. 19, step A(v), a layer of filler 36, such as silicon nitride or polysilicon for example, may then be deposited over the etch resistant coating 35 to fill the etch resistant coated trenches 34 providing the structure schematically shown in FIG. 24. The type and thickness of filler 36 depends on the width of the trenches 34. A void free polysilicon fill may be achieved using low pressure chemical vapor deposition (LPCVD and typically requires a 1:1.2 ratio, so a 3 μm trench filled with a polysilicon filler 36 will typically result in a 3.6 μm thick surface coating of the filler 36.

Figure 25:
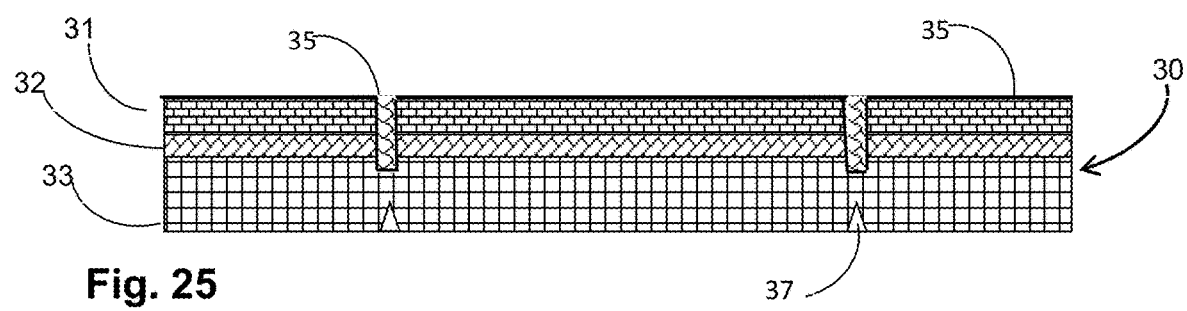

The surface coating of filler 36 is then removed—step A(vi), exposing the etch resistant coating layer 35 but leaving the filler 36 filled, etch resistant coating 35 coated trenches 34, for example, polysilicon filled silicon nitride coated trenches 34 providing the structure schematically shown in FIG. 25. The technique for removal of the filler layer is, of course, material dependent. Where the filler 38 is polysilicon, the filler layer 38 may be removed by etching, using a hot phosphoric acid etch with 85% $H_3PO_4$ at 160° C. This etch does, however, slightly damage the top of the polysilicon filler 36 filling the silicon nitride 35 lined trenches 34. Alternatively, a polysilicon filler 36 layer covering a silicon nitride layer 25 may be removed by CMP with very high selectivity to the silicon nitride layer 35 therebeneath as described in U.S. Pat. No. 7,723,234 "Method for selective CMP of polysilicon" to Suryadevara V. Babu et al. incorporated herein by reference.

Figure 26:
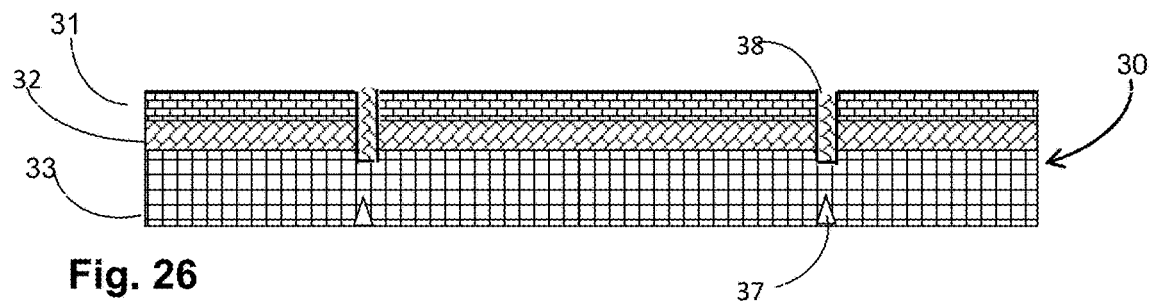

The etch resistant layer 35 is now removed—step A(vii), exposing the support membrane 31, but leaving the filler 36 filled, etch resistant coating, 35, lined trenches 34, providing the structure schematically shown in FIG. 26. The removal of the etch resistant layer 35 from over the surface of the support membrane 31 is typically by plasma etching. For example, a silicon nitride etch resistant layer 35 may be removed using a $CHF_3/O_2$ induction plasma etch at an etch rate of 600-750 Angstroms/minute. Where the support membrane 31 is silicon, this has a 4:1 selectivity with the silicon surface. Another possibility is using a 85% $H_3PO_4$ wet etch at 160° C.

The support membrane 31 may now be polished using chemical mechanical polishing (CMP)—step A(viii) to remove the damaged top of the filler 38 filled, etch resistant coating 35 lined trenches 34 and leaving the structure with an appropriately low surface roughness (smoothness) for following deposition and bonding processes schematically shown in FIG. 26.

Figure 27:
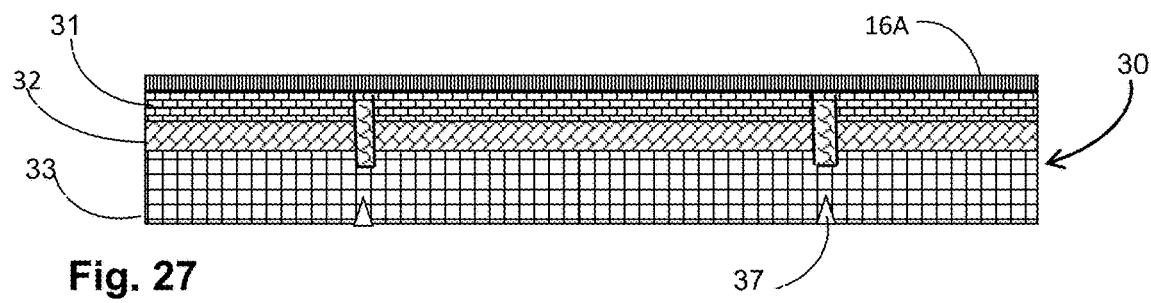

With reference to FIG. 27, a first adhesion layer 16A is then sputtered onto the thinned support membrane 31 to enable subsequent deposition of other layers of the first electrode. The first 16A, and indeed subsequent adhesion layers (16n) are typically titanium, chromium or titanium tungsten.

Figure 28:
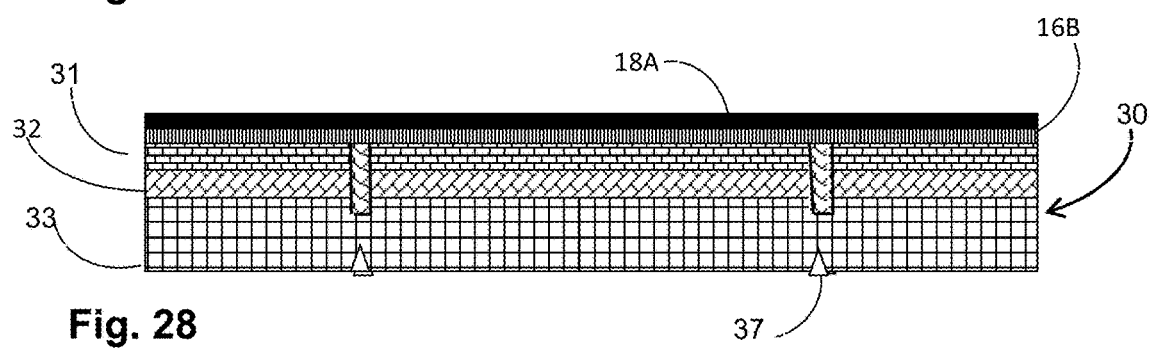

As shown in FIG. 28, a bonding material 18A may then be deposited onto the first adhesion layer 16A. Subsequent electrode materials may then be deposited thereover. To aid good adhesion, adhesion layers 16n are preferably deposited between every pair of disparate materials.

The Piezoelectric Film

There are a very wide range of single crystal piezoelectric materials that have good intrinsic $K^2_{eff}$ and Q factors. The appropriate piezoelectric material for a particular filter is selected in view of the desired frequency response and the general desire to minimize dimensions of the resultant filters, whilst noting that miniaturization complicates manufacturing and may increase cost and lower yield.

With reference to box B of FIG. 1 and to FIG. 3, a piezoelectric film 14 attached to a detachable carrier substrate 10 by a release layer 12, and coated with at least one metal layer of a metal electrode is shown.

The piezoelectric film 14 is preferably and typically single crystal. Whilst it is not inconceivable that some stacking flaws or even occasional grain boundaries may exist in a large film, and even be tolerated for some applications, once the film 14 is patterned into individual resonator membranes, the vast majority of these are typically free from serious flaws, and even if individual components including resonator films having such flaws fail quality control, these can be discarded. In general, high yields are obtained.

Figure 29:
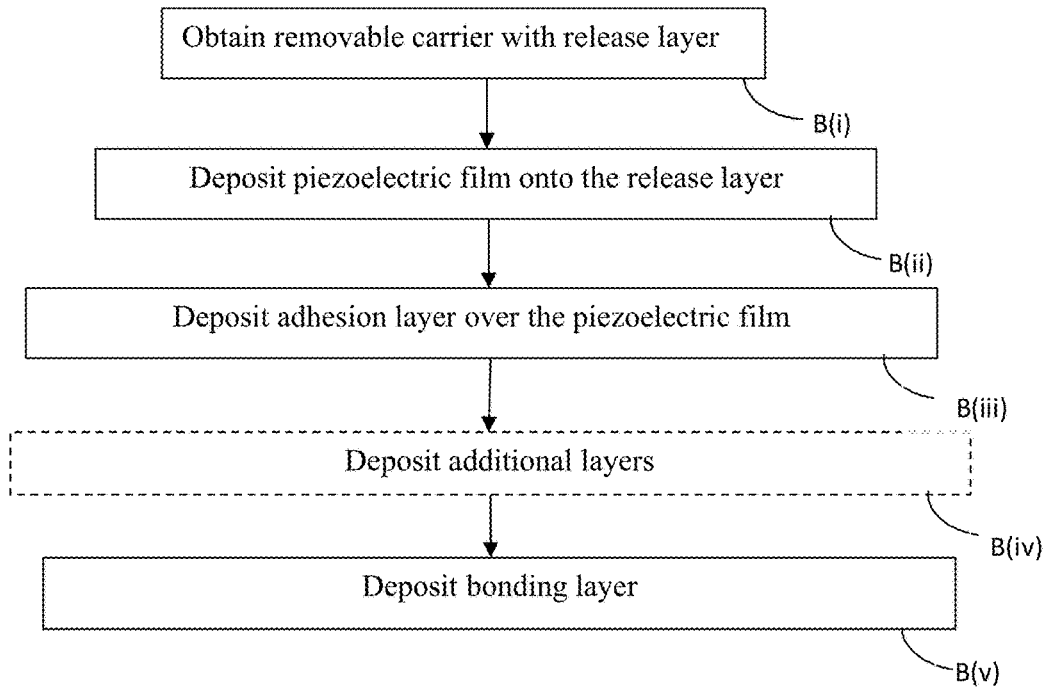
FIG. 29 is a flowchart describing the fabrication of the structure described in FIG. 1 block B.

FIG. 29 is a flowchart showing how the structure of FIG. 3 (i.e. part B described in block B of Fig. A) is obtained and FIGS. 29 to 32 show intermediate substructures fabricated by the steps of the flowchart of FIG. 28, to fabricate the structure of FIG. 3.

With reference to the flowchart of FIG. 29, a method of fabricating the structure of FIG. 3 is now described.

Figure 30:
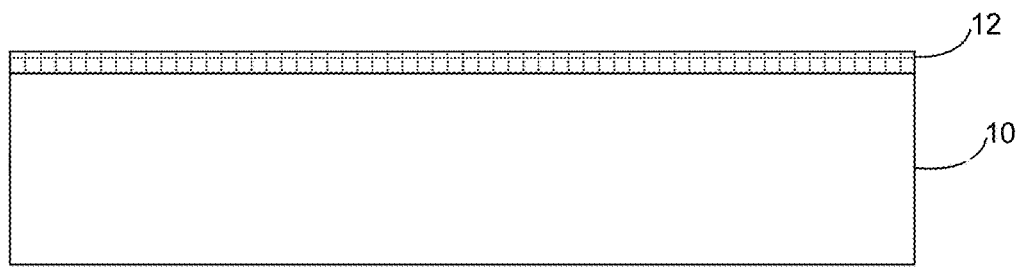
FIGS. 30 to 33 are schematic illustrations of the various intermediate structures produced by the steps of FIG. 29, in fabricating the structure described in FIG. 1 block B where the piezoelectric layer is fabricated by sputtering or PVD.

Firstly a removable carrier 10 with release layer 12 is obtained—step B(i), as shown schematically in FIG. 30. The removable carrier 10 is typically Sapphire and the release layer 12 is typically GaN. Sapphire carriers with GaN release layers are commercially available. Typically the release layer 12 of GaN is about 4 μm to 5 μm thick with an RMS roughness of less than 1 nm.

A piezoelectric film 14 is then deposited onto the release layer—step B(ii):

There are two basic routes for fabricating the piezoelectric membrane:

Growing a piezoelectric membrane by Molecular Beam Epitaxial Growth (MBE) and/or sputtering Spalling from a single crystal.

Growing a Piezoelectric Membrane

Molecular beam epitaxy (MBE) is a high purity low energy deposition technique that allows for low point defect manufacturing. It is possible to control the ratio of the elements ratio to very high accuracy of ±1% and thereby ensure a high Q factor and coupling of the film.

Where there is appropriate lattice matching, the piezoelectric film 14 may be fabricated by Molecular Beam Epitaxy on a bonding layer 12 of GaN over a removable substrate 10 such as sapphire, where the structure of the surface of the sapphire substrate and its lattice spacing enables a single crystal thin film to be deposited thereonto.

The <0001> plane of a removable carrier 10 made from sapphire causes the release layer 12 of GaN deposited thereon to be deposited epitaxially in an <0001> orientation. Since the lattice spacing of <111> plane of tetragonal $Ba_xSr_{(1-x)}TiO_3$ (BST) is compatible with the <0001> plane of the sapphire $Al_2O_3$ single crystal, $Ba_xSr_{(1-x)}TiO_3$ where x<0.5, in a <111> orientation may be epitaxially grown thereover using oxide Molecular Beam Epitaxy (MBE).

AlN and $Al_xGa_{(1-x)}N$ and $Sc_xAl_{(1-x)}N$ are HCP type Wurtzite crystal structures (C plane orientation). A strong C axis texture is the most important prerequisite for AlN, $Al_xGa_{(1-x)}N$ and $Sc_xAl_{(1-x)}N$ FBAR filters because the acoustic mode of the FBAR needs to be longitudinally activated and the piezoelectric axis of AlN and $Al_xGa_{(1-x)}N$ is along the c-axis. The addition of gallium or scandium to the AlN lattice can increase the coupling coefficient for wider band resonators while keeping good lattice match to the epitaxial GaN release layer.

Thus AlN, $Al_xGa_{(1-x)}N$ in a C-Axis orientation where x>0.85, and $Sc_xAl_{(1-x)}N$ in C-Axis orientation where 0.05<x<0.25 may similarly be deposited epitaxially onto a GaN release layer 12 epitaxially grown onto a sapphire substrate 10. These materials may also be deposited by sputtering, by molecular beam epitaxy, by MOCVD or by depositing a layer using |Molecular Beam Epitaxy followed by sputtering.

Typical coating thicknesses of the piezoelectric film 14 are between 100 nm and 1500 nm and by way of non-limiting example, may be between 200 nm and 400 nm in the case of $Ba_xSr_{(1-x)}TiO_3$ (BST) and in the range of from 200 nm to 1500 nm in the case of AlN, $Al_xGa_{(1-x)}N$ or $Sc_xAl_{(1-x)}N$.

Such epitaxially grown piezoelectric films of $Ba_xSr_{(1-x)}TiO_3$ (BST), $Al_xGa_{(1-x)}N$, $Sc_xAl_{(1-x)}N$ and AlN may have a RMS roughness of less than 1 nm, which further assists wafer to wafer film bonding for transferring the piezo layer from the donor to receiving wafer.

Since there are no grain boundaries in a single crystal, the attenuation of an acoustic signal passed through the single crystal is minimal. This also minimizes the lost energy that is otherwise transferred into heat and which has to be dissipated.

The low surface roughness of the single crystal or at least strongly textured $Ba_xSr_{(1-x)}TiO_3$ (BST), AlN, $Al_xGa_{(1-x)}N$ and $Sc_xAl_{(1-x)}N$ films also results in reduced scattering loss and higher Q-factors. Furthermore, rough surfaces, especially at high frequencies, are a major cause of the loss of the metal electrodes interfaces because of a skin effect. The smooth interfaces obtainable between the electrode and the piezoelectric film in highly textured and single crystal films with both upper and lower electrodes deposited thereupon are thus extremely advantageous.

Figure 31:
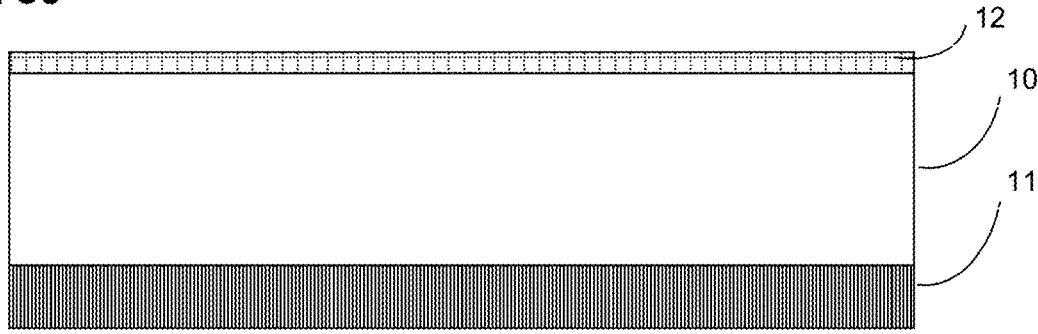

As shown in FIG. 31, a heat dissipating layer 11 of titanium may be deposited onto the back surface of the carrier 10. This helps the even deposition of the piezoelectric film 14 in Step B(ii) of FIG. 29, and as shown in FIG. 32.

Figure 32:
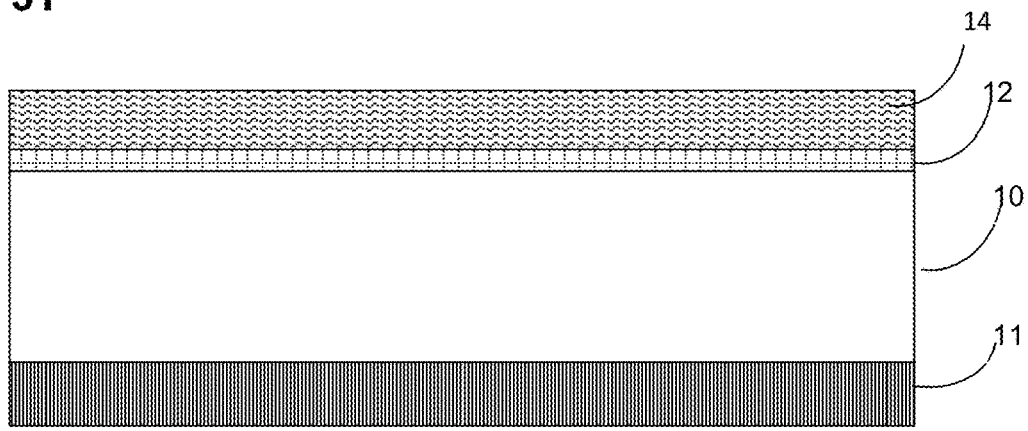

The piezoelectric film 14 is deposited—step B(ii) shown in FIG. 32. However, with reference to FIG. 33, optionally additional intermediate buffer layers 13, may be applied onto the release layer 12 to ensure good crystal lattice matching before deposition of the piezoelectric. For example, to facilitate deposition of a single crystal piezoelectric film 14 of $Ba_xSr_{(1-x)}TiO_3$ (BST), an intermediate buffer layer 13 of rutile $TiO_2$ and/or $SrTiO_3$ may first be deposited. In addition to serving as an "alignment lattice" layer, this intermediate layer 13 may also serve as an etch stop layer once the Sapphire layer is removed, to make it easier to etch away the GaN layer. Similarly, prior to depositing AlN, $Al_xGa_{1-x}N$, $Sc_xAl_{1-x}N$, a 50 nanometer to 200 nanometers thick intermediate layer 13 of $Ta_2N$ or similar rare earth nitride materials, such as $RaN_x$, $NbN_x$, $MoN_x$ and $WN_x$, may be deposited, to serve as a buffer and etch stop layer.

Creating a Piezoelectric Membrane by Spalling from a Single Crystal

There are useful candidate materials for the piezoelectric films 14 which cannot be deposited onto a sapphire substrate 10 by sputtering or MBE due to their lattice spacing incompatibility. By way of example, two such materials are $LiNbO_3$ and $LiTaO_3$ which are, however, both available as single crystals, and have extremely high Q and coupling coefficient values.

Figure 34:
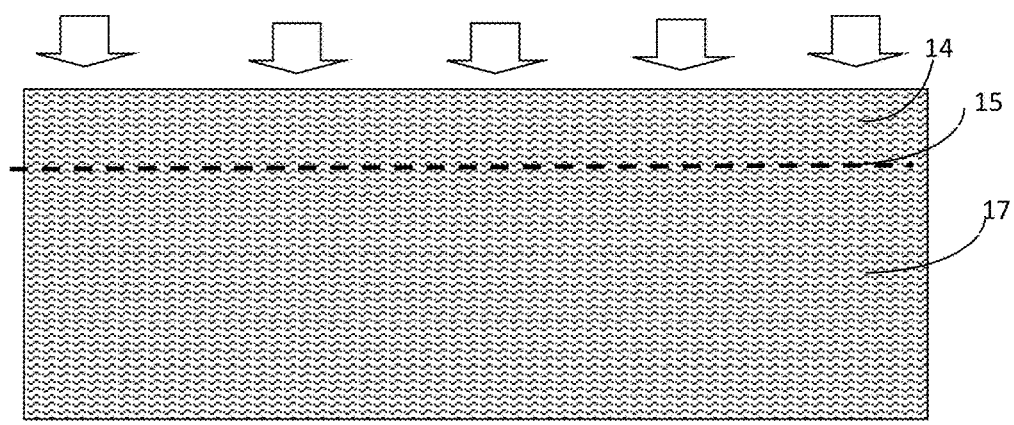
FIG. 34-36 are schematic illustrations of the various intermediate structures produced by the steps of FIG. 29, in fabricating the structure described in FIG. 1 block B where the piezoelectric layer is fabricated by spalling from a single crystal.

With reference to FIG. 34, a single crystal or single crystal wafer of such a piezoelectric material 17 having an appropriate orientation for forming a piezoelectric film 14 for a resonator may be obtained, and the surface thereof may be subjected to ion bombardment with an appropriate ion at an appropriate intensity to cause a weakness 15 at a desired depth. For example, single crystals 17 of $LiNbO_3$ in YX1/36 orientation or $LiTaO_3$ in YX1/42 orientation may be bombarded with helium in $He/cm^2$ doses and energies between 50 and 250 keV. This creates a weakened layer 15 below the surface of up to 1 um. A bonding layer 13A such as a 100 to 1000 nanometer thick $SiO_2$ layer may then be deposited by PECVD onto the surface of the spalled off piezoelectric film 14 and a similar bonding layer 13B of silicon oxide may be deposited onto the release layer 12 of a support wafer 10, such as a GaN coated sapphire support wafer such as that shown in FIG. 30. The two $SiO_2$ bonding layers 13A, 13B are then polished using chemical mechanical polishing (CMP), and brought into contact which causes them to bond. The resultant structure is shown in FIG. 35.

Figure 35:
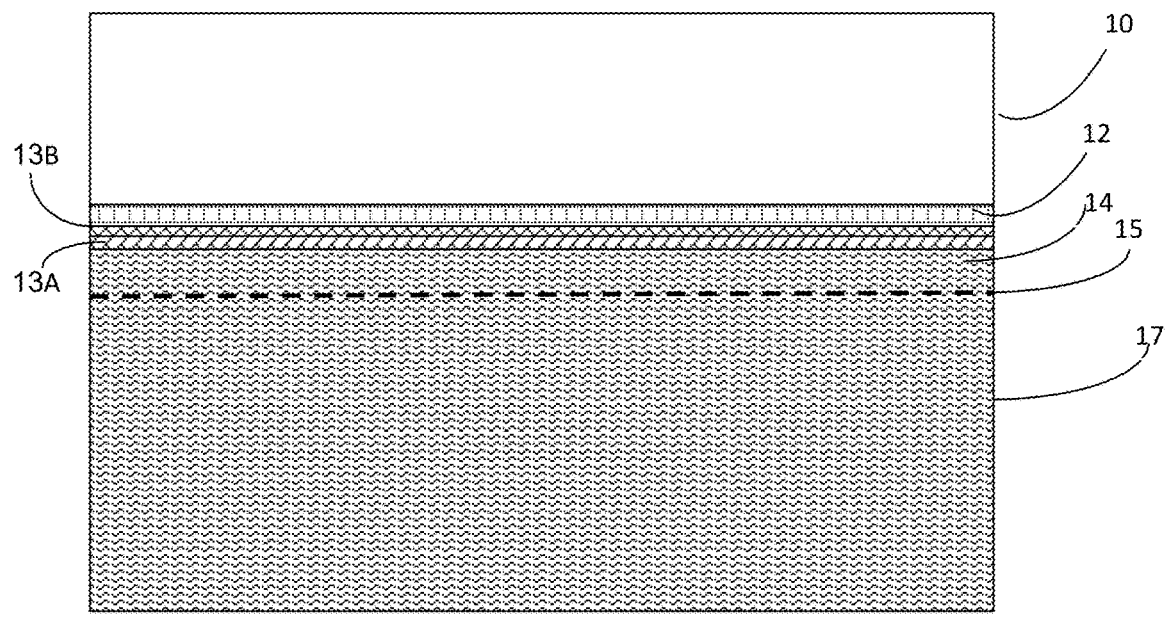

Subjecting the structure shown in FIG. 35 to temperatures of about 350° C. causes the single crystal surface film 14 above the layer 15 weakened by the Helium bombardment to spall away, with the crystal 17 fracturing at the depth of the Helium bombardment. The exposed surface layer of the piezoelectric film 14 that flakes off the bulk single crystal 17 may then be polished to remove damage, and annealed at say, 400° C. if necessary, to cause atomic rearrangement.

Figure 33:
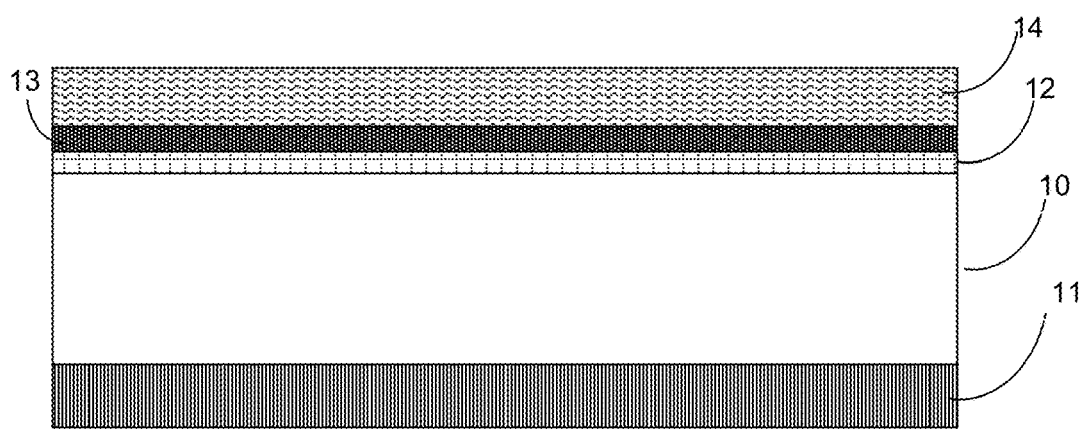

Once again, the resultant structure is essentially that of FIG. 33 (albeit, typically without the heat dissipation layer 11), where buffer layer 13 is $SiO_2$, for example, and the piezoelectric film 14 comprises piezoelectric material that may be grown as a single crystal, such as $LiNbO_3$ and $LiTaO_3$ for example.

Thus regardless of whether the piezoelectric film 14 is epitaxially grown or fabricated by spalling from a single crystal 17, the resultant structure in both cases is a piezoelectric film 14 of desired orientation, coupled to a sapphire substrate 10 by a GaN 12 layer as shown in FIG. 3, possibly with the addition of a buffer layer 13 of rutile $TiO_2$ and/or $SrTiO_3$, $Ta_2N$ or a similar rare earth nitride material, or of $SiO_2$ between the release layer of 12 GaN and the piezoelectric film 14.

Furthermore, it will be appreciated that the spalling method can be used to fabricate support membranes 31 of $LiNbO_3$ and $LiTaO_3$ attached to a silicon handle 33 by a silicon dioxide box 32 as described above and shown in FIG. 2.

For it to function as a resonator, the piezoelectric film 14 needs to supported around its edge, and an electrode applied to each side.

In general, the first electrode is a multilayer electrode formed by depositing some of the metal layers 16A, 18A onto a support membrane 30 described hereinabove, and other metal layers 16B, 40 16C, 18B onto the piezoelectric film 14. The two bonding layers 18A, 18B are fabricated from the same material and are very smooth so may easily be bonded together.

Figure 36:
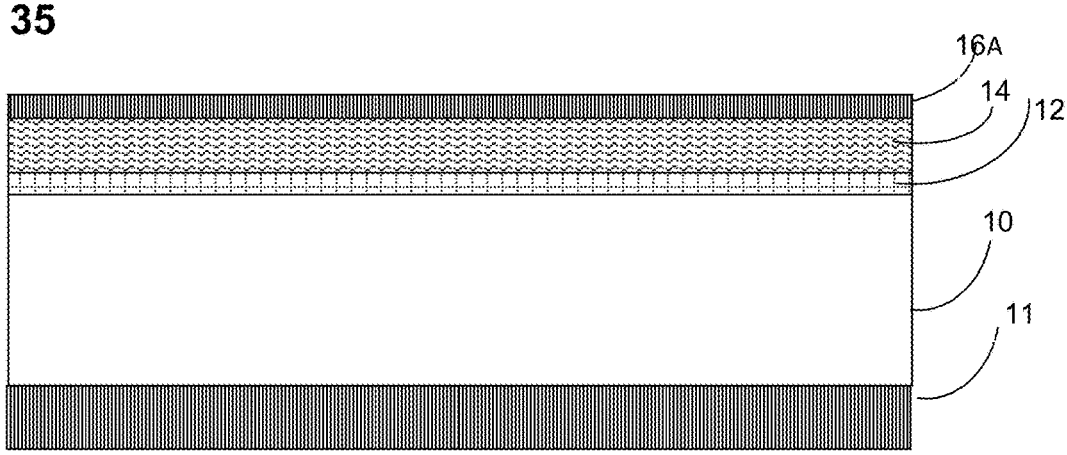

With reference to FIG. 29 step B(iii) and to FIG. 36, a first adhesion layer 16A typically of titanium, but possibly of chromium or titanium-tungsten is applied to the piezoelectric film 14. This may be followed by subsequent layers— FIG. 29 step B(iv), with usually subsequent adhesion layers 16C, 16D, etc. of titanium but possibly of chromium or titanium tungsten between every adjacent pair of layers to aid adhesion. Usefully a layer 40 of low DC resistance layer such as aluminum or gold and/or a high acoustic impedance layer such as tungsten, molybdenum or titanium-tungsten may be deposited. Where titanium-tungsten is chosen (typically at ratios between 5:95 and 10:90), the electrode layer does not need an adhesion layer as the electrode and adhesion layer are made of identical materials.

The adhesion layer 16C typically has a thickness range of 5 to 50 nanometers and the additional layer 40 of W, Mo, Al or Au typically has a thickness ranging from 50 nanometers to 150 nanometers depending on the desired resonator or filter frequency response.

Figure 37:
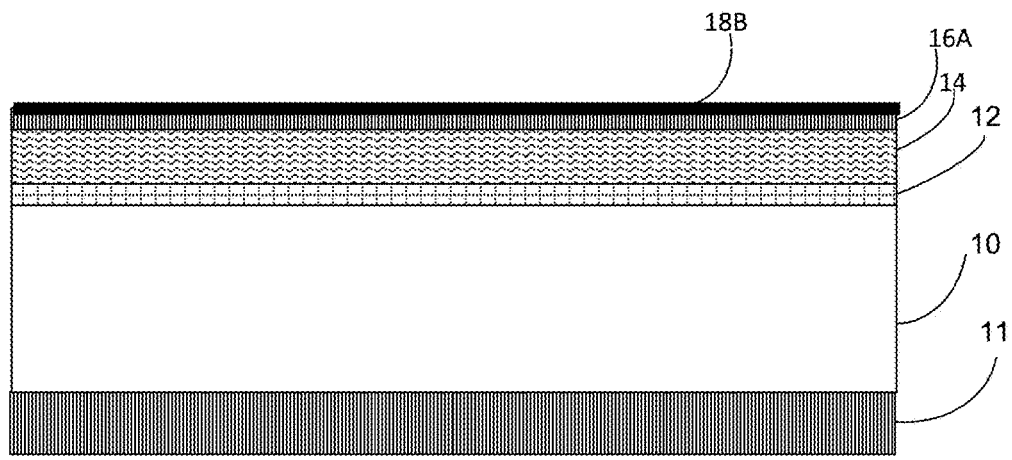
FIG. 37 is a schematic representation of the structure fabricated by the process of FIG. 29 to and described in FIG. 1 block B.

With reference to FIG. 27, step B(v) and to FIG. 37, the outermost layer of the stack is typically a conductive bonding layer 18B Because the underlying layers are very smooth, the selected conductive bonding layer 18B may be bonded to an identical bonding layer 18A that is the outermost layer deposited onto a membrane on handle structure 30 described in FIG. 1 box 2, one embodiment of which is shown schematically in FIG. 2, and described above with reference to FIGS. 18-28.

The First Electrode

Typically, in prior art resonators, a first electrode is first deposited and then the piezoelectric film is deposited thereon. Consequently, due to the high temperature fabrication of the piezoelectric film, refractory metals such as molybdenum, tungsten, platinum or gold are traditionally required for the first electrode. In contradistinction to typical processing routes, in the embodiments and process described herein, both the first electrode and the second electrodes 60 are deposited onto the piezoelectric film 14, so a wider range of metals may be used, such as aluminum for example. It will be appreciated that aluminum has a relatively low DC resistance when compared to these refractory metals, and thus using aluminum electrode layers is expected to increase the Q factor of the filter at higher frequencies.

In general, the first electrode is fabricated in two parts. A first part is formed by depositing some metal layers 16A, (40, 16C) 18A onto a support membrane 31 (steps A(ix) and A(x) of FIG. 19), and the second part is formed partly by depositing metal layers 16B, (40, 16C), 18B, onto the piezoelectric film 14 (steps B(iii) to B(v) of FIG. 27). Since the outer layers 18A, 18B of both parts A (FIG. 2) and B (FIG. 3) are bonding layers 18A, 18B, which are fabricated by identical material and are very smooth on a nanometer scale, the two bonding layers 18A, 18B may be brought into contact and bond together at low temperatures, typically at room temperature.

With reference to FIG. 19 step A(ix) and to FIG. 26, a first adhesion layer 16A, typically of titanium, but possibly chromium or titanium-tungsten is applied to the support substrate 31. This may be followed by subsequent layers— FIG. 19 step A(x), with usually subsequent adhesion layers 16 deposited between every adjacent pair of layers of different materials to aid adhesion. With reference to FIG. 19 step A(xi) and to FIG. 28, the outermost layer of the stack is typically a conductive bonding layer 18A With reference to FIG. 29, An adhesion layer 16B, typically titanium, but possibly chromium or titanium-tungsten for example, is also deposited over the piezoelectric film 14—step B(iii), creating the structure of FIG. 36.

Optionally, additional electrode layers 16C, 40 may be deposited—step B(iv). For example, a low DC resistance layer such as aluminum or gold and/or a high acoustic impedance layer such as tungsten, molybdenum or titanium-tungsten may be deposited.

The adhesion layer 16C typically has a thickness range of 5 to 50 nanometers and the additional layer 40 of W, TiW, Mo, Al or Au typically has a thickness ranging from 50 nanometers to 150 nanometers—depending on the desired resonator or filter frequency response.

Then, with reference to FIG. 37, the outer layer of the stack deposited over the piezoelectric film 14 is a bonding layer 18B—FIG. 29 step B(v), to bond to a similar bond layer 18A deposited over the support membrane 31 (see FIGS. 19, 29).

Stage C of FIG. 1 is now performed, bonding the structures of Stages A and B, i.e. the structures of FIGS. 28 and 37 together.

Figure 38:
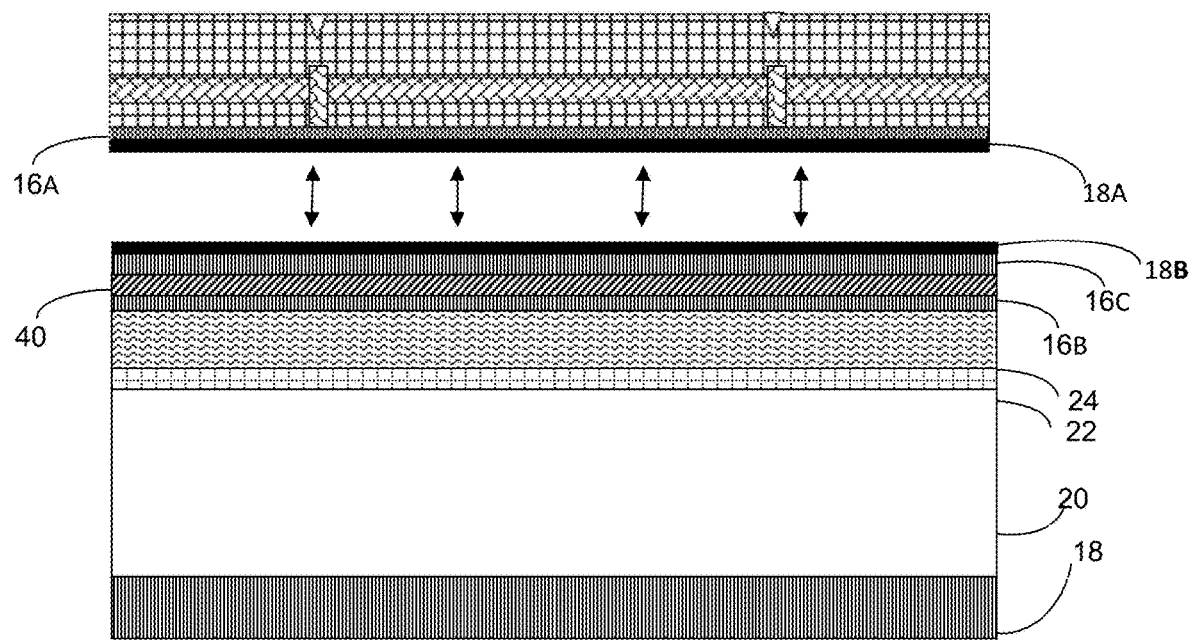
FIG. 38 is a schematic representation the structure of FIG. 1 Block A flipped over and aligned with the structure of block B.

With reference to FIG. 38, the structure of FIG. 28 is flipped over and the two identical bonding layers 18A, 18B on the electrode layer stack over the support membrane 31 and that on the electrode layer stack on the piezoelectric film 14 are brought into contact, under bonding conditions.

Because the underlying layers are very smooth, the selected conductive bonding layer 18A on the piezoelectric film 14 may be bonded to an identical bonding layer 18b that is the outermost layer of a membrane 31 on handle 33 structure described in FIG. 1 box C, one embodiment of which is shown schematically in FIG. 37.

The bonding layers 18A, 18B may be pure gold and may be 10 to 25 nm thick, so that when fused together, a bonding layer 18 that is 20 to 50 nm thick results. Other candidate materials for bonding metal to metal by fusing include AuIn, AuSn or even Cu—Cu. The coatings may be activated by plasma.

Alternatively (not shown) the electrodes may be Titanium-tungsten 10/90 or 5/95, tungsten, molybdenum or aluminum, with a surface roughness of less than 0.5 nm (possibly following CMP), which may be plasma activated and bonded.

It will be appreciated that intermediate layers 40 of the first electrode may be deposited prior to the bond layer 18 onto either the patterned support membrane 31, or onto the piezoelectric film 14. Thus additional layers 40 such as low DC resistance layers of aluminum for example, and/or high acoustic impedance layers such as tungsten, titanium-tungsten or molybdenum may be deposited the onto the structure of FIG. 36 prior to depositing the bonding layer 18B shown in FIG. 37 which gives the structure of FIG. 38. Alternatively, the additional layer 40 could be deposited onto the structure of FIG. 27 followed by a further adhesive layer 16 and then the bonding layer 18A of FIG. 28, providing the structure shown in FIG. 39 once the two bonding layers are brought into contact, It is advisable that adhesion layers thicknesses and different material interfaces should be reduced to minimum and that the bonding layer thickness 18 should be as thin as possible in order to enhance the filter's FOM.

Figure 39:
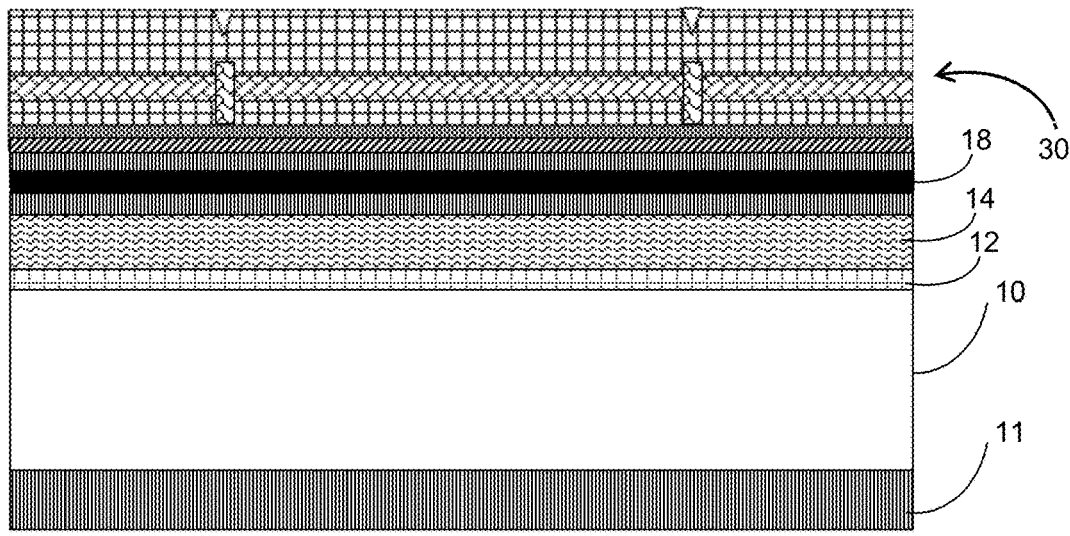
FIG. 39 is a schematic representation the structure of FIG. 1 Block C formed by coupling the structure of block A to that of B.

The structure shown in FIG. 39, i.e. the stack consisting of the handle 33, oxide box 32, support membrane 31, multilayer lower electrode 16A, (40, 16), 18 (16, 40) 16B, and piezoelectric film 14 joined by release layer 12 to the carrier 10 is then processed from both the handle 33 side and from the piezoelectric film 14 side.

Processing the Bonded Stack from Support Carrier Side

Figure 40:
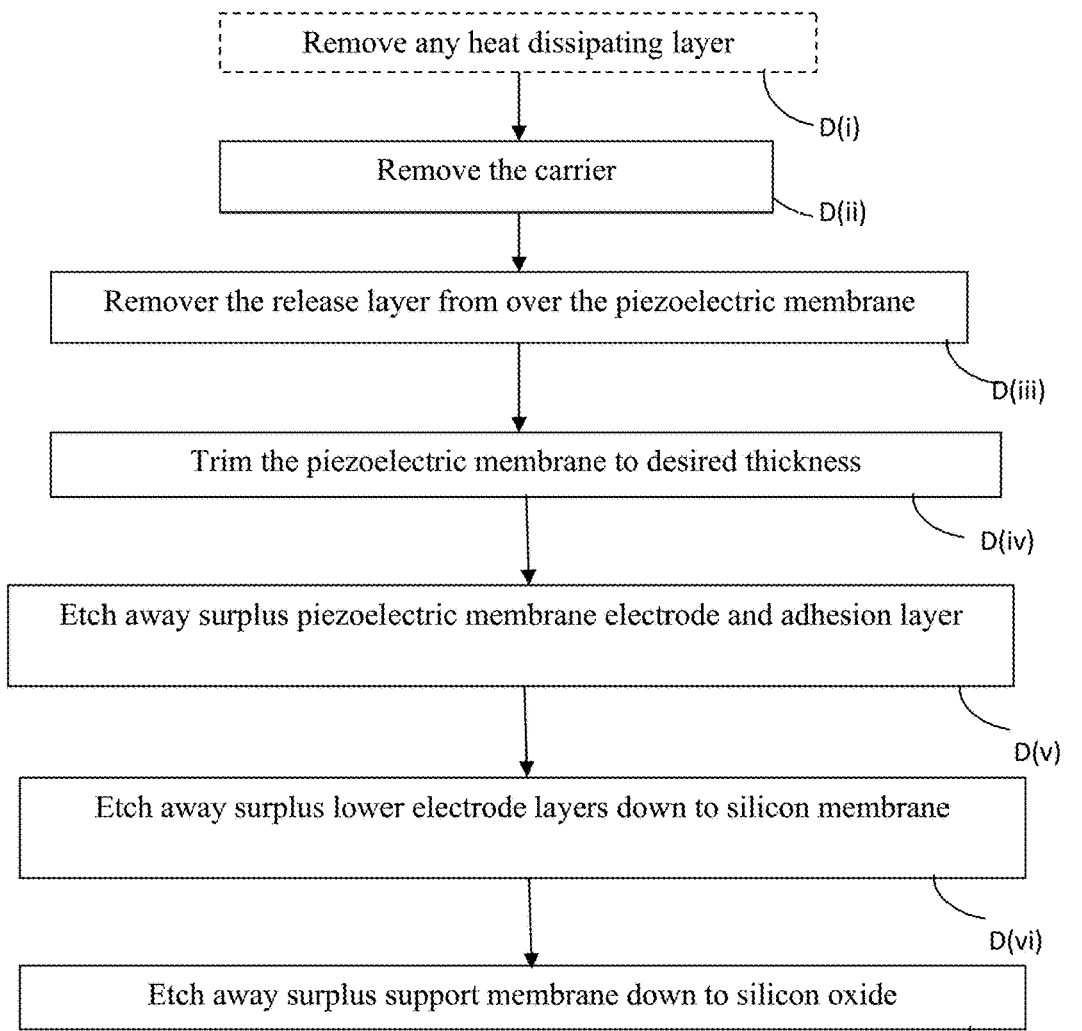
FIG. 40 is a flowchart showing how the structure of FIG. 39 is processed from the piezoelectric layer side (Block D1 by removing layers)

FIG. 40 is a flowchart showing the processing from the sacrificial carrier side (FIG. 1 block D). The intermediate structures thus fabricated are schematically shown in FIGS. 41 to 47.

Figure 41:
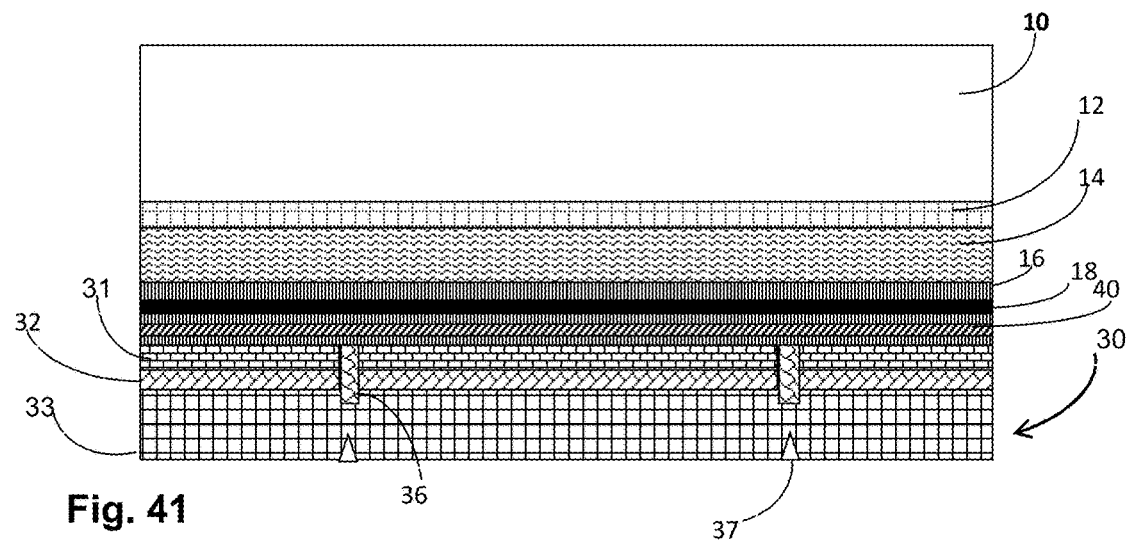
Figure 42:
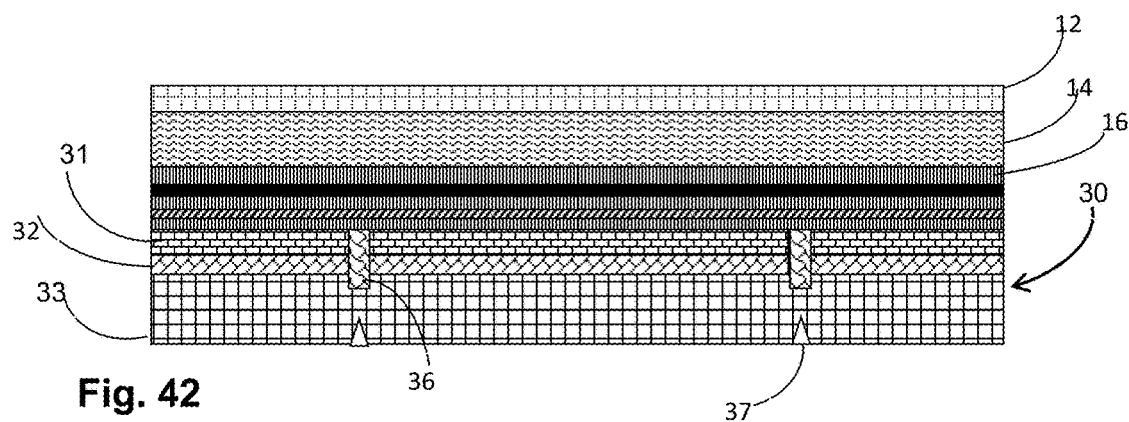

With reference to FIG. 40 step D(i), firstly any heat disbursing layer 11 (shown in FIG. 39) is removed—giving the structure of FIG. 41 which is based on the structure of FIG. 39 flipped over.

Then the carrier 10 is removed—FIG. 40 step D(ii). A sapphire carrier coupled to the piezoelectric film 14 by a GaN release layer 12 may be removed by laser lift off for example. Essentially, the GaN release layer 12 may be irradiated through the sapphire substrate 10 using a 248 nm excimer laser to disassociate the GaN enabling lift off of the sapphire substrate 10. Such a pulsed laser, with a square waveform is available from IPG Photonics™. This process is known as laser lift off and results in the structure shown schematically in FIG. 42.

Figure 43:
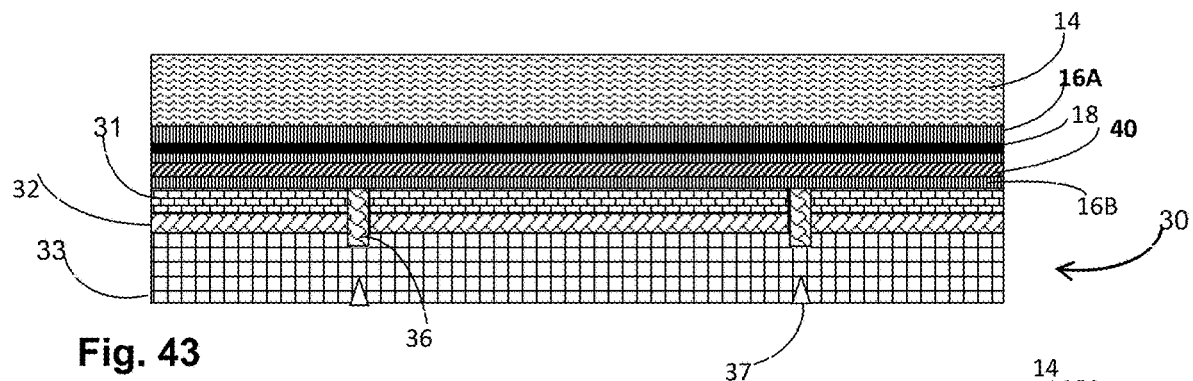

Residual release layer 12 and any additional coatings 13, such as bonding layers of rutile $TiO_2$ and/or $SrTiO_3$, $Ta_2N$, other rare earth nitride materials, or of $SiO_2$ between the release layer of 12 of GaN and the piezoelectric membrane 10 are removed—step D(iii) to expose the piezoelectric film 14, giving the structure of FIG. 43.

Figure 44:
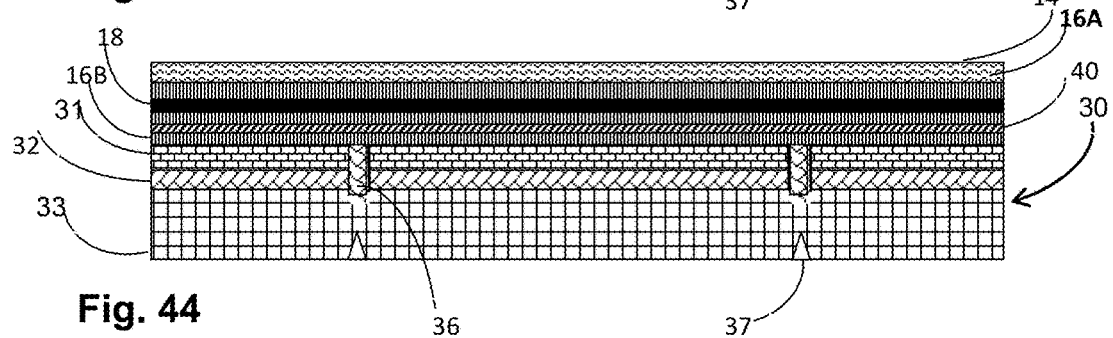

The piezoelectric film 14 is then trimmed to desired thickness—step D(iv) giving the structure schematically shown in FIG. 44.

It is a particular feature of some embodiments that different thickness trimming of specific piezoelectric membranes of a filter array is facilitated, enabling specific resonators within a filter to have different thicknesses to obtain a wider band filter ($K^2_{eff}$).

With reference to FIG. 40 Step D(v), surplus piezoelectric film 14 and adhesion layer 16B are etched away, giving the structure shown schematically in FIG. 45. The bonding layer 18, other first electrode layers 40 and adhesion layers 16A, 16C, are then removed down to the support membrane 31—step D(vi) to leave islands of piezoelectric film 14A on the layers of first electrode 16A, 40, 16C, 18 giving the structure schematically shown in FIG. 46.

Referring back to FIG. 1, the processing may continue from the piezoelectric side (blocks D2 and D3, E and F, or from the handle side Block G, with the process steps of block G1 and possibly G2 occurring prior to some or all of blocks D, E and F.

Applying Upper Electrode

Somewhat, arbitrarily, the processing is described from the piezoelectric film 14 side, and so to explain how the upper electrode is fabricated Block D2 of FIG. 1 is now expanded upon with reference to FIGS. 48-51.

Figure 49:
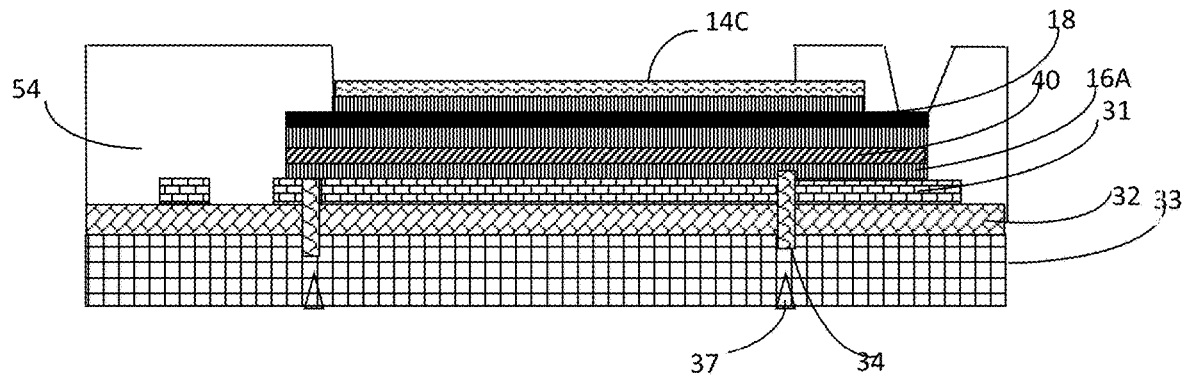
FIG. 49-51 are schematic illustrations showing the structures resulting from the steps of the flowchart of FIG. 48.

With reference to FIG. 48 step D(viii) and to FIG. 49, a passivation material 54 such as $SiO_2$, Silicon nitride, $Ta_2O_5$, polyimide or Benzocyclobutene (BCB) is applied over the exposed $SiO_2$ and support membrane 31, covering the lower electrode layers 16A-C, 18, 40 and the edge of the thinned piezoelectric resonator film 14C.

Figure 50:
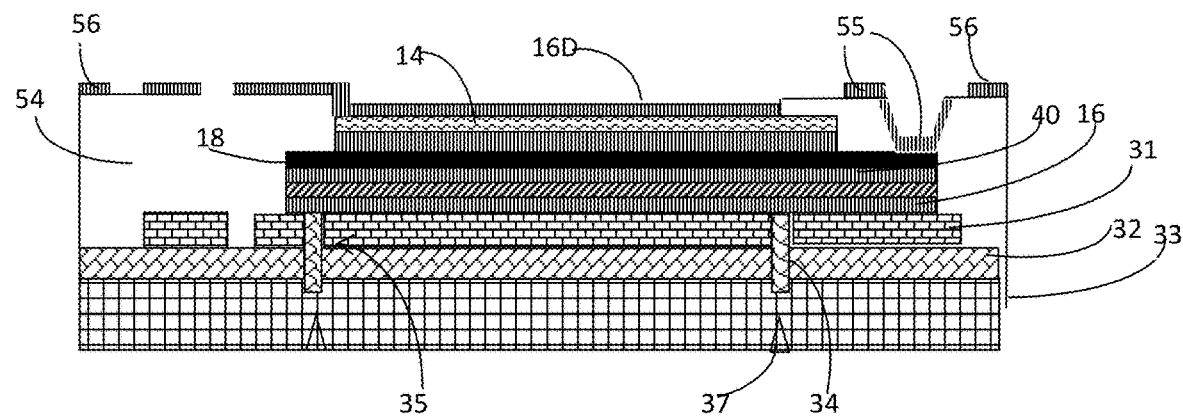

With reference to FIG. 48 step D(ix), an upper electrode 60 is then applied. Typically, as shown in FIG. 50, first an adhesion layer 16D such as a titanium, chromium or titanium-tungsten layer that may be as little as 5 nm thick, but could be as much as 50 nm that is selectively deposited onto the piezoelectric film 14 and onto the passivation material 54 to form a contact 55 coupled to the bottom electrode for each resonator stack but isolated from the exposed piezoelectric film 14, and a contact 56 for a seal ring around each filter.

Figure 51:
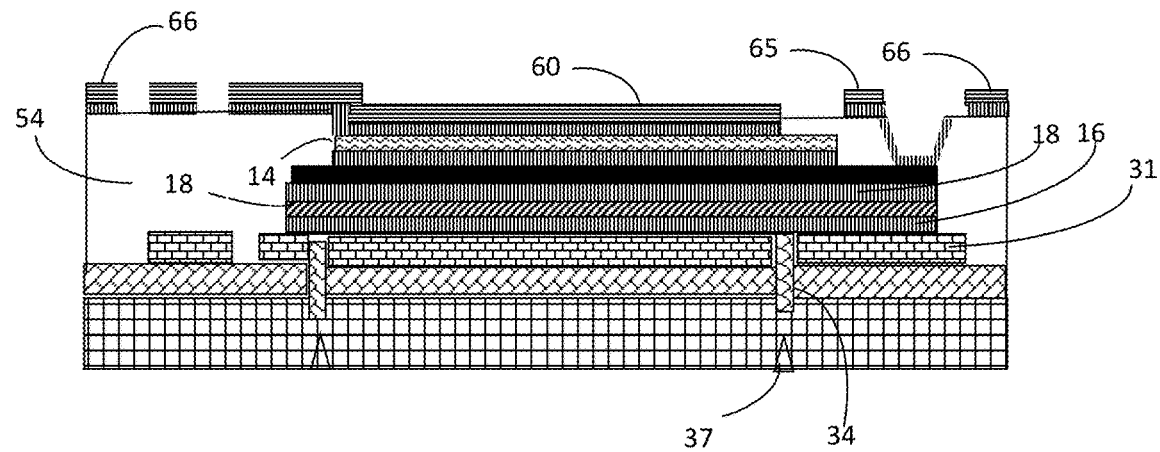

Then, with reference to FIG. 48 step D(x), an upper electrode layer 60 consisting of aluminum, gold, molybdenum or tungsten electrode layer and having a thickness of, say, 50 nm to 150 nm, depending on the thickness of the piezoelectric film and the desired resonance frequency, is selectively deposited over the adhesion layer 16D, giving the structure shown schematically in FIG. 51.

Although described for depositing aluminum, gold, molybdenum, tungsten or titanium-tungsten onto piezoelectric materials such as $Ba_xSr_{(1-x)}TiO_3$ (BST), $Al_xGa_{(1-x)}N$ or $Sc_{(1-x)}Al_xN$, AlN, $LiNbO_3$ and $LiTaO_3$ it will be appreciated that PVD or CVD with otherwise, low density, high conductivity electrode materials over different piezoelectric layers 14 may be used with the same method. For example, carbon nano-tubes (CNT) over single crystal piezoelectric layers may be considered. Nevertheless, typically it is desired to keep the top electrode material of the same type (and thickness) as the bottom electrode.

Both the adhesion layer 16D and the subsequent electrode layer 60 may be deposited by sputtering, for example and patterned through a photo-resist lift off process.

Contacts Through Cap Packaging Route

The top and bottom electrode can be accessed through the membrane and handle, but for ease of manufacture, reliability and to minimize wastage, it is considered preferable to access the electrodes through a cap or lid applied over and around the second electrodes of each filter to create a cavity over each filter that is shared by the resonators of the filter. Contacts are extended from the first and second electrodes to contact pads on the outer surface of such lids. Process routes for so doing are discussed below.

Creating a Seal Ring

A seal ring may be built up around the perimeter of each filter array, with contacts extended from the upper and lower electrodes. The seal rings and contacts are coupled to an array of lids described below.

How the seal ring may be built up is now discussed. The seal ring stands on the passivation layer 54 and is electrically disconnected from the top and bottom electrodes but contacts extending from the upper and lower electrodes are in electrical communication with external contact pads on the outer surface of the cap.

It should be noted that in some filter designs not shown or discussed in detail herein, the seal ring may be connected to the ground planes of the filter, thereby assisting in cancelling parasitic capacitances between the RF input to outputs and 'grounding' these parasitic capacitances so they can be dealt by inductors outside the filter chip itself.

Referring back to FIGS. 50 and 51, the base of the contacts and seal ring is created by patterning the adhesion layer 16D to contact the lower electrode 18 so that it includes an adhesive layer contact 55 coupled to the lower electrode 18 that is isolated from the piezoelectric film 14 and the rest of the upper adhesion layer 16D deposited thereover. An adhesive layer base of the contact seal ring 56 is also formed around each filter array on the wafer, and can be seen at left and right edges of the section shown in FIG. 50. The contacts 55, 56 are cofabricated with the adhesion layer 16D and so step D(ix) given in FIG. 48 uses the term 'selectively'. The adhesion layer 16D and contacts 55, 56 are typically titanium, chromium or titanium-tungsten.

When depositing the upper electrode 60 over the adhesion layer 16D, contact pads 65, 66 are deposited over the contacts 55, 56. Thus, step D(x) given in FIG. 48, also uses the term 'selectively' and FIG. 51 shows the contact pads 65, 66. The second electrode 60 and the contact pads 65, 66 are typically fabricated from aluminum, molybdenum, tungsten or titanium-tungsten.

Figure 52:
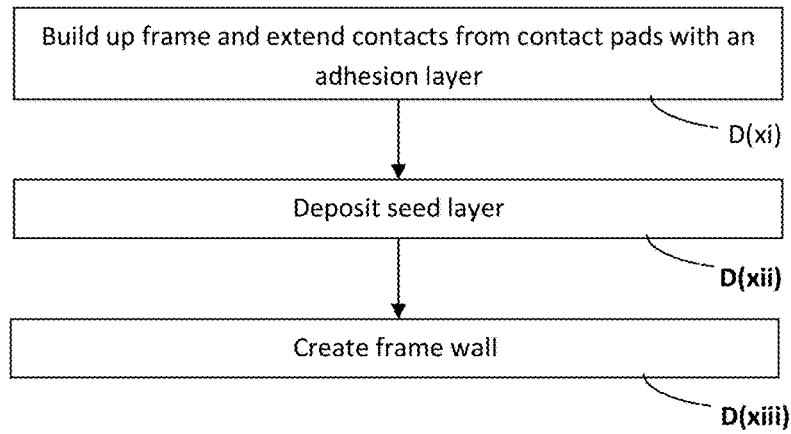
FIG. 52 is a flowchart of showing how the structure of FIG. 48 is processed to apply a seal ring and contact stacks to the upper and lower electrodes; thereover.

FIG. 52 is a flow chart showing a method of applying bonding surfaces to the contact pads 55, 56 for attachment of the seal ring and contact extension to the lower electrode, and for creating a bonding surface for attachment of a contract extension to the upper electrode 60 is now discussed.

With reference to FIG. 52 step D(xi), an adhesion layer 16E is selectively deposited to facilitate attachment of contacts, and a seal ring consisting of a different material from that of the upper electrode 60. The adhesion layer 16E is typically titanium, chromium or titanium-tungsten.

Figure 53:
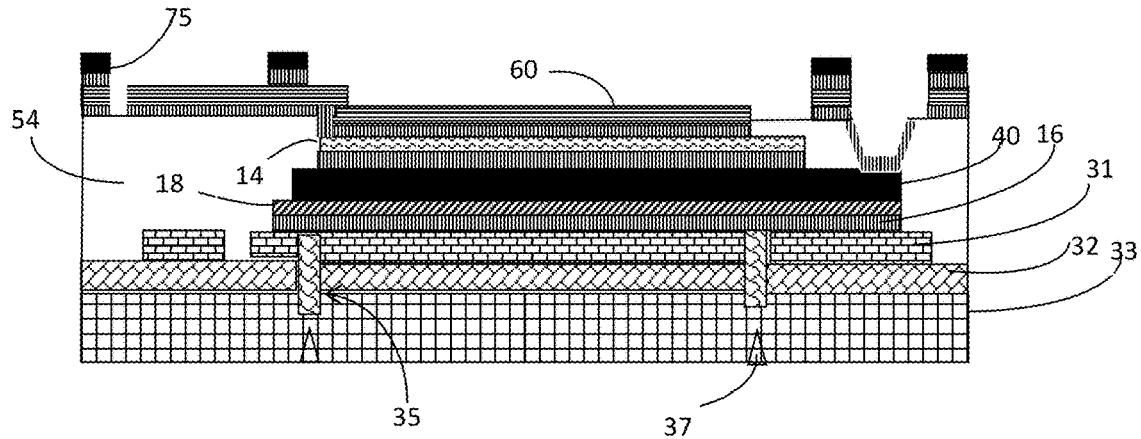
FIG. 53 is a schematic illustration of the structure of FIG. 51 with an adhesion layer attached for attaching a seal ring and contact stacks.

Then, in FIG. 52, step D(xii) a seed layer 75 is selectively deposited onto the adhesion layer. The subsequent structure is shown in FIG. 53.

Processing the Bonded Stack Silicon Handle Side

Previous to processing the carrier 30 and piezoelectric 14 side of the structure of FIG. 41, subsequently, or partially processing first one side and then the other or both sides at once, the structure of FIG. 41 is also processed from the silicon handle 33 side. This is block G of the flowchart of FIG. 1, and may be performed before Blocks D1, D2 and D3, and F, or steps of block G may be performed after Blocks D1, D2 and D3, and F.

Figure 54:
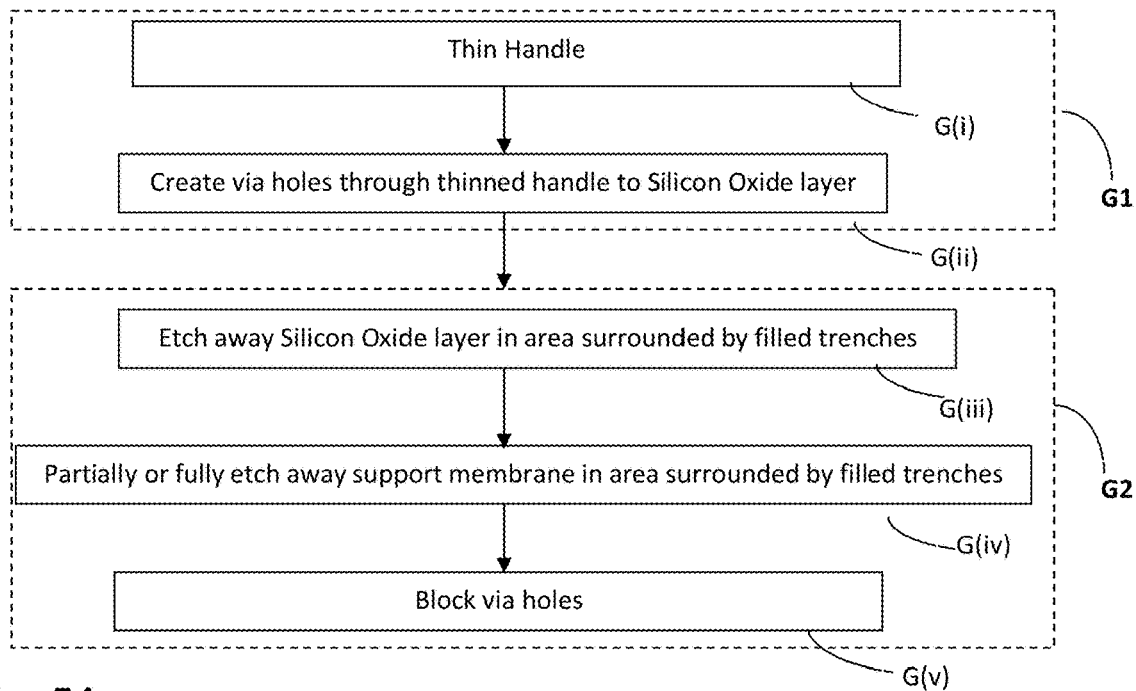
FIG. 54 is a flowchart of the processing from the handle side to create lower cavities under each resonator.

FIG. 54 shows a flowchart for the processing from the silicon handle side, and this processing is described starting from the array of FIG. 53, it being appreciated however, that it could occur before some of the processing steps described above, or subsequent to applying the lids as described below.

Figure 55:
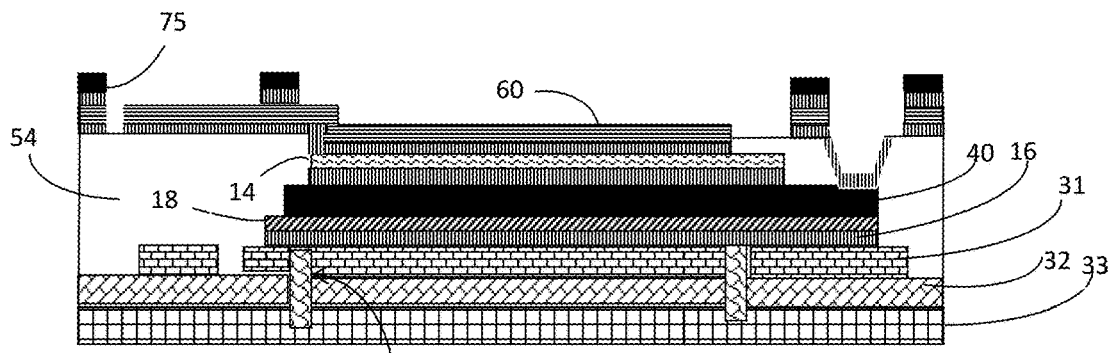
FIGS. 55 to 59 are schematic illustrations showing the structures resulting from the steps of the flowchart of FIG. 54 applied to the structure of FIG. 53.

Thus with reference to FIG. 54 step G(i) the silicon handle 33 is thinned providing the structure shown in FIG. 55. The thinning typically reduces the thickness of the silicon handle 33 from its original thickness (typically 400 to 700 microns depending on wafer diameter) to about 200 microns. Thinning down the silicon handle 33 may be accomplished by a wide range of techniques, including mechanical grinding, chemical mechanical polishing CMP, wet etching with atmospheric downstream plasma (ADP) and dry chemical etching (DCE). After grinding, the fresh surface of the silicon handle 33 is typically polished.

Thus with reference to FIG. 54 step G(ii), holes 62 are drilled through the thinned silicon handle, exposing the $SiO_2$ 32 within the filled trench pattern 34 providing the structure shown in FIG. 55. The holes 62 may be fabricated using inductive coupled plasma ICP, of, for example, $SF_6+O_2$, $XeF_2$ or SF with $O_2$ and/or Ar gas mixtures. Steps G(i) and G(ii) are shown in FIG. 1 as Box G1.

Preferably, the remaining steps G(iii) to G(v) shown in FIG. 1 as block G2 are performed subsequently to fabricating and attaching the lids (FIG. 1 blocks (E and F) but are described in FIGS. 57-59 for purposes of explanation as performed on the structure of FIG. 57, without attachment of the lids 175.

Figure 57:
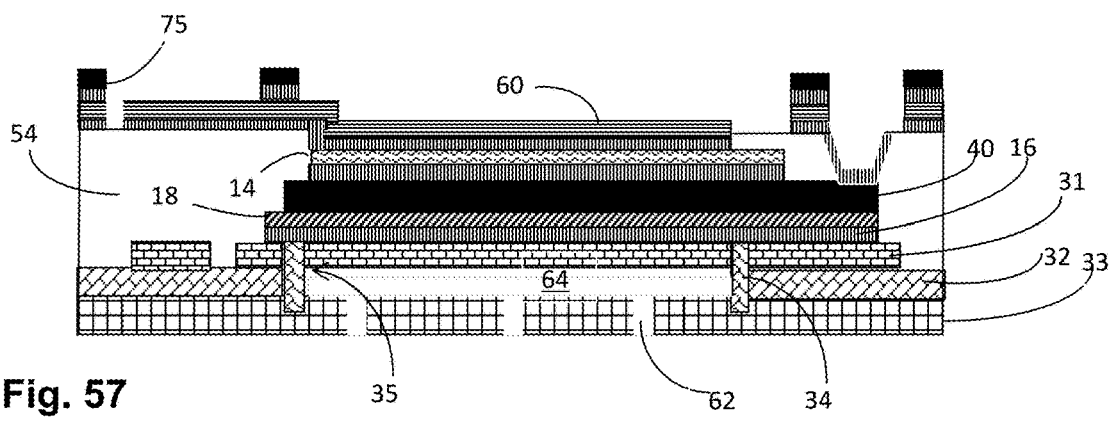

Thus with reference to FIG. 54 step G(iii), the $SiO_2$ 32 is etched away—step 5(iii) creating the structure shown in FIG. 57. This may be achieved by etching with HF vapor to create cavities behind the thinned silicon handle 33 that are bordered by the silicon nitride coated 35, filler 36 filled trenches 34 and the support membrane 31 with the silicon nitride coating 35 on the filled trenches 34 serving as an etch stop.

It is a particular feature of some embodiments that different thickness trimming of specific support membrane is facilitated, enabling specific resonators within a filter to have different thicknesses by selectively covering specific through silicon vias under certain resonators to obtain a wider band filter ($K^2_{eff}$).

Figure 58:
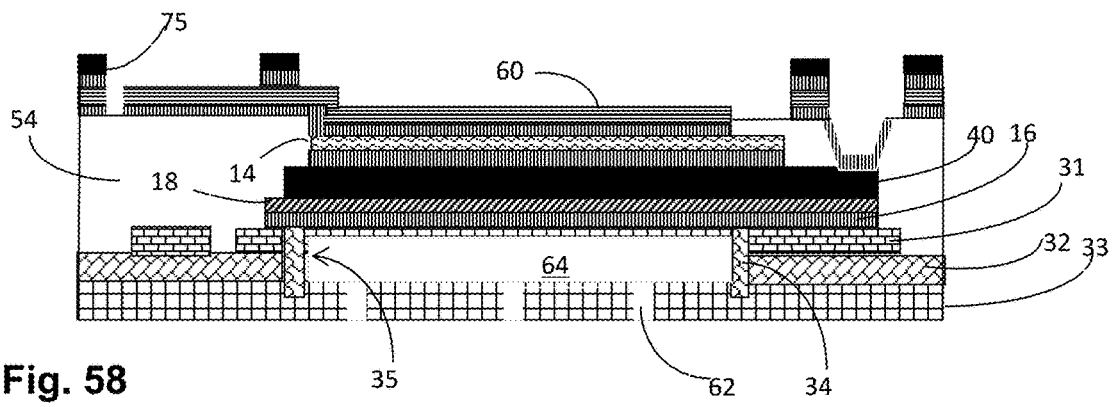

With reference to FIG. 54 step G(iv), the thus exposed surface of the support membrane 31 layer within the filled trench pattern 34, opposite the piezoelectric resonator 14C, may also be etched away partially providing the structure shown in FIG. 58 which also shows the membrane 31 within the closed loop trenches merely thinned and trimmed, but not completely removed. or completely (as shown in FIG. 12), thereby exposing the underside of the adhesion metal 16A within the area enclosed by the filled trenches 34.

Figure 59:
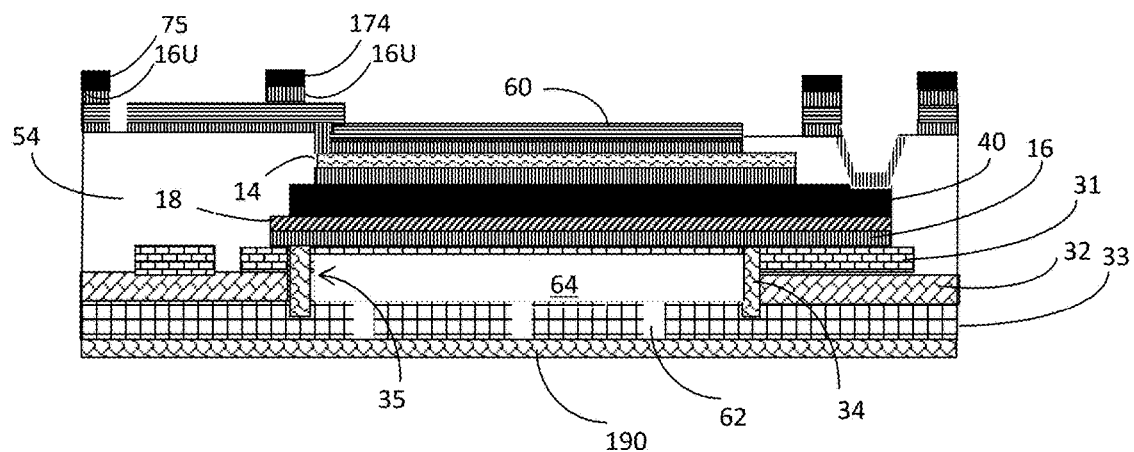

With reference to FIG. 54 step G(v), the holes 62 in the thinned silicon membrane 34 may then be sealed by depositing a layer of polysilicon or thereunder providing the structure schematically shown in FIG. 59.

Coupling Agent Resonators in Series to Form Filters

Figure 60:
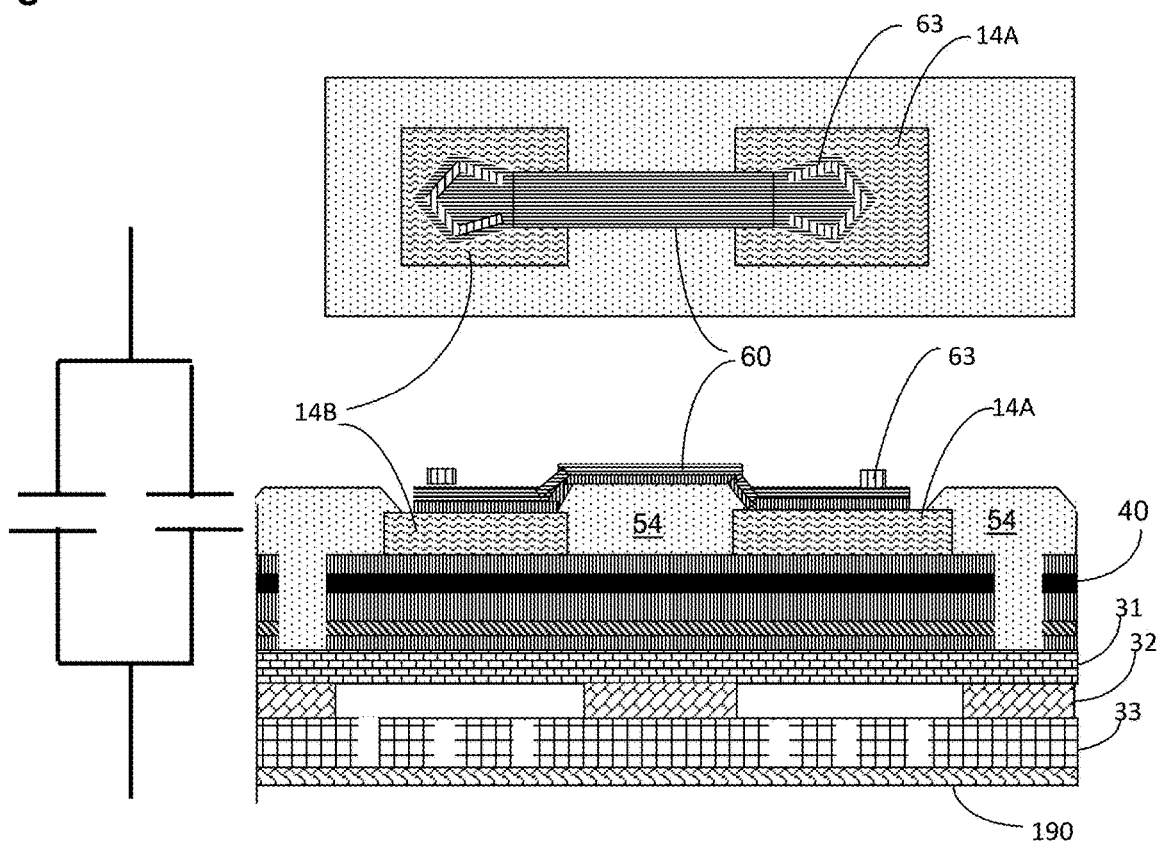
FIG. 60 shows how two adjacent resonator stacks may be coupled in parallel in filter arrays.
Figure 61:
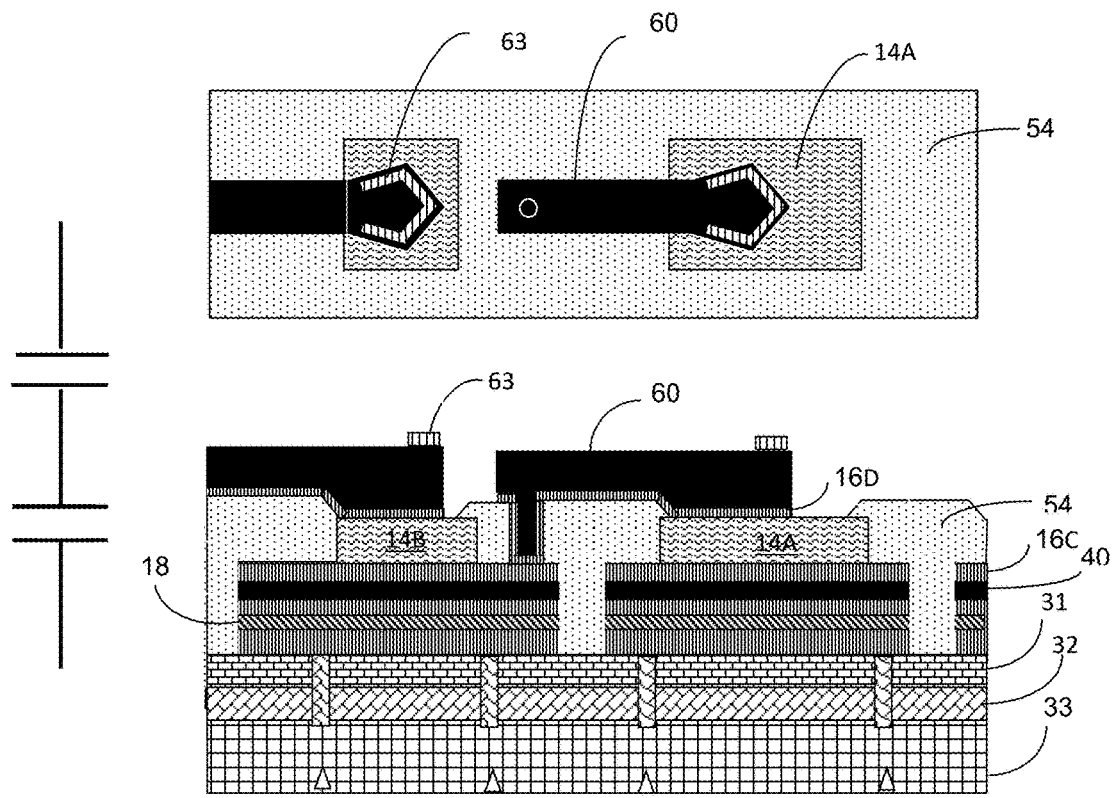
FIG. 61 shows how two adjacent resonator stacks may be coupled in series in filter arrays.

With reference to FIGS. 60 and 61, methods of coupling individual resonators in parallel and series are now discussed.

The first, multilayer electrode layers 16, 18, 40 and the piezoelectric film 14 are patterned to create individual islands of piezoelectric 14A, 14B supported by rectangular layers of the first electrode 16, 18, 40, which is the lower electrode in FIGS. 60 and 61. The passivation material 54 is selectively deposited around the rectangular layers of the lower electrode and individual islands of piezoelectric 14A, 14B and partially covers the perimeter of the surface of the islands of piezoelectric 14A, 14B furthest from the composite first electrode. A second electrode 60 is selectively deposited onto the passivation material 54 and the islands of piezoelectric 14A, 14B. Again, an adhesion metal layer 16D may be first deposited, and the second electrode material 60 selectively deposited thereonto, or the adhesion layer 16D and second electrode 60 are deposited continuously and selectively removed. A stiffening raised frame 63 of a metal, such as titanium, chromium, or titanium-tungsten is deposited around the perimeter of the second electrode 60. Typically the raised frame 63 is fabricated from the adhesion/ barrier layer 16U used as the barrier layer prior to depositing the Au seed layer over the sealing ring and the interconnecting pads. This raised frame 63 structure is especially useful in Composite FBARs as it helps minimize lateral-wave spurious modes that otherwise lower the Q factor of the device, regardless of the mode number. With such a raised frame 63, only the main lateral mode is excited due to the new boundary conditions between the active and outside region of the resonator membrane that are created by the raised frame 63. The extra weight of the raised frame 63 layer on the electrode 60 creates a mechanical damping effect that can assist in lowering the shunt resonator frequency response vs. the series resonator frequency response and thus improve the overall performance of the filter. The raised frame 63 is typically deposited together with the adhesion layer 16U assisting in attaching layer 75.

The coupling arrangement of adjacent piezoelectric membranes 14A, 14B and the upper electrode schematically shown in FIG. 60 show how resonators may be coupled in parallel and the coupling arrangement of FIG. 61, show how adjacent resonators may be coupled in series. It will be appreciated that combinations of the arrangements shown in FIGS. 60 and 61 facilitate creating series and shunt resonator arrays, such as those of FIGS. 13, 15 and 17 discussed hereinabove.

Packaging

For packaging the array of filters, a corresponding array of lids is required. This array is fabricated from a wafer that is typically silicon or glass. Wafers have two faces. For ease of understanding, that to be coupled facing the membranes is referred to hereunder as the inner face, and that with termination pads thereon is referred to hereunder as the outer face.

Termination pads on the outer face are electrically connected by through metal vias to capture pads on the inner face of the cap which are electrically coupled by contact stacks (described below) to the upper and lower electrodes of the resonator stacks of the filter arrays.

When assembled, the lids in the array of lids are mechanically coupled to filters in the array of filters by a seal ring in an array of seal rings, each seal ring surrounding a filter. This array of seal rings may be fabricated partly on the array of filters and partly on the inner surface of the array of lids. The two parts of the array of seal rings are then joined together to package the upper parts of each filter with a seal ring and lid, thereby creating an array of cavities between the array of filters and the array of lids; one cavity, lid and seal ring per filter.

Fabrication of Array of Lids

FIG. 63 shows an array of lids 175 having contacts 172 on an outer surface coupled by filled vias 139 that traverse the lid 175 and are coupled to bonding metal capture pads 174A, 174B for coupling on the inner surface of the lids 175 for coupling to the first electrode 40 and second electrode 60. The bonding metal capture pads 174 typically comprise gold or a gold alloy, and are coupled to the inner surface of the lid by contacts of an adhesion metal 16E such as titanium, chromium or titanium-tungsten.

Where the lid 175 is fabricated from semiconducting material such as a silicon wafer, to isolate the capture pads 174A, 174B, an insulating coating 135 such as silicon nitride or silicon dioxide is deposited on both sides of the lid 175 and also along the surfaces of the through via hole prior to filling the via with a conducting material.

If the lid 175 is fabricated from a non-conductive material such as glass, the insulating coating 135 is not required.

Opposite the seal ring contact pads 66, bonding pads 174C are provided.

To distance the lid 175 from the upper electrode 60 sufficiently to allow the electrodes piezoelectric resonators to resonate, an upper cavity is required under the lid 175. To create this upper cavity, a seal ring 180 extends from the bonding layer 174C to a second bonding layer 75. Similarly contact extension stacks 182, 184 extend from the bonding pads 174A and 174B to second bonding layer. The method of fabrication of seal ring 180 is described in detail hereinbelow, but at this stage, it is noted that it may be built up from the array of filters towards the cap and attached thereto by bonding pads 174.

Figure 64:
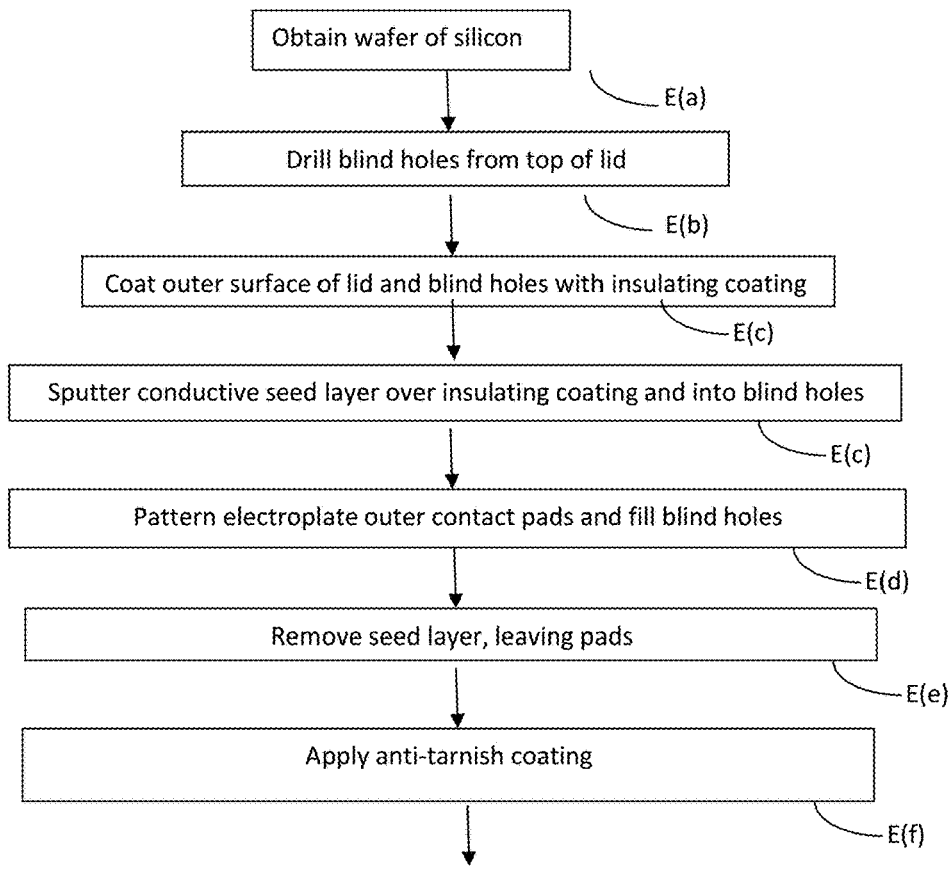
FIG. 64 is a flowchart illustrating the steps for fabricating outer surface of an array of lids from a silicon wafer (or other conductor)

However, as shown in FIG. 64, alternatively, the seal ring 180 and contact stacks 182, 184 may be built down from the inner surface of the array of lids 175 and terminated with bonding layers 75C, 75A, 75B for coupling to bonding layers 75 on contact seal ring 65 and contact pads 66 attached around the filter arrays and to the upper and lower electrodes respectively.

In both the variant shown in FIG. 63 and that shown in FIG. 64 the bonding of the two identical bonding layers is performed by reflowing the bonding layer material which is typically gold, under vacuum within the temperature range of 150° C. to 300° C. and at a pressure in the range of 50 MPa to 100 MPa.

Since the filter arrays include support membranes and difficult to fabricate single crystal films which have accurate dimensions, and passivation layers and electrodes, it is better engineering practice to fabricate the seal ring 180 on the lid 175 and to attach the lid 175 with seal rings 180 and contact stacks 180, 182, 184 to the structure shown in FIG. 55, or that of FIG. 59 with the lower cavities already formed and sealed.

Silicon Lid

Figure 56:
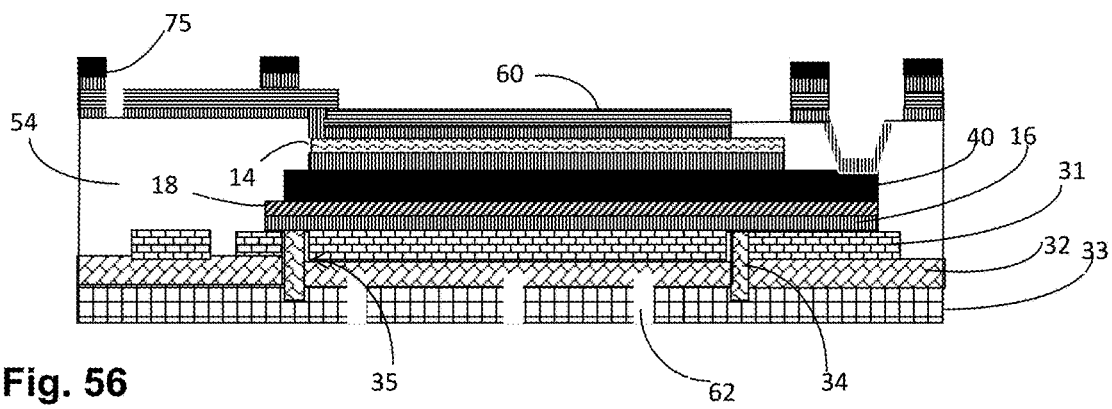
Figure 65:
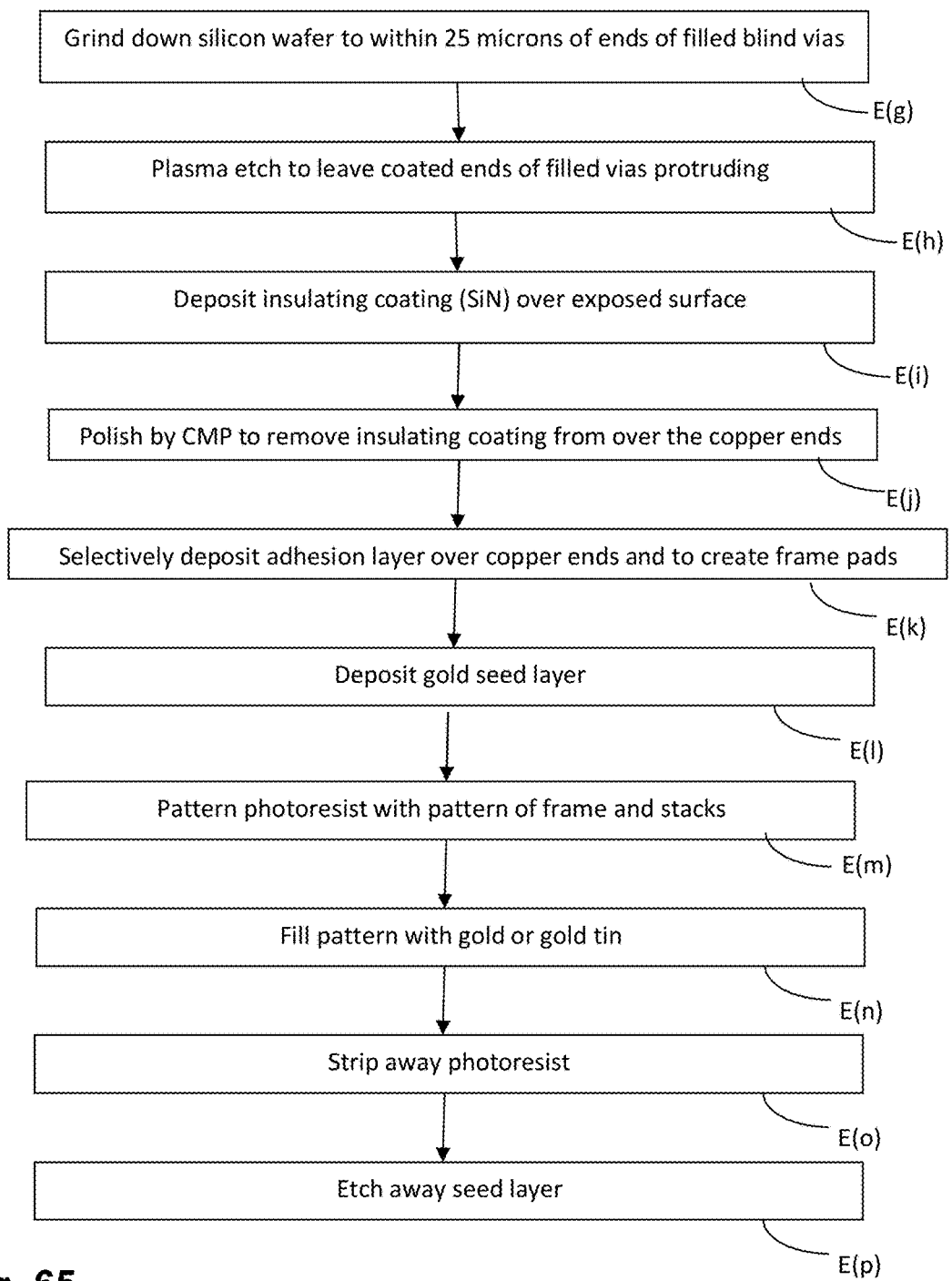
FIG. 65 is a flowchart illustrating the steps for fabricating the inner surface of an array of lids from a silicon wafer (or other conductor with seal ring and contact stacks fabricated on the inner surface)
Figure 66:
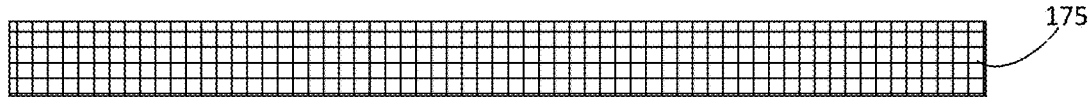
FIGS. 66 to 86 are schematic illustrations of the intermediate structures obtained when performing the steps of FIGS. 64 and 65.

The appropriate processing route depends on the materials used, and in FIGS. 65 and 66, flowcharts for one processing method for fabricating lids from a silicon wafer 175 is given together with a method of fabricating a seal ring and contact stacks on the inner surface for attaching to the structure of FIG. 56 or 59.

Thus with reference to FIG. 65, one process for fabricating a lid E1 from a silicon wafer 175 and an attached seal ring E2 from gold for attaching to contact seal ring 65 and contact pads 66 (D2) attached around the filter arrays and to the upper electrode 60 and a layer of the lower electrode 18 respectively consists of the following stages:

(a) obtaining a silicon wafer 175 having an inner surface and an outer surface—see FIG. 66.

Figure 67:
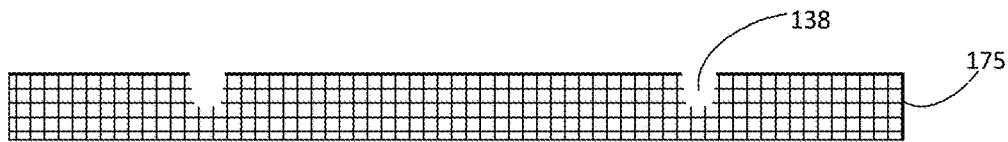

Processing from the Outer Surface (b) drilling blind via holes 138 from the outer surface of the wafer 175 by deep reactive ion etch (DRIE) using BOSCH process—see FIG. 67

Figure 68:
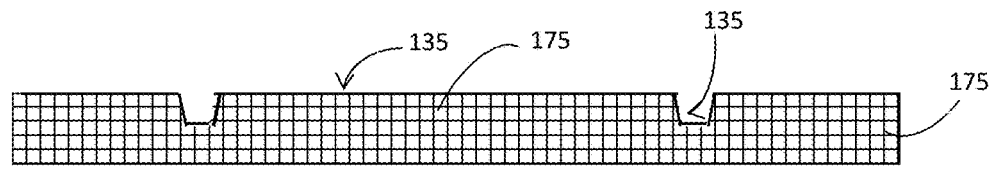

(c) depositing an insulating silicon nitride or silicon dioxide liner layer 135 into the blind vias 138 and over the outer surface of the silicon cap 17—see FIG. 68. Typical the thickness of the liner layer 135 is about 1 μm and is deposited by LPCVD. In case of Silicon dioxide it may alternatively be grown thermally.

Figure 69:
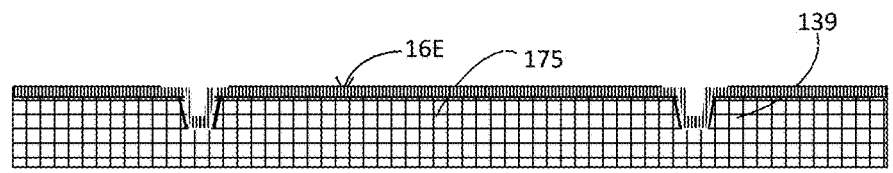

(d) Deposit (e.g. by sputtering) a conductive seed layer 16E such as titanium-copper over the insulating liner on the outer surface and into the blind vias—see FIG. 69.

Figure 70:
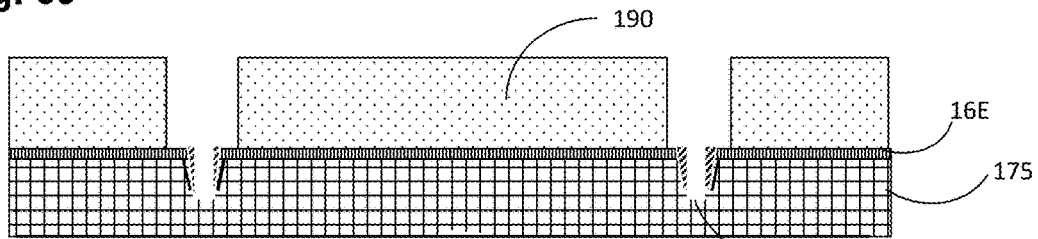
Figure 71:
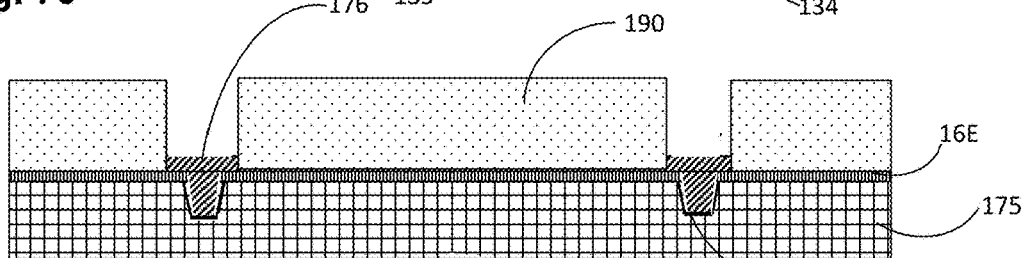
Figure 72:
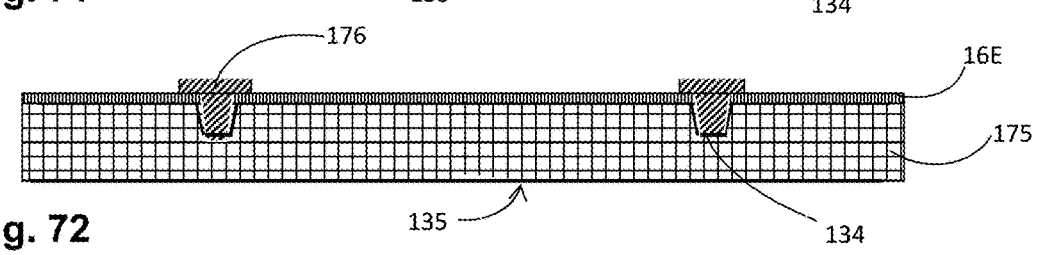

(e) pattern electroplating a metal such as copper to fill the blind vias and to generate copper termination pads 176 on the outer surface over and around the filled vias. This may be achieved by:

laying down a layer of photo-resist 190 and developing it with pattern of external pads (FIG. 70);

Electroplating the termination pads 176 into the photo-resist 190—FIG. 71. The pads 176 are typically copper;

Removing the photo-resist 190—FIG. 72, and

Figure 73:
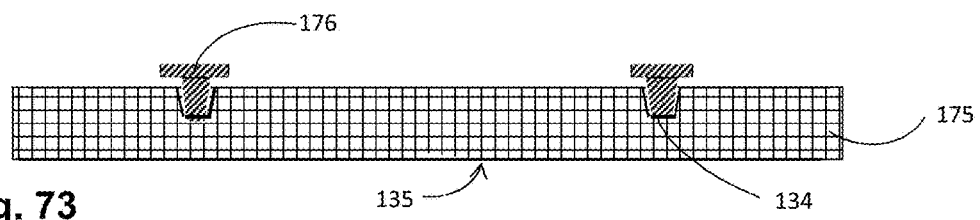

Remove the seed layer to leave the pads—FIG. 73.

Figure 74:
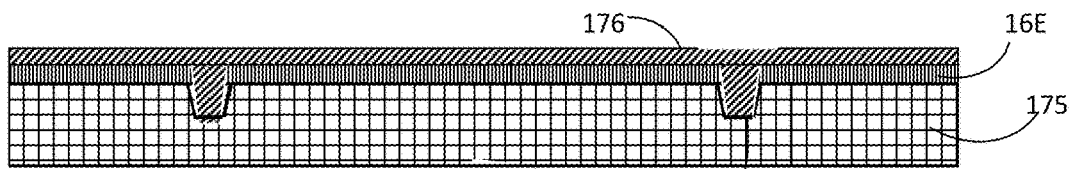
Figure 75:
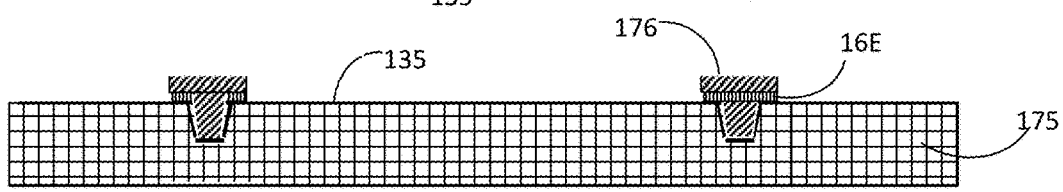

Alternatively:

a continuous layer of the termination pad material 176, which is typically copper is deposited over the seed layer 16E—FIG. 74 and then of the termination pad material 176 is selectively removed together with the underlying seed layer 16E to leave the pads 176 as shown in FIG. 75

Figure 76:
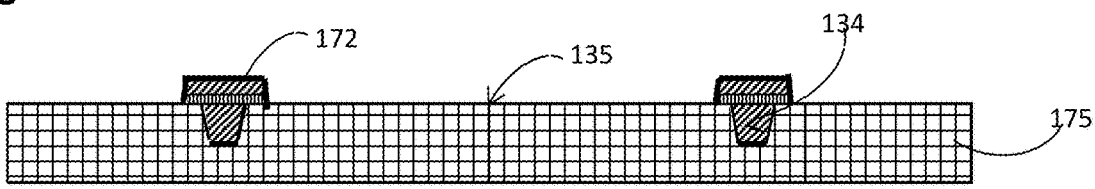

(f) Then a metal finish 172, such as gold, ENIG or ENEPIG, for example, is deposited over the termination pads 176—FIG. 76.

Figure 77:
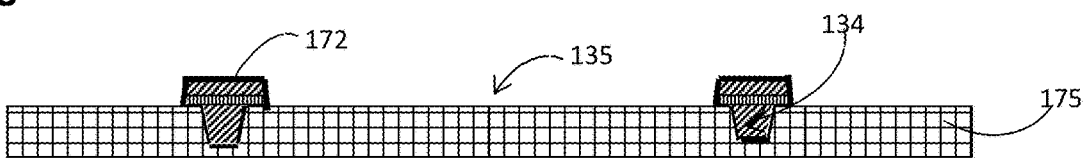

Processing from the Inner Surface (g) The inner surface of the silicon wafer 175 is ground down to within 25 microns of the end of metal filled blind vias—FIG. 77.

Figure 78:
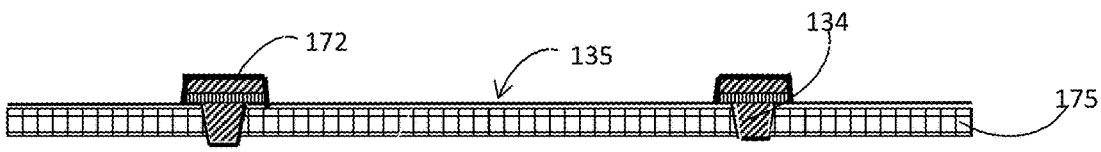

(h) Then, further thinning is achieved using plasma, to remove an additional 25~30 microns of the silicon, thereby exposing about 5 microns of the ends of the lined filled blind silicon vias without damaging the silicon nitride or silicon dioxide 134 liner or copper 175—FIG. 78.

Figure 79:
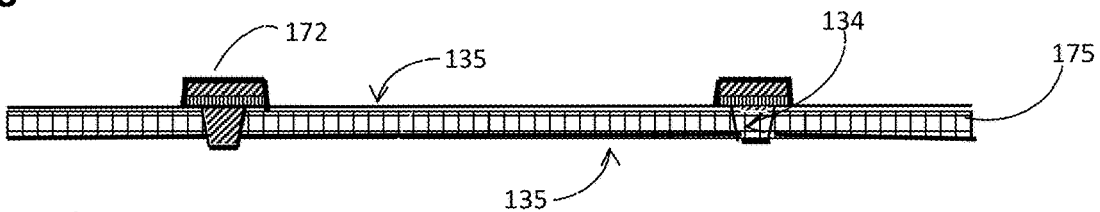

(i) A layer of silicon nitride or silicon dioxide 135 is deposited over the inner surface and over the exposed silicon nitride coated ends of the vias (which are now through vias)—FIG. 79.

Figure 80:
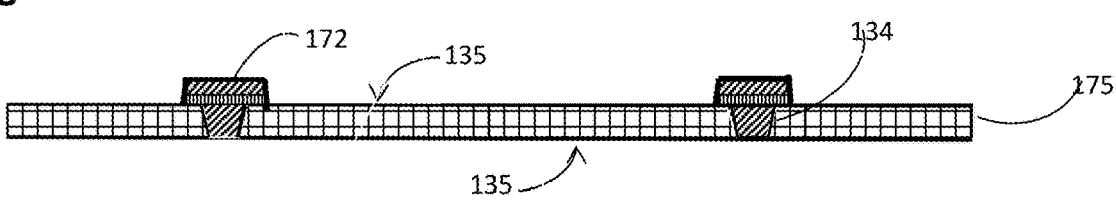

(j) The underside is Polished by a Chemical-Mechanical Polish (CMP) to remove silicon nitride or dioxide 134 coated ends of the exposed vias thereby exposing the copper 175 inside the blind vias with silicon nitride or dioxide 135 layer remaining over the silicon cap first surface—FIG. 80.

Figure 81:
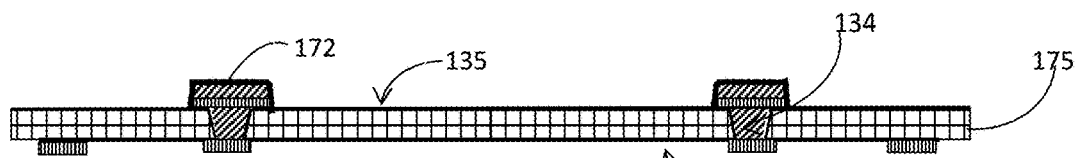

(k) Selectively depositing an adhesion layer 16F (typically titanium, chromium and titanium-tungsten)—FIG. 81, either by depositing continuously on the underside of the wafer 175 onto the SiN or SiO$_2$ 135 coating, or by selectively depositing using a template.

Figure 82:
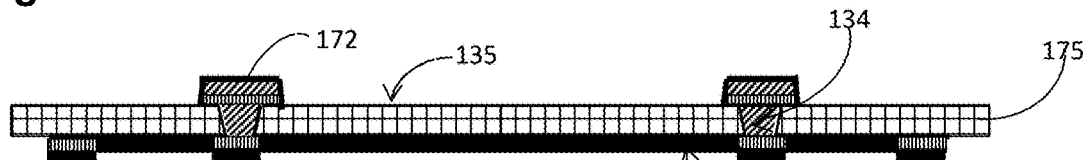

(l) Depositing a gold seed layer over the inner surface of the lid 175—FIG. 82.

Figure 83:
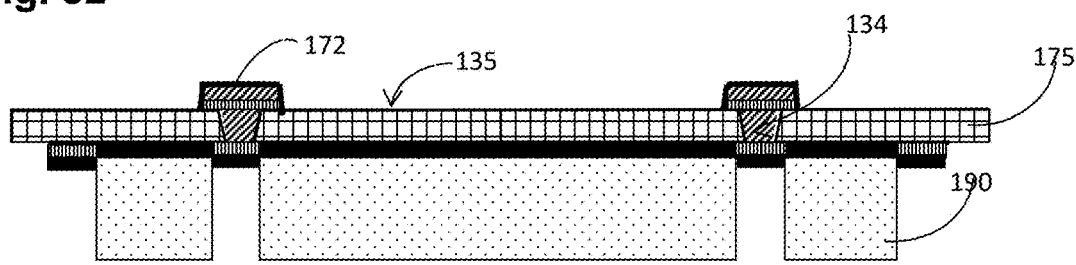

Extend Sealing the Seal Ring (m) patterning a photo-resist 190 with a pattern of seal rings and contact stacks—FIG. 83

Figure 84:
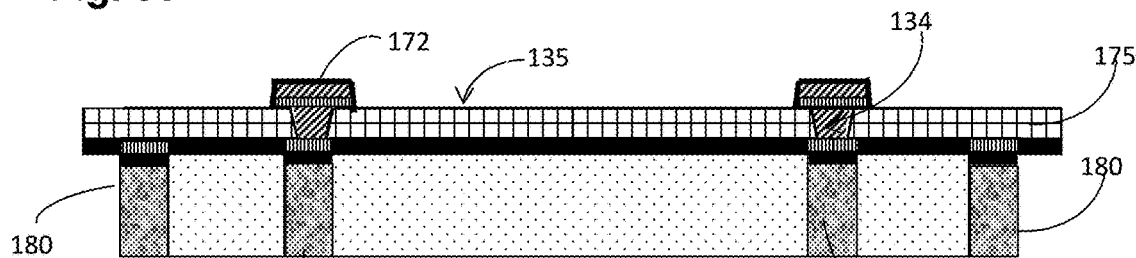

(n) filling pattern with seal rings 180 and contact stacks 182, 184—FIG. 84

Figure 85:
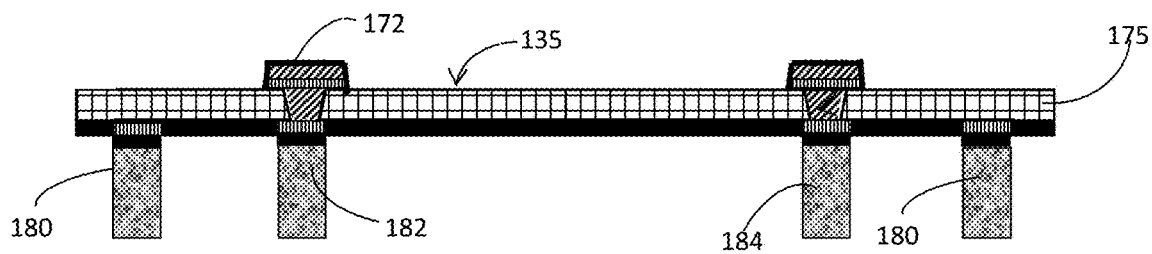

(o) stripping away photo-resist 190—FIG. 85

Figure 86:
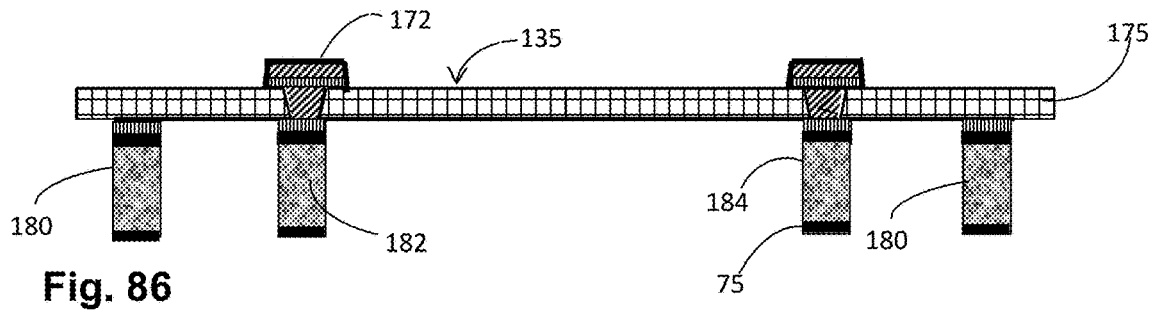

(p) etching away the seed layer 174 and activating a bonding layer 76 on the exposed surfaces of the gold capture pads and seal rings—FIG. 86.

Two variant processes for filling the pattern to extend the seal ring are now given. In a first process the pattern is filled by electroplating. For example, gold-tin may be electroplated into the pattern to create a seal ring 180 and contact stacks 182, 184 of gold or gold-tin. In a second process, the patterned photoresist is filled by screen printing nano-sized gold particles and organic binder in a paste form and then sintering the paste at about 200° C.

Glass Lid

Figure 87:
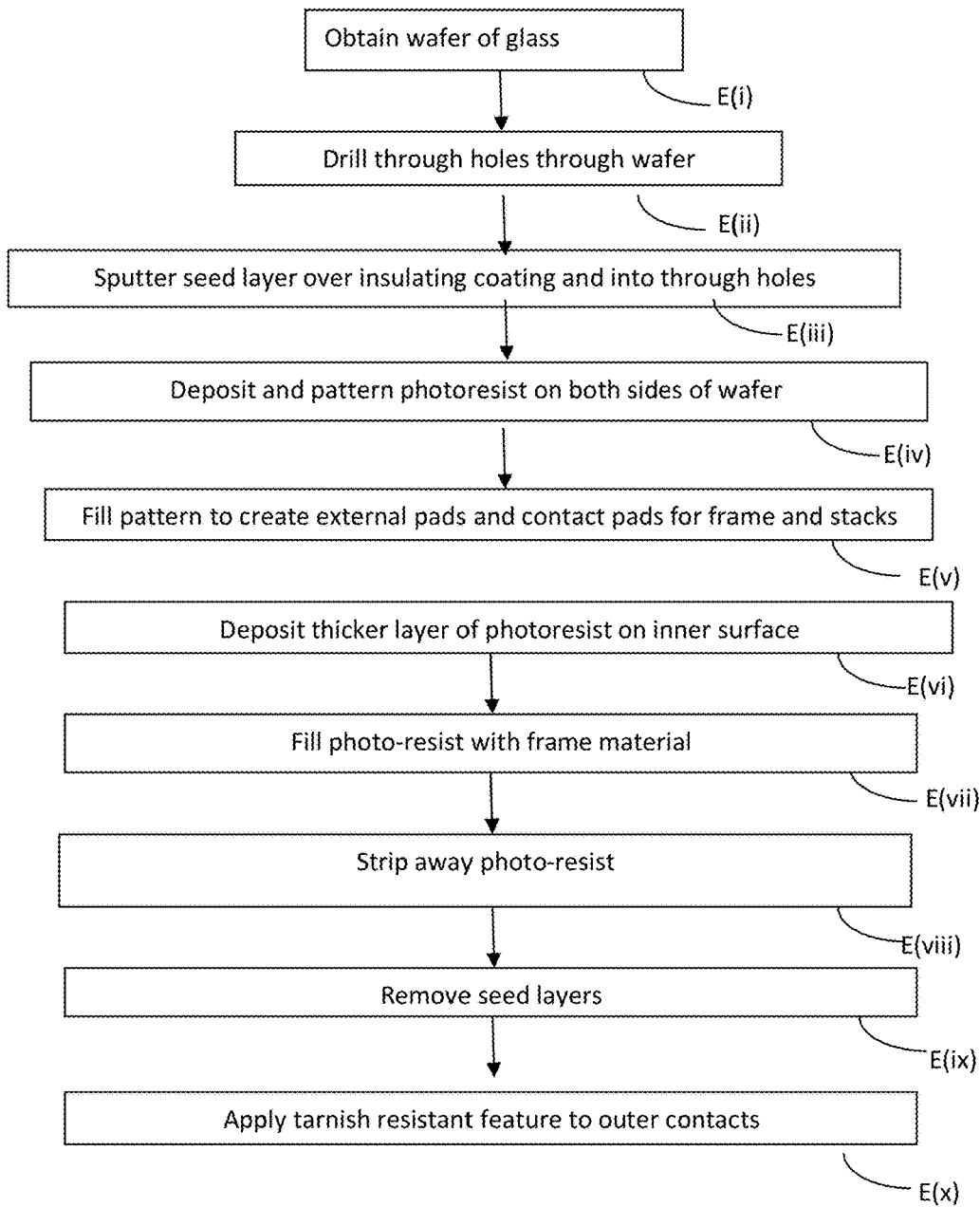
FIG. 87 is a flowchart for processing an array of lids fabricated from glass (or other insulating material) to create terminations on outer surface and an array of seal rings around filters and an array of contact stacks for capturing contacts to the upper and lower electrodes on inner surface.

Alternatively, the lid array may be fabricated from glass. With reference to FIG. 87, a method of fabricating an array of glass lids 275 with attached seal rings consists of the following process steps:

Fabricating Lid (E1)

Figure 88:
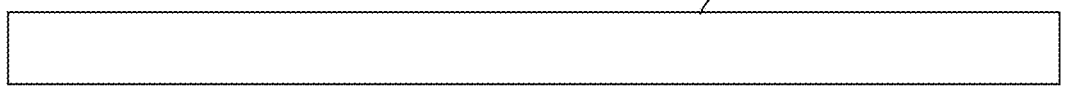
FIGS. 88 to 97 are schematic illustrations of the intermediate structures obtained when performing the steps of FIG. 87.
Figure 89:
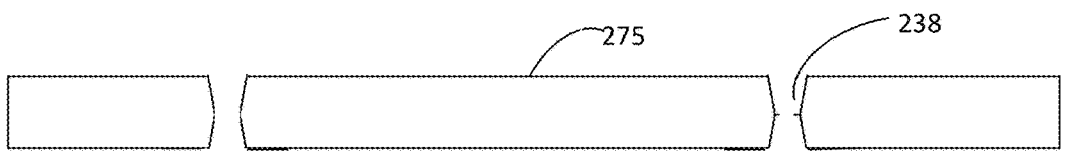

(i) obtaining a glass wafer 275 with inner and outer surfaces—FIG. 88;

(ii) fabricating through holes 238—FIG. 89. A carbon dioxide laser may be used by laser drilling from both surfaces of the glass wafer to meet in the middle.

Figure 90:
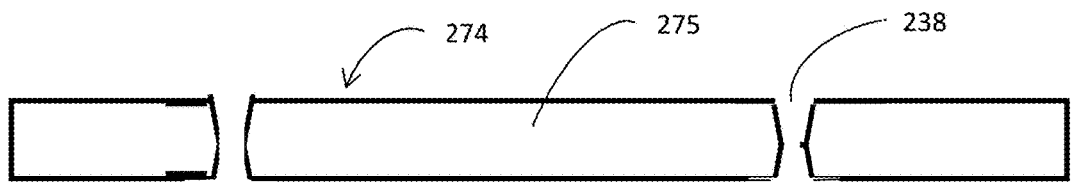

(iii) A seed layer 274 is sputtered into the vias and over both surfaces—FIG. 90. A double seed layer consisting of titanium and copper may be used. The titanium adheres well to the glass 275 and the copper aids subsequent electro-deposition of copper 276. Ti/Cu may be deposited in separate layers, with titanium followed by copper, or a gradual switch from titanium to copper may be achieved by first depositing titanium and gradually adding more copper and less titanium.

Figure 91:
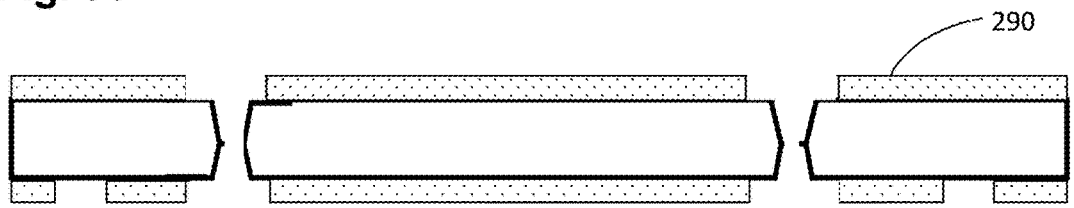

(iv) Layers of photo-resist 290 are deposited on both surfaces of the glass wafer—FIG. 91

Figure 92:
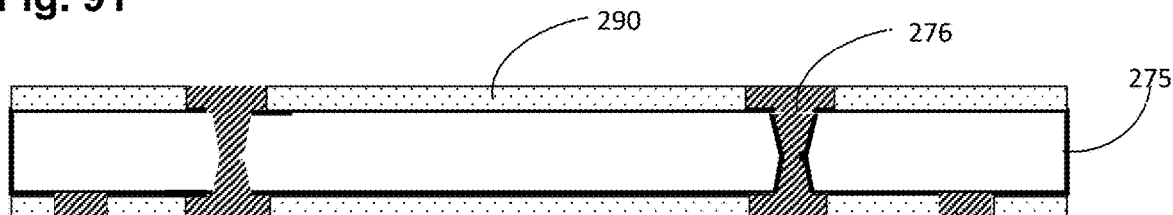

(v) Deposit an array of inner contacts pads 276 opposite the through holes and with an array of seal rings 277 that lines up with the seal ring contact pads 66 giving the structure shown in FIG. 92

Fabricating Seal Ring and Stacks (E2)

Figure 93:
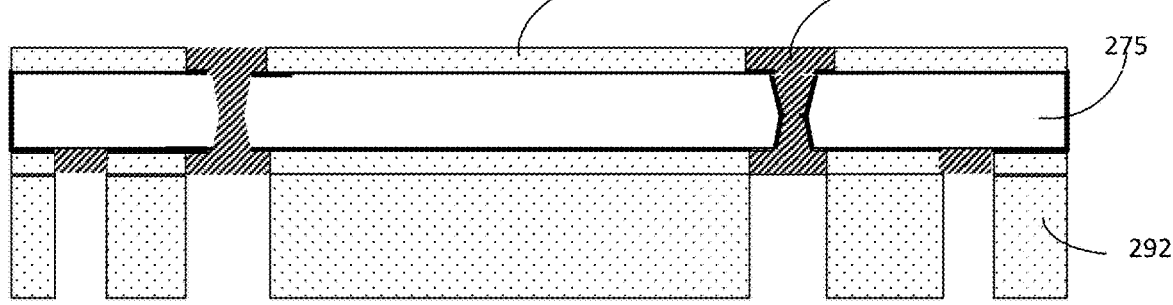

(vi) The seal ring and contacts is extended by depositing and patterning a thicker layer of photo-resist 292 over the inner surface of the lid array—FIG. 93

Figure 94:
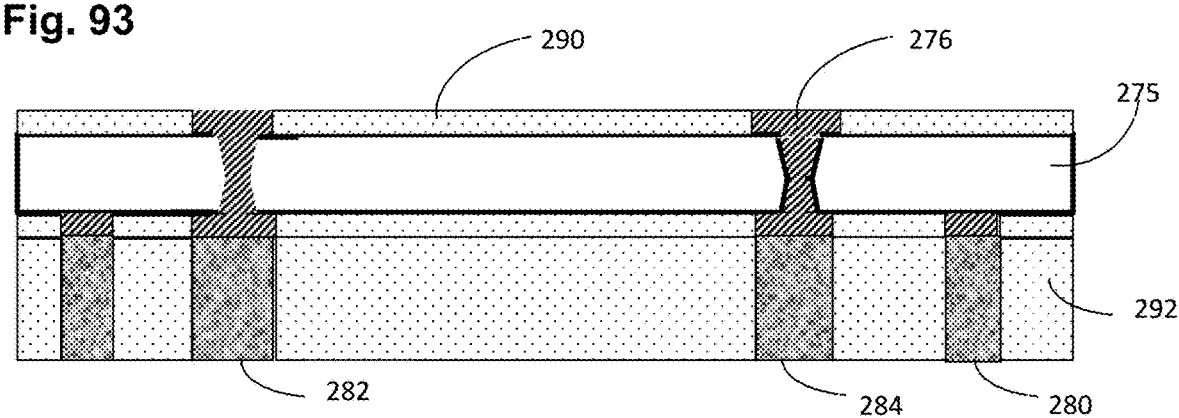

(vii) The photo-resist 292 is then filled with an array of seal rings 280 and contact stacks 282, 284—FIG. 94

Figure 95:
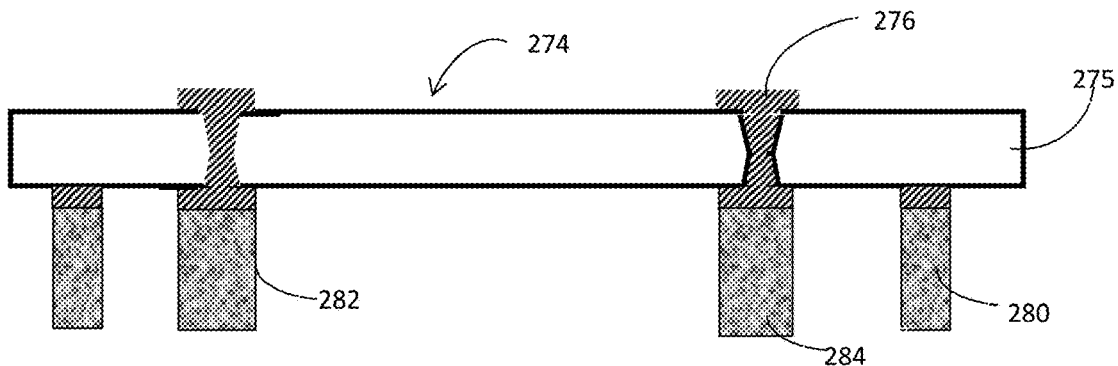

(viii) The photo-resist is then stripped away—FIG. 95

Figure 96:
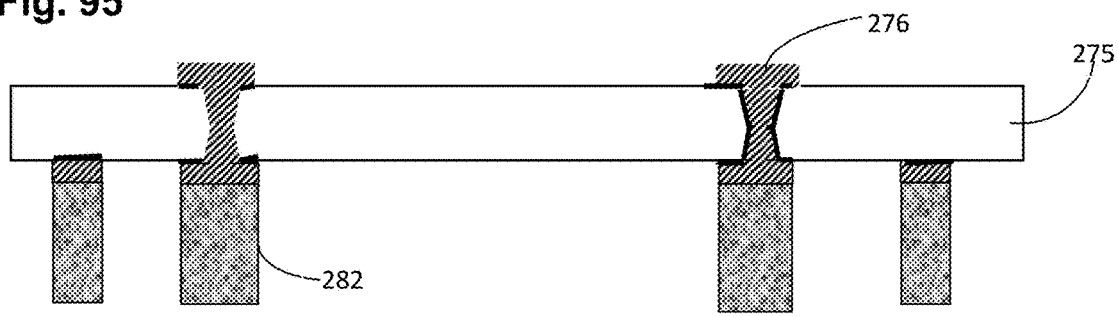

Finishing Termination Pads (ix) The seed layers 274 are removed from both surfaces of the cap array 275—FIG. 96.

Figure 97:
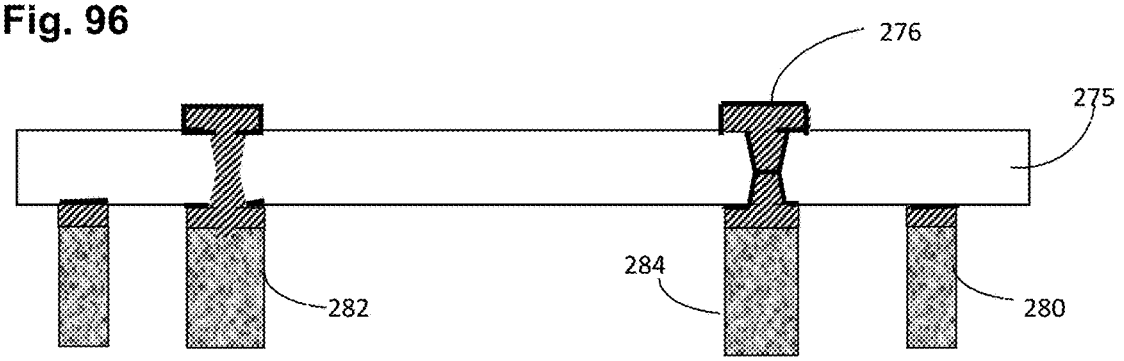

(x) A tarnish resistant finish 276 is deposited over the termination pads on the outer surface—FIG. 97. This may be selected from the group of gold, ENIG and ENEPIG, for example.

Two variant processes for filling the pattern to extend the seal ring are now given. In a first process the pattern is filled by electroplating. For example, gold-tin may be electroplated into the pattern to create a seal ring 180 and contact stacks 182, 184 of gold-tin. In a second process, the patterned photoresist is filled by screen printing nano-sized gold particles and organic binder in a paste form and then sintering the paste at about 200° C.

Attaching the Array of Filters to the Array of Caps

With reference to FIG. 1 Block F, regardless of whether the array of seal rings 180 and contact stacks 182, 184 are fabricated up from the array of filters (as shown in FIG. 63 using the process described in block D3) or down from the array of lids (as shown in FIG. 64 using the process described in block E2), and whether these steps are performed prior to some or all of the steps of FIG. 1 block G, i.e. thinning the handle 33 and creating through holes 62 (FIG. 1 block G1) and etching away individual cavities under the individual resonator stacks (FIG. 1 block G2), bonding the array of lids 175 to the array of FBAR filters may be achieved by aligning the array of filters fabricated from blocks A-E (with or without G) to the array of lids fabricated by the process described with reference to FIG. 1 block E1 and shown in FIG. 63 or to the array of lids with seal rings fabricated by the by the process described with reference to FIG. 1 blocks E1+E2 and shown in FIG. 64.

Figure 98:
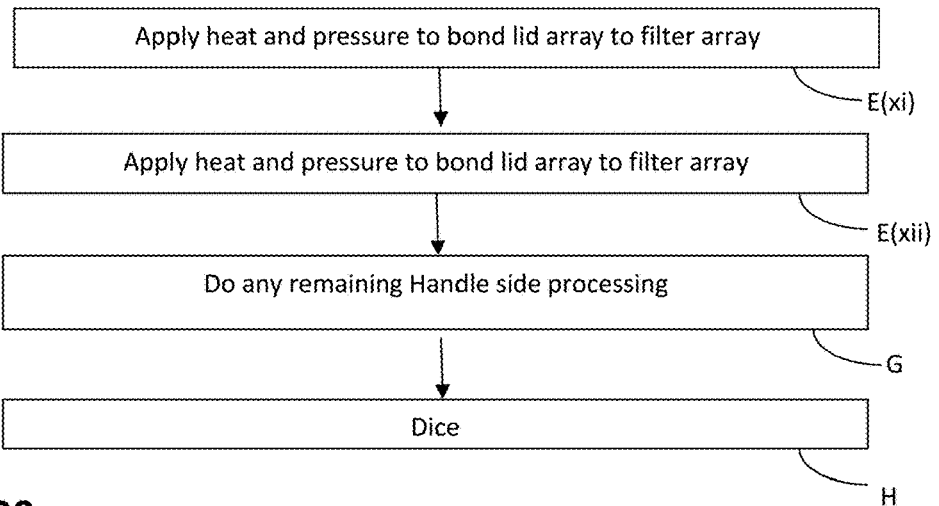
FIG. 98 is a flowchart for the steps of binding the lid array to the filter array, processing lower resonator specific cavities if necessary and dicing to singulate the packaged filter arrays.

Thus with reference to the flow chart of FIG. 98, the two aligned components are brought into contact F(i) and bonded by reflowing the bond layer 75 or 174 under vacuum and temperature range of 150° C. to 300° C. and pressure of 50 MPa to 100 MPa step (F(ii) creating an array of the structures shown schematically in FIG. 11, 55-59 or 12. If the filter array structure is as shown in FIG. 11, 55058, then steps of Process G given in FIG. 54 are performed. Once all the steps of Fig. which can then be diced (FIG. 1 Step H) using cutting wheels or laser cutting as known.

Thus single crystal Composite FBARs having improved cavity definition are shown and described.

As stated hereinabove, a main usage of such FBAR resonators is in filters for mobile telephony. It will, however, be appreciated that they can also be used in other electronic devices.

Single crystal FBAR resonators and filters have the following advantages:

Such filters may save up to half of the RF power wasted as heat in prior art filters because the single crystal orientation enables polarization of the excited acoustic wave.

The filters disclosed herein may operate at higher frequencies since the thickness of the ultra-thin piezoelectric membrane necessary for high frequencies may be supported by an additional support membrane (composite FBAR).

Having a composite electrode and structure that includes a support membrane, such filters may have second or higher harmonic mode frequencies that can extend the operating frequency range of the FBAR. This feature may be important for 5G and other high bands emerging applications.

Since CMOS device processes are compatible with the disclosed filter processes described, there are opportunities to integrate such devices with the filter chip by taking advantage of the Smart-Cut® SOI device layer as the substrate for such transistors. Such devices may also use the trench isolation feature disclosed to enhance power performance.

Some of the single crystal FBARs disclosed herein use well-known MEMS and LED FAB manufacturing processes rather than dedicated and expensive Si FABs. This may simplify and reduce the investment and total cost to manufacture the filter device.

Single crystal FBARs manufacturing processes disclosed herein use the low cost back-end processes well established and with high yields available by multiple wafer bumping and assembly houses.

Although discussed hereinabove with reference to communication filters, it will be appreciated that thickness-shear-based Composite FBARs and surface generated acoustic wave-based Composite FBARs are also used in other applications. For example they are widely used in biosensors since they provide high sensitivity for the detection of biomolecules in liquids.

Thus persons skilled in the art will appreciate that the present invention is not limited to what has been particularly shown and described hereinabove. Rather the scope of the present invention is defined by the appended claims and includes both combinations and sub combinations of the various features described hereinabove as well as variations and modifications thereof, which would occur to persons skilled in the art upon reading the foregoing description.

In the claims, the word "comprise", and variations thereof such as "comprises", "comprising" and the like indicate that the components listed are included, but not generally to the exclusion of other components.

The invention claimed is:

1. An FBAR filter device comprising an array of resonators, each resonator comprising a single crystal piezoelectric film sandwiched between a first and a second metal electrode, wherein the first electrode is supported by a support membrane over an air cavity, wherein the air cavity is defined by side walls, wherein the air cavity being embedded in a silicon dioxide layer over a silicon handle, with through-silicon via holes through the silicon handle and into the air cavity, the side walls of said air cavity in the silicon dioxide layer being further defined by barriers of a material that is resistant to silicon oxide etchants, and wherein an interface between the support membrane and the first electrode is smooth and flat.

2. The FBAR filter device of claim 1, wherein the material that is resistant to the silicon dioxide etchants is silicon nitride, and the barriers are filler filled trenches having a silicon nitride liner.

3. The FBAR filter device of claim 2, wherein the filler is selected from a group comprising polysilicon and silicon nitride.

4. The FBAR filter device of claim 1, wherein the single crystal piezoelectric layer is selected from a group comprising:
   $Ba_xSr_{(i\_x)}TiO3$ (BST);
   $Al_xGa_{(i\_x)}N$, $Sc_xAl_{(i\_x)}N$;
   AlN, LiNbO3 and
   LiTaO3.

5. The FBAR filter device of claim 1, wherein the single crystal piezoelectric membrane is selected from a group comprising:
   $<111>Ba_xSr_{(i\_x)}TiO3$ (BST);
   $Al_xGa_{(i\_x)}N$ with strong C axis texture:
   $Sc_xAl_{(i\_x)}N$ with strong C axis texture;
   AN with strong C axis texture: LiNbO3 at YX1/36° and LiTaO3 at YX1/42° to YX1/52°.

6. The FBAR filter device of claim 1, wherein the single crystal piezoelectric layer has a thickness of less than 1.5 microns.

7. The FBAR filter device of claim 1, wherein the support membrane is fabricated from a single crystal selected from a group comprising:
   single crystal silicon with an orientation selected from the group of <110>,
   <111>, and <100>;
   single crystal lithium niobite, and
   single crystal lithium tantalate.

8. The FBAR filter device of claim 1, wherein the support membrane has a thickness of less than 1.5 micron.

9. The FBAR filter device of claim 1, wherein the silicon dioxide layer has a thickness of between 3 microns and 6 microns.

10. The FBAR filter device of claim 1, wherein the silicon handle comprises single crystal silicon having a resistivity above 1000 ohm-cm and an orientation selected from a group comprising <100>, <111> and <110>.

11. The FBAR filter device of claim 1, wherein the first electrode comprises at least one metal layer selected from a group of aluminum, gold, molybdenum tungsten and titanium-tungsten.

12. The FBAR filter device of claim 1, wherein the first electrode comprises adhesion layers selected from a group of titanium, chromium and titanium-tungsten adjacent to the support membrane and to the piezoelectric membrane;
   at least one metal layer selected from a group of tungsten, molybdenum and aluminum, and a bonding layer of gold.

13. The FBAR filter device of claim 12, wherein the adhesion layer and the bonding layer of gold have thicknesses in the range of from 20 to 50 nanometers.

14. The FBAR filter device of claim 1, wherein the second electrode comprises an adhesion layer selected from a group of titanium, chromium and titanium-tungsten adjacent to the piezoelectric layer and
a further metal layer selected from a group of aluminum, molybdenum tungsten and titanium-tungsten.

15. The FBAR filter device of claim 1, wherein adjacent resonators from the array of resonators are separated by a passivation material.

16. The FBAR filter device of claim 15, wherein the passivation material separating adjacent resonators is selected from a group consisting of SiO2, silicon nitride, Ta2O5, polyimide and benzocyclobutene (BCB).

17. The FBAR filter device of claim 1, wherein the FBAR filter further comprises first and second electrode extension pads and a base of a seal ring positioned around a perimeter of the filter device, the first and second electrode extension pads and the base of the seal ring coupled to a passivation layer.

18. The FBAR filter device of claim 17, wherein the first and second electrode extension pads, the base of the seal ring and the second electrode comprise an adhesion layer selected from a group of titanium, chromium and titanium-tungsten covered by a metal selected from a group of aluminum, molybdenum, tungsten and titanium-tungsten.

19. The FBAR filter device of claim 17, wherein a first metal seal ring and the first and second electrode extension pads further comprise an adhesion layer selected from a group of titanium, chromium and titanium-tungsten coupled to a gold seed layer, the seal ring supportingly coupled to a lid having an inner and outer surface, such that the seal ring and inner surface define a further cavity over the second electrode.

20. The FBAR filter device of claim 17, wherein a lid comprises silicon or glass and is provided with through metal vias that electrically interconnect metal capture pads on an inner surface of a cap with metal termination pads on an outer surface of the cap.

21. The FBAR filter device of claim 20, wherein the inner surface of the cap is provided with a top section of a metal seal ring and the top section of the seal ring and the metal capture pads are coupled to the base sections of the seal ring and first and second pads by a bonding layer.

22. The FBAR filter device of claim 21, wherein the bonding layer is selected from a group of gold, gold paste with organic binder and a gold-tin mixture.

23. The FBAR filter device of claim 17, wherein a lid comprises silicon and is provided with through metal vias that electrically interconnect metal capture pads on an inner surface of a cap with metal termination pads on an outer surface of the cap, wherein the metal vias and metal termination pads comprise copper, and wherein the metal vias and metal termination pads are isolated from the silicon by a silicon dioxide insulating layer.

24. The FBAR filter device of claim 17, wherein a lid comprises glass and is provided with through metal vias that electrically interconnect metal capture pads on an inner surface of a cap with metal termination pads on an outer surface of the cap, wherein the metal vias and metal termination pads comprise copper.

25. The FBAR filter device of claim 24, wherein the termination pads on an outer surface of a cap further comprise coatings of metal finishing layers selected from the group of gold, ENIG and ENEPIG.

* * * * *